United States Patent
Aoyama et al.

(10) Patent No.: US 8,680,206 B2
(45) Date of Patent: Mar. 25, 2014

(54) POLYESTER FILM AND A PRODUCTION PROCESS THEREOF, AND A SURFACE LIGHT SOURCE, SOLAR BATTERY BACKSHEET AND SOLAR BATTERY RESPECTIVELY OBTAINED BY USING THE SAME

(75) Inventors: Shigeru Aoyama, Otsu (JP); Akikazu Kikuchi, Otsu (JP); Kozo Takahashi, Otsu (JP)

(73) Assignee: Toray Industries, Inc. (JP)

( * ) Notice: Subject to any disclaimer, the term of this patent is extended or adjusted under 35 U.S.C. 154(b) by 310 days.

(21) Appl. No.: 12/745,028

(22) PCT Filed: Nov. 28, 2008

(86) PCT No.: PCT/JP2008/071638
§ 371 (c)(1),
(2), (4) Date: Jun. 22, 2010

(87) PCT Pub. No.: WO2009/069742
PCT Pub. Date: Jun. 4, 2009

(65) Prior Publication Data
US 2010/0307570 A1   Dec. 9, 2010

(30) Foreign Application Priority Data

Nov. 30, 2007   (JP) .................. 2007-310423

(51) Int. Cl.
*B32B 27/36* (2006.01)
(52) U.S. Cl.
USPC ........................... 525/165; 136/252; 428/327
(58) Field of Classification Search
None
See application file for complete search history.

(56) References Cited

U.S. PATENT DOCUMENTS

| | | | | |
|---|---|---|---|---|
| 4,368,295 A | * | 1/1983 | Newton et al. | 525/166 |
| 7,851,694 B2 | * | 12/2010 | Anderson et al. | 136/251 |
| 2005/0191483 A1 | * | 9/2005 | Yoshida et al. | 428/332 |

FOREIGN PATENT DOCUMENTS

| | | | | |
|---|---|---|---|---|
| JP | 57-049648 | A | | 3/1982 |
| JP | 6-322153 | A | | 11/1994 |
| JP | 2002-155153 | A | | 5/2002 |
| JP | 2003-048246 | A | | 2/2003 |
| JP | 2003-075643 | A | | 3/2003 |
| JP | 2003-238786 | A | | 8/2003 |
| JP | 2004-107471 | A | | 4/2004 |
| JP | 02006100125 | A | * | 4/2006 |
| JP | 2006-212925 | A | | 8/2006 |
| JP | 2007-091834 | A | | 4/2007 |
| JP | 2007-262183 | A | | 10/2007 |
| JP | 2001-272508 | A | | 10/2010 |
| WO | 03/046077 | | | 6/2003 |

* cited by examiner

Primary Examiner — Randy Gulakowski
Assistant Examiner — Jeffrey Washville
(74) Attorney, Agent, or Firm — DLA Piper LLP (US)

(57) ABSTRACT

A polyester film includes a polyester layer (W layer) containing an aromatic polyester resin (A) and a component (B) incompatible with the polyester resin (A), wherein the incompatible component (B) contains an acid-denaturated polyolefin resin (b2) and is dispersed as dispersion pieces with a flatness of 10 or higher in the polyester layer (W layer), and wherein volume occupancy of the dispersion pieces in the polyester layer (W layer) is 3 vol % to less than 50 vol %, and volume occupancy of voids in the polyester layer (W layer) is less than 3 vol %.

15 Claims, 13 Drawing Sheets

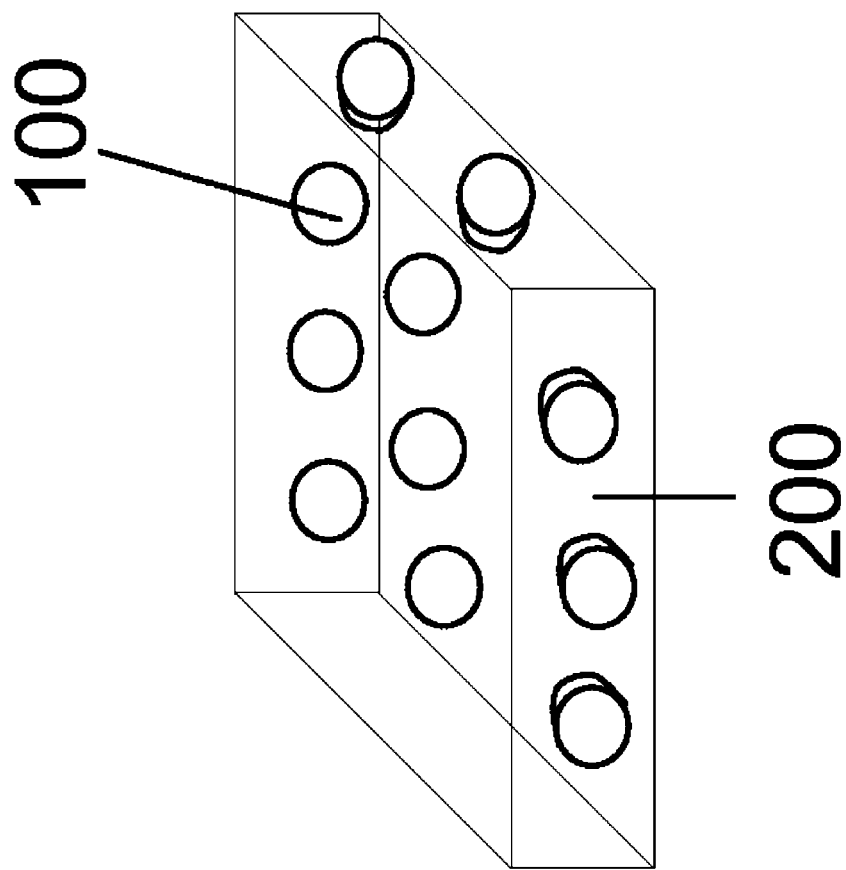
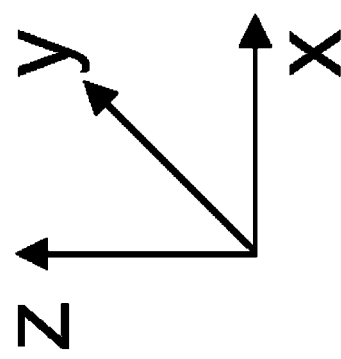
Fig. 8

POLYESTER FILM AND A PRODUCTION PROCESS THEREOF, AND A SURFACE LIGHT SOURCE, SOLAR BATTERY BACKSHEET AND SOLAR BATTERY RESPECTIVELY OBTAINED BY USING THE SAME

RELATED APPLICATIONS

This is a §371 of International Application No. PCT/JP2008/071638, with an international filing date of Nov. 28, 2008 (WO 2009/069742 A1, published Jun. 4, 2009), which is based on Japanese Patent Application No. 2007-310423, filed Nov. 30, 2007, the subject matter of which is incorporated by reference.

TECHNICAL FIELD

This disclosure relates to an improvement of a polyester film, in more detail, a poly-ester film excellent in mechanical strength, light transmittance, gas barrier properties, moldability, releasability, ultraviolet light resistance (UV resistance), electric insulation and productivity.

BACKGROUND

Aromatic polyester resins typified by polyethylene terephthalate and polybutylene terephthalate are inexpensive resins having both heat resistance and clarity, and if they are stretched to form films, they can be made to exhibit high mechanical strength. Therefore, they are used for various applications such as various industrial materials, packaging materials and optical materials.

On the other hand, in recent years, as means for obtaining polymers with higher functions and higher performance, polymer alloy techniques of alloying (adding/mixing) a main polymer with a dissimilar polymer are popularly used.

The reason is that while the properties required for polymers diversely include mechanical strength, light transmittance, gas barrier properties, heat resistance, moldability, releasability, flame retardancy, ultraviolet light resistance (UV resistance), hydrolysis resistance, electric insulation and the like, it is difficult that a single polymer is made to satisfy these diverse property requirements. That is, multiple polymers are alloyed with each other to achieve required diverse properties in increasing cases.

In this regard, aromatic polyester resins are excellent in mechanical strength, clarity (light transmittance) and heat resistance but are unsatisfactory in gas barrier properties, moldability, releasability, flame retardancy, UV resistance, hydrolysis resistance and electric insulation depending on applications. Therefore, efforts are being made to develop films improved in these properties by alloying with resins capable of covering these properties.

For example, there are a film obtained by alloying an aromatic polyester resin with a polycarbonate resin (JP 2004-107471 A), and a film obtained by alloying an aromatic polyester resin with a styrene-butadiene-styrene resin modified by an epoxy compound (JP 2003-075643 A). In the former case, mechanical strength and heat resistance are enhanced, and in the latter case, a film is monoaxially oriented to be improved in polarization properties.

However, even if the techniques described in JP 2004-107471 A and JP 2003-075643 A are used, there remains a problem that a film remarkably enhanced in gas barrier properties, moldability, releasability, UV resistance, electric insulation and the like cannot be obtained.

Polyolefin resins are more excellent than aromatic polyester resins in gas barrier properties, moldability, releasability, UV resistance, insulation and the like. Therefore, if a polyolefin resin is alloyed with an aromatic polyester resin, it is seemingly expected that a film excellent in gas barrier properties, moldability, releasability, UV resistance, electric insulation and the like can be obtained by using the alloy.

However, the bonding force between an aromatic polyester resin and a polyolefin resin is weak and, therefore, even if the mixture obtained by merely mixing both the resins is stretched to form a film, the aromatic polyester resin and the polyolefin resin are separated at the interfaces in the stretching step, to form many voids inside the film (for example, JP 6-322153 A).

If the voids are formed, the film is remarkably lowered in mechanical strength, moldability, gas barrier properties, light transmittance, insulation and productivity, far from being enhanced in these properties, and is not enhanced in releasability or UV resistance either.

It could therefore be helpful to provide a polyester film excellent in mechanical strength, light transmittance, gas barrier properties, moldability, releasability, UV transmittance, electric insulation and productivity.

SUMMARY

We thus provide:

A polyester film including a polyester layer (W layer) containing an aromatic polyester resin (A) and a component (B) incompatible with the polyester resin (A), wherein the incompatible component (B) contains an acid-denaturated polyolefin resin (b2) and is dispersed as dispersion pieces with a flatness of 10 or higher in the polyester layer (W layer), and wherein volume occupancy of the dispersion pieces in the polyester layer (W layer) is 3 vol % to less than 50 vol %, and volume occupancy of voids in the polyester layer (w layer) is less than 3 vol %.

The polyester film is excellent in mechanical strength, light transmittance, gas barrier properties, moldability, releasability, UV resistance, electric insulation, productivity and the like, and can be especially suitably used as a releasing film, packaging film, flexible film, moldable film, UV resistant film, insulation film, light diffusion film and the like.

BRIEF DESCRIPTION OF THE DRAWINGS

FIG. 8 is a perspective view showing a conventional film containing spherical pieces of an incompatible component (B).

MEANINGS OF THE SYMBOLS

Figure 1:
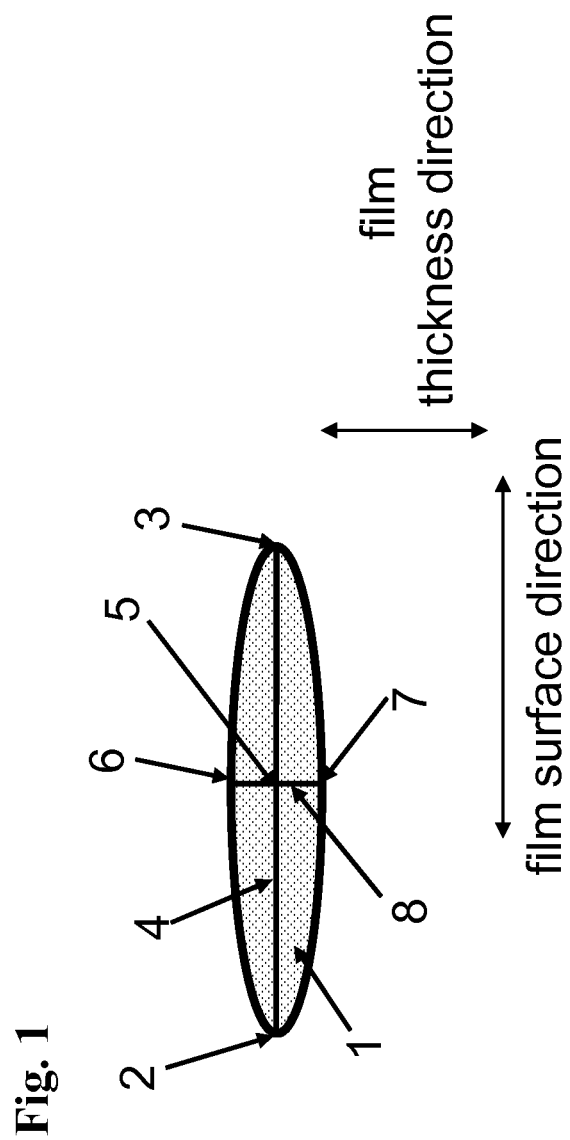
FIG. 1 is a drawing for explaining the method of measuring the major axis length and the minor axis length of a dispersion piece of an incompatible component (B) in a section perpendicular to the in-plane of a film.

1: a dispersion piece of an incompatible component (B)
2: one end of a dispersion piece in the direction parallel to the in-plane direction of a film (left end)
3: the other end of a dispersion piece in the direction parallel to the in-plane direction of a film (right end)
4: a line segment connecting one end (left end) 2 of a dispersion piece with the other end (right end) 3 of the dispersion piece (major axis)
5: the central point of the line segment 4
6: one end of a dispersion piece on the line passing through the central point 5 and perpendicular to the line segment 4 (top end)
7: the other end of a dispersion piece on the line passing through the central point 5 and perpendicular to the line segment 4 (bottom end)
8: a line segment connecting one end (top end) 6 of a dispersion piece with the other end (bottom end) 7 of the dispersion piece (minor axis)
2': one end of a dispersion piece in the direction parallel to the machine direction of a film (left end)
3': the other end of a dispersion piece in the direction parallel to the machine direction of the film (right end)
4': a line segment connecting one end (left end) 2 of a dispersion piece with the other end (right end) 3 of the dispersion piece (major axis)
5': the central point of the line segment 4'
6': one end of a dispersion piece on the line passing through the central point 5' and perpendicular to the line segment 4' (top end)
7': the other end of a dispersion piece on the line passing through the central point 5' and perpendicular to the line segment 4' (bottom end)
8': a line segment connecting one end (top end) 6' of a dispersion piece with the other end (bottom end) 7' of the dispersion piece (minor axis)
10: reflection plate
11: housing
20: CCFL
30: diffusion plate
40: optical films
41: first optical film
42: second optical film
43: third optical film
100: dispersion piece
200: matrix
$\lambda 0$: incident light
$\lambda 1$: light transmitted through a dispersion piece 100
$\lambda 2$: light reflected at the interface between a matrix resin and a dispersion piece and scattered back in the direction of incidence
$\lambda 3$: light reflected or refracted at the interface between a matrix resin and a dispersion piece and scattered in the direction almost perpendicular to the incident direction
$\lambda 3'$: light scattered by a dispersion piece to outgo from a side face, for being lost
x: machine direction of a film
y: transverse direction of a film
z: thickness direction of a film

DETAILED DESCRIPTION

The film must be a film comprising a polyester layer (W layer) containing an aromatic polyester resin (A) and a component (B) incompatible with the polyester resin (A).

The aromatic polyester resin (A) can be generally obtained by polycondensing an aromatic dicarboxylic acid component and a diol component. As examples of the respective components, the following can be enumerated. Examples of the aromatic dicarboxylic acid component include terephthalic acid, isophthalic acid, 5-sodiumsulfoisophthalic acid, phthalic acid, diphenic acid, 2,6-naphthalenedicarboxylic acid, 1,4-naphthalenedicarboxylic acid, 1,5-naphthalenedicarboxylic acid, 1,8-naphthalenedicarboxylic acid, 4,4'-diphenyldicarboxylic acid, 4,4'-diphenyl ether dicarboxylic acid, phenylindane dicarboxylic acid, anthracenedicarboxylic acid, phenanthrenedicarboxylic acid, 9,9'-bis(4-carboxyphenyl)fluorenecarboxylic acid and the like and ester derivatives thereof. Further, polyfunctional acids such as trimellitic acid, pyromellitic acid and ester derivatives thereof can also be used.

Further, typical examples of the diol component include aliphatic diols such as ethylene glycol, propanediol, butanediol, neopentyl glycol, pentanediol, hexanediol, octanediol and decanediol, aliphatic cyclic diols such as cyclohexanedimethanol, spiroglycol and isosorbitol, aromatic diols such as bisphenol A, 1,3-benzenedimethanol, 1,4-benzenedimethanol and 9,9'-bis(4-hydroxyphenyl)fluorene, polyethers such as diethylene glycol, triethylene glycol, polyethylene glycol, tetramethylene glycol, polytetramethylene glycol and the like.

The aromatic polyester resins (A) suitably include polyethylene terephthalate (hereinafter may be abbreviated as PET), polyethylene-2,6-naphthalene dicarboxylate, polypropylene terephthalate, polybutylene terephthalate, poly-1,4-cyclohexylenedimethylene terephthalate and the like.

If any of these aromatic polyester resins (A) is used as the matrix resin of the film, the film obtained can have high mechanical strength while it can maintain high clarity. Above all, PET is more preferred in view of mechanical properties, clarity and price.

The aromatic polyester resin (A) may have a copolymer component introduced into the basic polyester constitution. As the method for introducing a copolymer component, a copolymer component may be added when the polyester pellets as a raw material are produced by polymerization, to obtain pellets having the copolymer component polymerized beforehand. As another method, for example, a mixture consisting of pellets produced by polymerization as a homopolymer such as polybutylene terephthalate and the pellets of polyethylene terephthalate can be supplied into an extruder, to perform an ester interchange reaction at the time of melt kneading, for copolymerization.

Further, a copolyester resin having a copolymer component introduced may also be mixed with a polyester resin.

Furthermore, as a copolymer component for a dicarboxylic acid component, an aliphatic dicarboxylic acid may also be used. Examples of the aliphatic dicarboxylic acid include adipic acid, sebacic acid, dodecanedioic acid, eicosanic acid, dimer acid and ester derivatives thereof, and examples of an aliphatic cyclic dicarboxylic acid include 1,4-cyclohexanedicarboxylic acid, ester derivatives thereof and the like.

The amount of any of these copolymer components is not especially limited, but it is preferred in view of clarity, stretchability, film formability, moldability and the like that the amount of the copolymer component is 1 mol % to 40 mol % based on the amount of the dicarboxylic acid component or diol component to which the copolymer component is added. A more preferred range is 1 mol % to 20 mol %.

It is necessary that the incompatible component (B) is dispersed as dispersion pieces with a flatness of 10 or higher in the polyester layer (W layer). In this case, the incompatible component (B) refers to a thermoplastic resin incompatible with the aromatic polyester resin (A).

If the incompatible component (B) is dispersed as dispersion pieces with a flatness of 10 or higher, the polyester film can be efficiently made to have excellent properties peculiar to the polyolefin such as gas barrier properties, heat resistance, moldability, releasability, flame retardancy, UV resistance, hydrolysis resistance and electric insulation, while it can maintain excellent mechanical properties.

Further, the flatness of the dispersion pieces of the incompatible component (B) can be obtained according to the following procedure:

(A1) A microtome is used to cut a film perpendicularly to the film surface direction without crushing the film section in the thickness direction.

(A2) Subsequently the cut section is observed using an electron microscope, to obtain an image magnified to 10000×. Meanwhile, the place of observation can be decided at random in the polyester layer (W layer), but the vertical direction of the image should be parallel to the thickness direction of the film and the horizontal direction of the image should be parallel to the film surface direction. Further, in the case where the dispersion pieces of the incompatible component (B) are difficult to be identified on the image, the film can also be osmificated or the like beforehand as appropriate. Furthermore, in the case where the incompatible component (B) cannot be kept within the image at 10000×, the images obtained at different observation positions can be obtained and connected without any clearance, to prepare an observation image.

Figure 2:
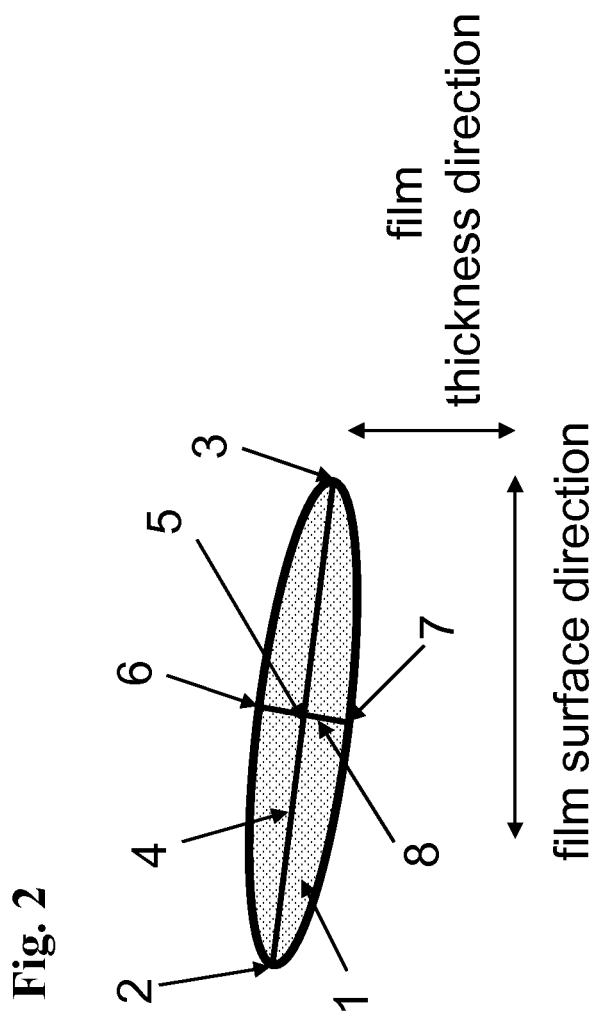
FIG. 2 is a drawing for explaining the method of measuring the major axis length and the minor axis length of a dispersion piece of an incompatible component (B) in a section perpendicular to the in-plane of a film.
Figure 3:
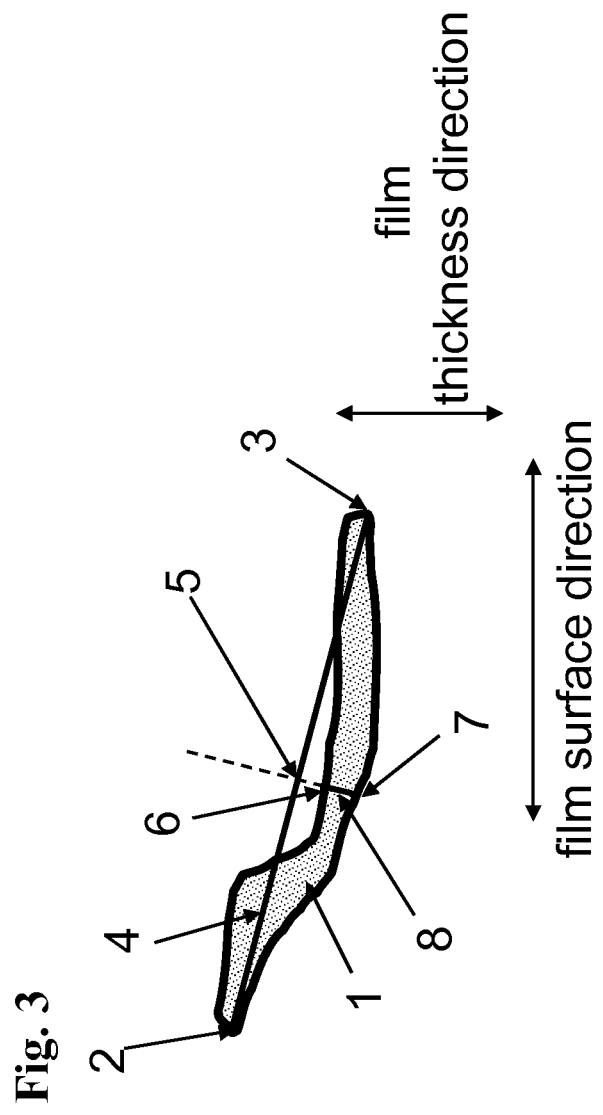
FIG. 3 is a drawing for explaining the method of measuring the major axis length and the minor axis length of a dispersion piece of an incompatible component (B) in a section perpendicular to the in-plane of a film.

(A3) The minor axis length and the major axis length of one dispersion piece of the incompatible component (B) in the polyester layer (W layer) in the image are obtained. FIGS. 1 to 3 are referred to in the following explanation. In FIGS. 1 to 3, the major axis length of the dispersion piece 1 refers to the length of the line segment 4 connecting one end (the leftmost end of the dispersion piece in the direction parallel to the film surface direction) 2 of the dispersion piece in the direction parallel to the film surface direction, with the other end (the rightmost end of the dispersion piece in the direction parallel to the film surface direction) 3. In this case, the line segment 4 is not necessarily required to be parallel to the film surface direction (see FIGS. 2 and 3). Further, the minor axis length refers to the length of the line segment 8 passing through the central point 5 of the line segment 4 and connecting one end (the top end) 6 of the dispersion piece on the line perpendicular to the line segment 4, with the other end (the bottom end) 7. In this case, the line segment 8 is not necessarily required to contain the central point 5 (see FIG. 3).

(A4) The value obtained by dividing the major axis length by the minor axis length (major axis length/minor axis length) is the flatness of the dispersion piece.

(A5) Also for each of other dispersion pieces in the polyester layer (W layer) in the image, the flatness is obtained similarly. However, only the dispersion pieces that are entirely contained in the image should be measured. Further, the inorganic particles should not be measured even if they are contained in the incompatible component.

(A6) At different film cutting places selected at random, the procedure from (A1) through (A5) should be followed 100 times in total.

(A7) The flatness values of all the dispersion pieces obtained according to the above procedure should be used to obtain an arithmetic mean value that should be employed as the flatness of the dispersion pieces of the incompatible component (B) in the polyester layer (W layer). Further similarly, the arithmetic mean values of the minor axis length values and the major axis length values of all the dispersion pieces obtained according to the above procedure should be obtained respectively as the average minor axis length and the average major axis length.

It is preferred that the flatness of the dispersion pieces is 20 or higher, and more preferred is 30 or higher. If the flatness is kept in the abovementioned range, the polyester film can be efficiently made to have the excellent properties peculiar to the polyolefin such as gas barrier properties, moldability, releasability, flame retardancy, UV resistance, hydrolysis resistance and insulation, while it can maintain excellent mechanical properties and heat resistance. The upper limit of the flatness is not especially established, but 100 or lower is preferred. A flatness of higher than 100 is not preferred, since the film may not be able to have the abovementioned excellent properties. Further, in the case where the dispersion pieces are not flat but are almost spherical, having a flatness of lower than 10, the film cannot be made to have the abovementioned excellent properties.

To keep the flatness of the dispersion pieces of the incompatible component (B) at 10 or higher, it is necessary that the incompatible component (B) contains an acid-denaturated polyolefin resin (b2).

That is, if the aromatic polyester resin (A) is made to contain the incompatible component (B) containing the acid-denaturated polyolefin resin (b2) and the mixture is kneaded, melt-extruded and stretched, then the incompatible component (B) can be dispersed in the polyester layer (W layer) as dispersion pieces with a flatness of 10 or higher.

In this case, if the acid-denaturated polyolefin resin (b2) is not contained, voids are formed around the dispersion pieces of the incompatible component (B) in the stretching step, and the polyester film cannot be efficiently made to have the excellent properties peculiar to the polyolefin such as gas barrier properties, moldability, releasability, flame retardancy, UV resistance, hydrolysis resistance and insulation, while it cannot maintain excellent mechanical properties.

The incompatible component (B) can also consist of the non-acid-denaturated polyolefin resin (b1) and the acid-denaturated polyolefin resin (b2) or consist of the acid-denaturated polyolefin resin (b2) only. With regard to the composition of the incompatible component (B), it is preferred that the incompatible component (B) consists of the non-acid-denaturated polyolefin resin (b1) and the acid-denaturated polyolefin resin (b2), since the polyester film can be efficiently made to have the excellent properties peculiar to the polyolefin such as gas barrier properties, heat resistance, moldability, releasability, flame retardancy, UV resistance, hydrolysis resistance and electric insulation, while it can maintain excellent mechanical properties.

Further, in the case where the non-acid-denaturated polyolefin resin (b1) is not contained, if the acid-denaturated polyolefin resin (b2) used has an especially high acid value, when the resin mixture consisting of the aromatic polyester resin (A) and the incompatible component (B) is melt-extruded, the mixture may be gelled in the extruder to remarkably decline in viscosity. In this case, stable melt extrusion cannot be performed and, as a result, continuous film formation may not be able to be performed to remarkably lower productivity and practicality.

Meanwhile, in the case where the film is stretched, it can be monoaxially stretched, but biaxial stretching is preferred. Biaxial stretching can enhance the flatness of the dispersion pieces.

In this case, the stretching method can be a method of pulling both the edges of a solidified film (pulling-stretching), a method of stretching the film spread between an upstream roll and a downstream roll with the film feed rate of the downstream roll kept higher than the film feed rate of the upstream roll (inter-roll stretching), a method of stretching by rolling the film inserted between a pair of rolls facing each other by the roll pressure or the like (rolling-stretching), or a method of elongating the film by inflation (inflation stretching) or the like.

Either the inter-roll stretching or the pulling-stretching is preferred as the stretching method. If the inter-roll stretching or the pulling-stretching is used, the aromatic polyester resin (A) can be oriented to give a high mechanical strength to the film.

That is, it is preferred that the film is a monoaxially or biaxially oriented film, and more preferred is a film oriented biaxially (biaxially oriented polyester film).

Especially in view of obtaining a film with high mechanical strength and in view of productivity, preferred is a biaxially oriented (biaxially stretched) polyester film obtained by the method of performing the inter-roll stretching in the first axis direction and performing the pulling-stretching in the second axis direction corresponding to the direction perpendicular to the first axis direction, or obtained by the method of performing the pulling-stretching in the two axis directions perpendicular to each other simultaneously.

Meanwhile, the inflation stretching cannot be constant in the stretching ratio within the film in-plane and, as a result, some dispersion pieces are likely to be lower than 10 in flatness. Further, the orientation state and the orientation direction of the polyester resin within the film in-plane are not uniform, and a biaxially oriented film may not be obtained and, therefore, the film may not be able to have satisfactory mechanical properties.

Further, the rolling-stretching may not be able to allow the film, even if formed, to have satisfactory mechanical properties, since the aromatic polyester resin (A) cannot be oriented.

A polyolefin resin is used as the incompatible component (B), and since a polyolefin resin is generally excellent in gas barrier properties, moldability, releasability, flame retardancy, UV resistance, hydrolysis resistance, electric insulation and the like, the polyolefin resin alloyed with the aromatic polyester resin (A) can allow the polyester film to have these properties.

A polyolefin resin refers to a polymer (macromolecule) synthesized with an olefin or alkene as a monomer (unit molecule). Examples of the polyolefin resin include straight-chain, branched chain or cyclic polyolefin-based resins such as polyethylene, polypropylene, polybutene-1, poly-4-methylpentene-1 (hereinafter may be abbreviated as "polymethylpentene" or "PMP"), ethylene-propylene copolymer, ethylene-butene-1 copolymer, ethylene-hexene-1 copolymer, ethylene-4-methylpentene-1 copolymer, ethylene-octene-1 copolymer, propylene-butene-1 copolymer, propylene-hexene-1 copolymer, propylene-4-methylpentene-1 copolymer propylene-ethylene-octene-1 copolymer and ethylene-butadiene copolymer. Among them, polyethylene, polypropylene, ethylene-propylene copolymer, polybutene, polymethylpentene and cyclic polyolefin are preferred in view of gas barrier properties, heat resistance, moldability, releasability, flame retardancy, UV resistance, hydrolysis resistance, electric insulation, clarity and cost. Especially polypropylene, polymethylpentene and ethylene-propylene copolymer are preferred.

Further, the acid-denaturated polyolefin resin (b2) used in the film can be obtained, for example, by graft-copolymerizing an unsaturated carboxylic acid to a polyolefin resin.

The graft copolymerization of an unsaturated carboxylic acid to a polyolefin resin can be performed by a method comprising the steps of dissolving or suspending the polyolefin resin into an organic solvent, subsequently adding the unsaturated carboxylic acid, heating to the decomposition temperature of a radical generating agent (generally 50° C. to 150° C.), and adding the radical generating agent little by little for performing graft reaction. Otherwise, a method comprising the step of graft-polymerizing the unsaturated carboxylic acid as a graft monomer to the polyolefin resin together with a radical generating agent in an extruder as required with heating (for example 150° C. to 260° C.) can also be used.

Meanwhile, the unsaturated carboxylic acid refers not only to an unsaturated compound having a —COOH group but also an ester or anhydride as a derivative thereof. Examples of the unsaturated carboxylic acid include unsaturated carboxylic acids such as acrylic acid, methacrylic acid, maleic acid, fumaric acid and itaconic acid; unsaturated carboxylic acid esters such as methyl methacrylate, methyl acrylate and butyl fumarate; acid anhydrides such as maleic anhydride, itaconic anhydride and the like. Among them, acrylic acid, methacrylic acid, maleic acid, fumaric acid, itaconic acid, maleic anhydride and itaconic anhydride are preferred. Especially acrylic acid, maleic acid and maleic anhydride are preferred in view of productivity and the possibility of finely dispersing the incompatible component (B) in the aromatic polyester resin (A).

Further, the non-acid-denaturated polyolefin resin (b1) used in the film refers to any of the abovementioned polyolefins not denaturated by an acid. The non-acid-denaturated polyolefin resin (b1) may also be denaturated by other than an acid to such an extent that the heat resistance does not decline.

Further, it is preferred that the average minor axis length of the dispersion pieces of the incompatible component (B) is 1 µm or shorter. More preferred is 500 nm or shorter, and further more preferred is 400 nm or shorter. Especially preferred is 250 nm or shorter and most preferred is 100 nm or shorter. On the other hand, it is preferred that the average major axis length of the dispersion pieces is 0.5 μm or longer. More preferred is 2.5 μm or longer, especially preferred is 5.0 μm or longer.

If the average minor axis length and the average major axis length are kept in these ranges, the flatness tends to be higher, and further, the film tends to be higher in gas barrier properties, moldability, releasability, flame retardancy, UV resistance, hydrolysis resistance and electric insulation.

Meanwhile, the lower limit of the average minor axis length is not especially specified, but 20 nm or longer is preferred. More preferred is 30 nm or longer, and further more preferred is 50 nm or longer. It is not preferred that the average minor axis length is shorter than 20 nm for such reasons that the dispersion pieces may become smaller than the size per 1 molecule of the polymer and, as a result, that the film may not be able to have the abovementioned excellent properties satisfactorily. Furthermore, the upper limit of the average major axis length is not especially specified either, but 20 μm or shorter is preferred. If the average major axis length is longer than 20 μm, the dispersion pieces existing in the film may be able to be visually observed unpreferably in view of appearance.

In the meantime, the average minor axis length and the average major axis length can be kept in the abovementioned suitable ranges, for example, by the following methods (1) to (4):

(1) A method of enhancing the stretching ratio. It is preferred that the stretching ratio is 2.5 times or higher. A more preferred ratio is 2.8 times or higher, and a further more preferred ratio is 3.0 times or higher. An especially preferred ratio is 3.5 times or higher. Further, in the case of biaxial stretching, it is preferred that the stretching ratio in the machine direction and the stretching ratio in the transverse direction are kept in the abovementioned range. Stretching at such a ratio allows the dispersion pieces of the incompatible component (B) to have a shorter average minor axis length, a longer average major axis length and a higher flatness.

(2) A method of letting the incompatible component (B) contain the non-acid-denaturated polyolefin resin (b1) and the acid-denaturated polyolefin resin (b2), to ensure that the amount of the acid-denaturated polyolefin resin (b2) can be 2 parts by weight to 45 parts by weight per 100 parts by weight of the non-acid-denaturated polyolefin resin (b1). This method is described later in detail.

(3) A method of letting the incompatible component (B) contain the non-acid-denaturated polyolefin resin (b1) and the acid-denaturated polyolefin resin (b2), to ensure that the acid value of the acid-denaturated polyolefin resin (b2) can be kept in a range from 1 KOH mg/g to 80 KOH mg/g. A more preferred range is 2 KOH mg/g to 60 KOH mg/g, and a further more preferred range is 3 KOH mg/g to 60 KOH mg/g. An especially preferred range is 5 KOH mg/g to 60 KOH mg/g, and the most preferred range is 5 KOH mg/g to 40 KOH mg/g.

Further, if the acid value is kept in the abovementioned range, the capability to coelongate the aromatic polyester resin (A) and the incompatible component (B) can be enhanced (the stretching ratio can be enhanced to a higher ratio). As a result, the dispersion pieces of the incompatible component (B) can have a shorter average minor axis length, a longer average major axis length and a higher flatness. In addition, the incompatible component (B) can be very finely dispersed in the aromatic polyester resin (A).

It is not preferred the acid value of the acid-denaturated polyolefin resin (b2) is lower than 1 KOH mg/g for such reasons that the coelongation of the aromatic polyester resin (B) and the incompatible component (B) may not be able to be performed, that as a result, the flatness of the dispersion pieces of the incompatible component (B) may not be able to be kept at 10 or higher, that voids may be formed around the dispersion pieces of the incompatible component (B) in the stretching step and that, in this case, the film cannot be excellent in gas barrier properties, heat resistance, moldability, releasability, flame retardancy, weather resistance (UV resistance) or insulation.

It may not be preferred in view of film production that the acid value in the case where the acid-denaturated polyolefin resin (b2) is used is higher than 80 KOH mg/g for such reasons that the heat resistance of the acid-denaturated polyolefin resin (b2) declines to be decomposed in the extruder at the time of melt extrusion, for flawing the film by the decomposition product, and that even if the heat resistance of the polyolefin resin (b2) does not decline, the aromatic polyester resin (A) as the matrix is deteriorated heavily, making it difficult to form the film.

(4) A method of letting the incompatible component (B) contain the acid-denaturated polyolefin resin (b2) only, to ensure that the acid value of the acid-denaturated polyolefin resin (b2) can be kept in a range from 0.001 KOH mg/g to 20 KOH mg/g. A more preferred range is 0.01 KOH mg/g to 15 KOH mg/g, and a further more preferred range is 0.1 KOH mg/g to 10 KOH mg/g.

Further, if the acid value is kept in the abovementioned range, the capability to coelongate the aromatic polyester resin (A) and the incompatible component (B) can be enhanced (the stretching ratio can be enhanced to a higher ratio). As a result, the dispersion pieces of the incompatible component (B) can have a shorter average minor axis length, a longer average major axis length and a higher flatness. In addition, the incompatible component (B) can be very finely dispersed in the aromatic polyester resin (A).

It is not preferred that the acid value of the acid-denaturated polyolefin resin (b2) is lower than 0.001 KOH mg/g for such reasons that the coelongation of the aromatic polyester resin (A) and the incompatible component (B) may not be able to be performed, that as a result, the flatness of the dispersion pieces of the incompatible component (B) may not be able to be kept at 10 or higher, that voids may be formed around the dispersion pieces of the incompatible component (B) in the stretching step, and that in this case, the film cannot be made to have excellent gas barrier properties, heat resistance, moldability, releasability, flame retardancy, weather resistance (UV resistance) or insulation.

On the other hand, it may not be preferred in view of film production that the acid value of the acid-denaturated polyolefin resin (b2) is higher than 20 KOH mg/g for such reasons that the heat resistance of the acid-denaturated polyolefin resin (b2) declines to be decomposed in the extruder at the time of melt extrusion, for flawing the film by the decomposition product, and that even if the heat resistance of the polyolefin resin (b2) does not decline, the aromatic polyester resin (A) as the matrix is deteriorated heavily, making it difficult to form the film.

Irrespective of the abovementioned methods (1) to (4), it is preferred that the acid value of the incompatible component (B) is 0.001 KOH mg/g to 20 KOH mg/g. If the acid value is in this range, the incompatible component (B) can be very finely dispersed in the aromatic polyester resin (A). The acid value refers to the acid value specified in JIS-K 0070-1992. It is not preferred that the acid value of the incompatible component (B) is lower than 0.001 KOH mg/g for such reasons that the coelongation of the aromatic polyester resin (A) and the incompatible component (B) may not be able to be performed, that as a result, the flatness of the dispersion pieces of the incompatible component (B) may not be able to be kept at 10 or higher, that voids may be formed around the dispersion pieces of the incompatible component (B) in the stretching step, and that in this case, the film cannot be made to have excellent gas barrier properties, heat resistance, moldability, releasability, flame retardancy, weather resistance (UV resistance) or insulation. Moreover, it is not preferred either in view of film production that the acid value of the incompatible component (B) is higher than 20 KOH mg, for such reasons that the heat resistance of the incompatible component (B) declines, causing the incompatible component (B) to be decomposed in the extruder when it is melt-extruded, and that the decomposition product makes the film defective, or that even if the heat resistance of the incompatible component (B) does not decline, the aromatic polyester resin (A) as the matrix is heavily deteriorated to make the film formation difficult.

Further, it is preferred that the dispersion pieces of the incompatible component (B) are such that, in a section parallel to the film surface, the ratio (in-plane major axis length/in-plane minor axis length) of the in-plane major axis length to the in-plane length in the direction perpendicular to the major axis direction (in-plane minor axis length) is 2 or lower.

Furthermore, the ratio (in-plane major axis length/in-plane minor axis length) of the in-plane major axis length in-plane minor axis length of the dispersion pieces of the incompatible component (B) in a section parallel to the film surface can be obtained according to the following procedure:

(A'1) A microtome is used to cut the film in parallel to the film surface direction without crushing the film section in the surface direction.

(A'2) Then, the section obtained by cutting is observed using an electron microscope at a magnification of 5000×, to obtain an image. The place of observation should be decided at random in the polyester layer (W layer), but the vertical direction of the image should be parallel to the machine direction of the film while the horizontal direction of the image should be parallel to the transverse direction of the film. Further, in the case where the dispersion pieces of the incompatible component (B) are difficult to be identified on the image, the film can also be osmificated or the like beforehand as appropriate.

(A'3) For one of the dispersion pieces of the incompatible component (B) in the polyester layer (W layer) in the image, the in-plane minor axis length and the in-plane major axis length should be obtained.

Figure 4:
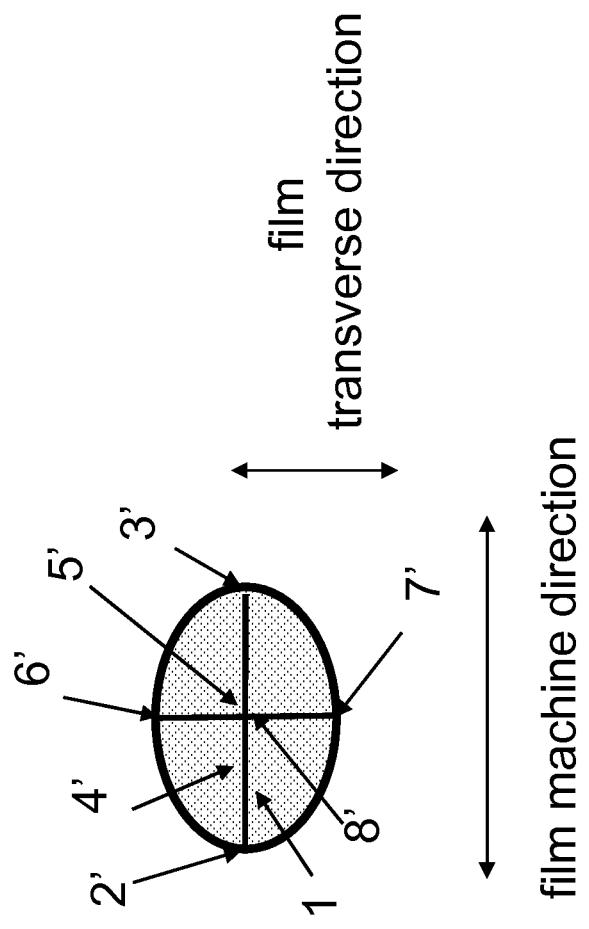
FIG. 4 is a drawing for explaining the method of measuring the in-plane major axis length and the in-plane minor axis length of a dispersion piece of an incompatible component (B) in a section parallel to the in-plane of a film.
Figure 5:
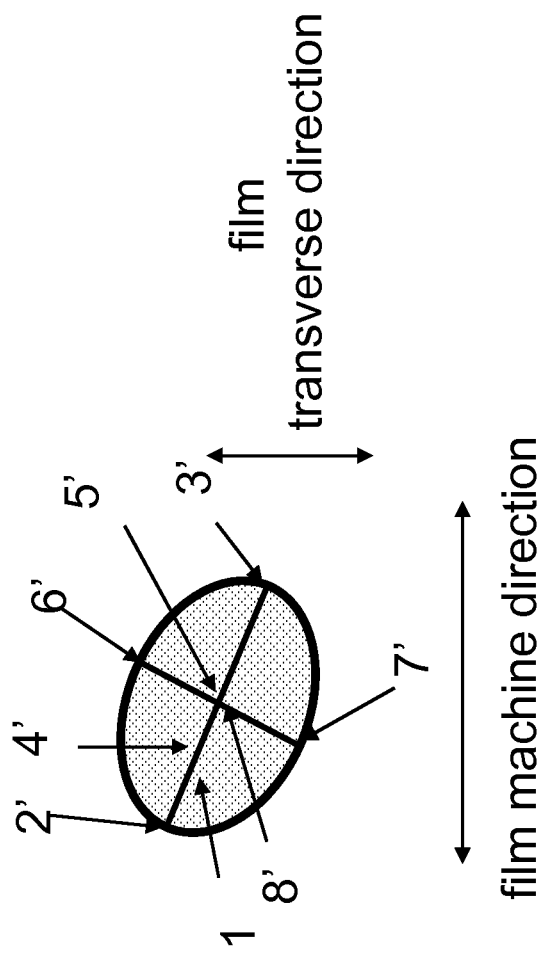
FIG. 5 is a drawing for explaining the method of measuring the in-plane major axis length and the in-plane minor axis length of a dispersion piece of an incompatible component (B) in a section parallel to the in-plane of a film.
Figure 6:
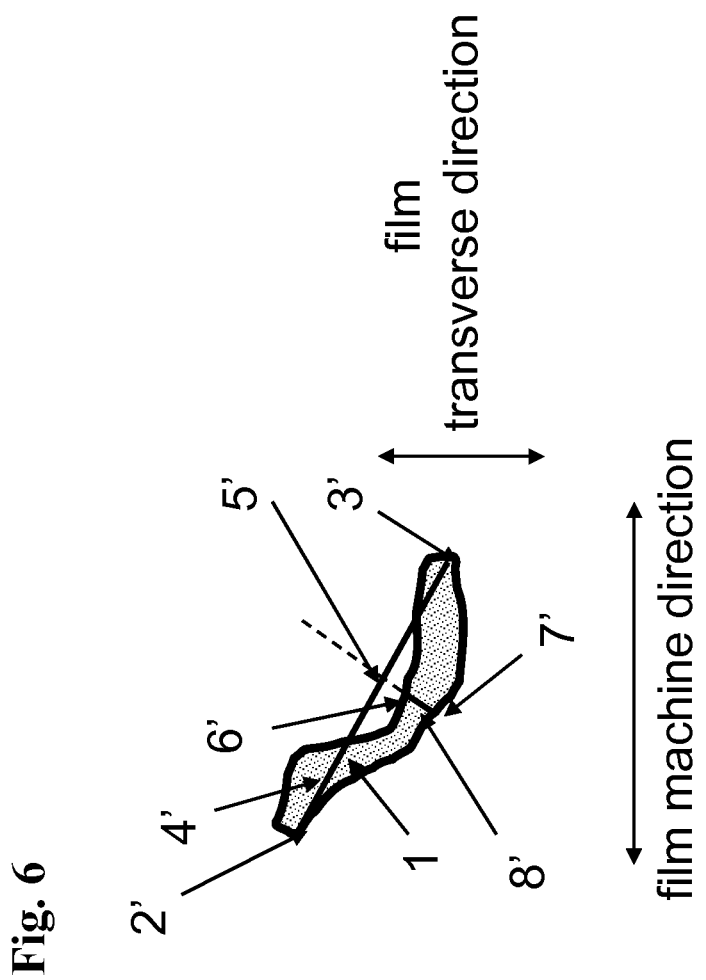
FIG. 6 is a drawing for explaining the method of measuring the in-plane major axis length and the in-plane minor axis length of a dispersion piece of an incompatible component (B) in a section parallel to the in-plane of a film.

Explanation is made below in reference to FIGS. 4 to 6. In FIGS. 4 to 6, the in-plane major axis length of a dispersion piece 1 refers to the length of the line segment 4' connecting one end (the leftmost end of the dispersion piece in the direction parallel to the film surface direction) 2' of the dispersion piece in the direction parallel to the machine direction of the film, with the other end (the rightmost end of the dispersion piece in the direction parallel to the machine direction of the film) 3'. In this case, the line segment 4' is not necessary required to be parallel to the machine direction of the film (see FIGS. 5 and 6). Further, the in-plane minor axis length refers to the length of the line segment 8' passing through the central point 5' of the line segment 4' and connecting one end (the top end) 6' of the dispersion piece on the line perpendicular to the line segment 4', with the other end (the bottom end) 7'. In this case, the line segment 8' is not necessarily required to contain the central point 5' (see FIG. 6).

(A'4) The value obtained by dividing the in-plane major axis length by the in-plane minor axis length (in-plane major axis length/in-plane minor axis length) is the ratio (in-plane major axis length/in-plane minor axis length) of the in-plane major axis length to the in-plane minor axis length in the dispersion piece.

(A'5) Also for each of other dispersion pieces in the polyester layer (W layer) in the image, the ratio (in-plane major axis length/in-plane minor axis length) of the in-plane major axis length to the in-plane minor axis length is obtained similarly. However, only the dispersion pieces that are entirely contained in the image should be measured. Further, the inorganic particles should not be measured even if they are contained in the incompatible component.

(A'6) At different film cutting places selected at random, the procedure from (A'1) through (A'5) should be followed 100 times in total.

(A'7) The values of the ratio (in-plane major axis length/in-plane minor axis length) of the in-plane major axis length to the in-plane minor axis length of all the dispersion pieces obtained according to the above procedure should be used to obtain an arithmetic mean value that should be employed as the ratio (in-plane major axis length/in-plane minor axis length) of the in-plane major axis length to the in-plane minor axis length of the dispersion pieces of the incompatible component (B) in the polyester layer (W layer). Further similarly, the arithmetic mean values of the minor axis length values and the major axis length values of all the dispersion pieces obtained in the above procedure should be obtained respectively as the average minor axis length and the average major axis length.

It is more preferred that the ratio (in-plane major axis length/in-plane minor axis length) of the in-plane major axis length to the in-plane minor axis length is 1.5 or lower, and a more preferred ratio is 1.2 or lower. If the ratio (in-plane major axis length/in-plane minor axis length) of the in-plane major axis length to the in-plane minor axis length is kept in this range, the polyester film can be efficiently made to have the excellent properties peculiar to the polyolefin such as gas barrier properties, moldability, releasability, flame retardancy, UV resistance, hydrolysis resistance and electric insulation, while it can maintain excellent mechanical properties and heat resistance.

It is necessary that the volume occupancy of the dispersion pieces of the incompatible component (B) in the polyester layer (W layer) is 3 vol % to less than 50 vol %.

The volume occupancy of the dispersion pieces of the incompatible component (B) in the polyester layer (W layer) can be obtained according to the following procedure:

(B1) The area of the polyester layer (W layer) in the image obtained in the aforementioned (A2) is measured as A.

(B2) The area of all the dispersion pieces of the incompatible component (B) existing in the polyester layer (W layer) in the image is measured as total area B. In this case, the dispersion pieces to be measured should be not only the dispersion pieces entirely included in the image but also those partially included in the image. However, inorganic particles should not be included in the measurement, even if they are contained in the incompatible component.

(B3) B is divided by A (B/A), and the quotient is multiplied by 100, to calculate the volume occupancy (%).

(B4) The same measurement and calculation is made also for the 100 images in total obtained by the aforementioned (A6), and the arithmetic mean value of the volume occupancy values (%) obtained in the respective images should be employed as the volume occupancy (%) of the dispersion pieces of the incompatible component (B) in the polyester layer (W layer).

It is more preferred that the volume occupancy of the dispersion pieces is 5 vol % or more. Further more preferred is 10 vol % or more, and especially preferred is 14 vol % or more. Most preferred is 25 vol % or more. If the volume occupancy is kept in the above-mentioned range, the polyester film can be efficiently made to have the excellent properties peculiar to the polyolefin such as gas barrier properties, moldability, releasability, flame retardancy, UV resistance, hydrolysis resistance and electric insulation, while it can maintain excellent mechanical properties and heat resistance.

Meanwhile, if the volume occupancy is more than 50 vol %, the film cannot maintain the high mechanical properties and heat resistance of the polyester resin, and further the film is frequency broken in the stretching step to remarkably lower productivity.

Further, if the volume occupancy is less than 3 vol %, the polyester film cannot be made to sufficiently have the excellent properties peculiar to the polyolefin such as gas barrier properties, heat resistance, moldability, releasability, flame retardancy, UV resistance, hydrolysis resistance and electric insulation.

Since the volume occupancy of the dispersion pieces of the incompatible component (B) in the polyester layer (W layer) depends on the added amount of the incompatible component (B), the volume occupancy can be kept in the abovementioned range by adjusting the added amount of the incompatible component (B).

It is preferred that the content of the incompatible component (B) is 2 wt % to 35 wt % based on the weight of the polyester layer (W layer). A more preferred range is 5 wt % to 30 wt %, and an especially preferred range is 10 wt % to 25 wt %. It is not preferred that the content of the incompatible component (B) is larger than 35 wt % for such reasons that the coelongation of the aromatic polyester resin (A) and the incompatible component (B) in the stretching step cannot be performed, to lower the flatness of the dispersion pieces of the incompatible component (B) to lower than 10 and to form voids around the dispersion pieces of the incompatible component (B) and that the film is frequently broken in the stretching step, not allowing continuous film formation. Further, if the content of the incompatible component (B) is smaller than 2 wt %, the film may not be able to have satisfactory gas barrier properties, moldability, releasability, flame retardancy, UV resistance, hydrolysis resistance or electric insulation.

Further, in the case where the incompatible component (B) consists of the non-acid-denaturated polyolefin resin (b1) and the acid-denaturated polyolefin resin (b2), considering the specific gravity or the like, it is preferred that the total content of the non-acid-denaturated polyolefin resin (b1) and the acid-denaturated polyolefin resin (b2) in the polyester layer (W layer) is 2 wt % to 35 wt % based on the weight of the entire polyester layer (w layer). A more preferred range is 5 wt % to 30 wt %, and an especially preferred range is 10 wt % to 25 wt %.

On the other hand, in the case where the incompatible component (B) consists of the acid-denaturated polyolefin resin (b2) only, it is preferred that the content of the acid-denaturated polyolefin resin (b2) is 2 wt % to 35 wt % based on the weight of the entire polyester layer (W layer). A more preferred range is 5 wt % to 30 wt %, and an especially preferred range is 10 wt % to 25 wt %.

In the case where the incompatible component (B) consists of the non-acid-denaturated polyolefin resin (b1) and the acid-denaturated polyolefin (b2), if the total content of the non-acid-denaturated polyolefin resin (b1) and the acid-denaturated polyolefin resin (b2) is 2 wt % to 35 wt %, the film can be made to have excellent gas barrier properties, moldability, releasability, flame retardancy, weather resistance, UV resistance, hydrolysis resistance and electric insulation, while it can maintain film formability. On the other hand, in the case where the incompatible component (B) consists of the acid-denaturated polyolefin resin (b2) only, if the content of the acid-denaturated polyolefin resin (b2) is 2 wt % to 35 wt %, the film can also have excellent gas barrier properties, moldability, releasability, flame retardancy, weather resistance, UV resistance, hydrolysis resistance and electric insulation, while it can maintain film formability.

Meanwhile, in the case where the incompatible component (B) consists of the non-acid-denaturated polyolefin resin (b1) and the acid-denaturated polyolefin resin (b2), if the total content of the non-acid-denaturated polyolefin resin (b1) and the acid-denaturated polyolefin resin (b2) is smaller than 2 wt %, the film may not be able to have satisfactory gas barrier properties, moldability, releasability, flame retardancy, UV resistance, hydrolysis resistance or electric insulation. Further, in the case where the incompatible component (B) consists of the acid-denaturated polyolefin resin (b2) only, if the content of the acid-denaturated polyolefin resin (b2) is smaller than 2 wt %, the film may not be able to have satisfactory gas barrier properties, moldability, releasability, flame retardancy, UV resistance, hydrolysis resistance or electric insulation either.

Further, in the case where the incompatible component (B) consists of the non-acid-denaturated polyolefin resin (b1) and the acid-denaturated polyolefin resin (b2), it is not preferred that the total content of the non-acid-denaturated polyolefin resin (b1) and the acid-denaturated polyolefin resin (b2) is larger than 35 wt % for such reasons that the coelongation of the aromatic polyester resin (A) and the incompatible component (B) consisting of the non-acid-denaturated polyolefin resin (b1) and the acid-denaturated polyolefin resin (b2) may not be performed in the stretching step, to lower the flatness of the dispersion pieces of the incompatible component (B) to lower than 10 and to form voids around the dispersion pieces of the incompatible component (B) and further that the film may be broken frequently in the stretching step, not allowing continuous film formation.

On the other hand, in the case where the incompatible component (B) consists of the acid-denaturated polyolefin resin (b2) only, it is not preferred that the content of the acid-denaturated polyolefin resin (b2) is larger than 35 wt % for such reasons that the coelongation of the aromatic polyester resin (A) and the incompatible component (B) consisting of the acid-denaturated polyolefin resin (b2) only cannot be performed in the stretching step, to lower the flatness of the dispersion pieces of the incompatible component (B) to lower than 10 and to form voids around the dispersion pieces of the incompatible component (B) and further that the film may be broken frequently in the stretching step, not allowing continuous film formation.

Further, in the case where the incompatible component (B) consists of the non-acid-denaturated polyolefin resin (b1) and the acid-denaturated polyolefin resin (b2), it is preferred that the content of the acid-denaturated polyolefin resin (b2) is 2 parts by weight to 45 parts by weight per 100 parts by weight of the non-acid-denaturated polyolefin resin (b1) in the polyester layer (W layer). More preferred are 10 parts by weight or larger, and especially preferred are 40 parts by weight or larger.

In the case where the incompatible component (B) consists of the non-acid-denaturated polyolefin resin (b1) and the acid-denaturated polyolefin resin (b2), if the content of the acid-denaturated polyolefin resin (b2) is in the abovementioned range, the incompatible component (B) can be very finely dispersed in the aromatic polyester resin (A). Further, in the stretching step, the coelongation of the aromatic polyester resin (A) and the incompatible component (B) can be more easily performed. As a result, the dispersion pieces of the incompatible component (B) can have a smaller average minor axis length, a larger average major axis length and a higher flatness, and the film can be made to have excellent gas barrier properties, moldability, UV resistance, electric insulation and the like. Further, the formation of voids around the dispersion pieces of the incompatible component (B) can be inhibited.

Meanwhile, in the case where the incompatible component (B) consists of the non-acid-denaturated polyolefin resin (b1) and the acid-denaturated polyolefin resin (b2), it is not preferred that the content of the acid-denaturated polyolefin resin (b2) is smaller than 2 parts by weight per 100 parts by weight of the non-acid-denaturated polyolefin resin (b1) for such reasons that the incompatible component (B) cannot be sufficiently finely dispersed in the aromatic polyester resin (A), that the coelongation of the aromatic polyester resin (A) and the incompatible component (B) may not be able to be performed in the stretching step, that as a result, it can happen that the flatness of the dispersion pieces of the incompatible component (B) cannot be kept at 10 or higher or that voids are formed around the dispersion pieces of the incompatible component (B), and that in this case, the film cannot be made to have excellent gas barrier properties, heat resistance, moldability, releasability, flame retardancy, weather resistance (UV resistance) or insulation.

Further, in the case where the incompatible component (B) consists of the non-acid-denaturated polyolefin resin (b1) and the acid-denaturated polyolefin resin (b2), it is not preferred that the content of the acid-denaturated polyolefin resin (b2) is larger than 45 parts by weight per 100 parts by weight of the non-acid-denaturated polyolefin resin (b1) for such reasons that when the resin mixture consisting of the aromatic polyester resin (A) and the incompatible component (B) is melt-extruded, the mixture may be gelled in the extruder or declines remarkably in viscosity and that in this case, stable extrusion cannot be performed, not allowing continuous film formation as a result. Meanwhile, in the case where the polyester layer (W layer) contains the acid-denaturated polyolefin resin (b2) and the aromatic polyester resin (A) only without containing the non-acid-denaturated polyolefin resin (b1), if the acid-denaturated polyolefin resin (b2) with a high acid value is used, the same phenomena may be caused to remarkably lower productivity and practicality.

In the case where the incompatible component (B) consists of the non-acid-denaturated polyolefin (b1) and the acid-denaturated polyolefin resin (b2), it is preferred that the unit molecules (monomer component) constituting the non-acid-denaturated polyolefin resin (b1) contained in the polyester layer (W layer) are identical with the unit molecules (monomer component) constituting the acid-denaturated polyolefin resin (b2) contained in the polyester layer (W layer).

In this mode, the incompatible component (B) can be very finely dispersed in the aromatic polyester resin (A). Further, in the stretching step, the coelongation of the aromatic polyester resin (A) and the incompatible component (B) can be more easily performed and, as a result, the dispersion pieces of the incompatible component (B) can have a smaller average minor axis length, a larger average major axis length and a higher flatness. Furthermore, the formation of voids around the dispersion pieces of the incompatible component (B) can be inhibited.

More preferred modes include (1) a mode in which polypropylene is used as the non-acid-denaturated polyolefin resin (b1) while acid-denaturated polypropylene is used as the acid-denaturated polyolefin resin (b2) (that is, propylene is used as the unit molecules (monomer components) of both the polyolefin resins in this mode), and (2) a mode in which polymethylpentene is used as the non-acid-denaturated polyolefin resin (b1) while acid-denaturated polymethylpentene is used as the acid-denaturated polyolefin resin (b2) (that is, methylpentene is used as the unit molecules (monomer components) of both the polyolefin resins in this mode).

In this case, as the non-acid-denaturated polyolefin resin (b1), not only a non-denaturated polyolefin resin but also a non-acid-denaturated polyolefin resin (b1) having flexible substituent groups introduced therein for making the polyolefin resin flexible to such an extent that heat resistance does not decline can also be preferably used.

Further, it is preferred that the non-acid-denaturated polyolefin resin (b1) used in the film has a dynamic storage elastic modulus of 500 MPa or less at the glass transition temperature of the aromatic polyester resin (A). More preferred is 250 MPa or less, and further more preferred is 200 MPa or less. Especially preferred is 100 MPa or less, and most preferred is 50 MPa or less. If the dynamic storage elastic modulus is more than 500 MPa, the deformation during stretching is difficult and interfacial separation is likely to occur. As a result, it is difficult to let the polyester film efficiently have the excellent properties peculiar to the polyolefin such as gas barrier properties, moldability, releasability, flame retardancy, UV resistance, hydrolysis resistance and insulation. If the dynamic storage elastic modulus of the non-acid-denaturated polyolefin resin (b1) at the glass transition temperature of the aromatic polyester resin (A) is 500 MPa or less, the film can be easily made to have the excellent properties of the polyolefin.

Further, in the case where the film is used as a film to be molded, if the dynamic storage elastic modulus is preferably 100 MPa or less, more preferably 50 MPa or less, a film with excellent moldability can be obtained.

Meanwhile, the glass transition temperature in this case means the glass transition temperature Tg in a heating process (heating rate: 20° C./min), obtained by a differential scanning calorimetry (hereinafter referred to as DSC). In detail, the glass transition temperature Tg can be obtained according to the following procedure based on JIS K-7121 (1999 edition):

(C1) A sample resin contained in a sample pan is heated from 25° C. to 300° C. at a heating rate of 20° C./min ($1^{st}$ run).

(C2) The sample is held in that state for 5 minutes and quickly cooled to 25° C. or lower.

(C3) The sample is heated again from room temperature to 300° C. at a heating rate of 20° C./mm ($2^{nd}$ run)

(C4) On the differential scanning calorimetry chart of $2^{nd}$ run obtained, at the step-wise change portion of glass transition, the glass transition temperature Tg is identified at the point at which the straight line, which exists in the direction of a vertical axis at the equal distance from the line which extended any one of the baselines, intersects the curve in the step-wise change portion of glass transition.

Further, the dynamic storage elastic modulus refers to the value obtained from a prepared sheet with a thickness of 200 μm according to the method specified in JIS K-7244 (1999 edition). In detail, it is the value obtained when the temperature dependency (temperature dispersion) is measured under the measuring conditions of tensile mode, sample dynamic amplitude velocity (drive frequency) 1 Hz, inter-chuck distance 5 mm, strain amplitude 10 μm, force amplitude initial value 100 mN, and heating rate 2° C./min.

Further, in the case where the non-acid-denaturated polyolefin resin (b1) is used, it is preferred that the MFR of the polyolefin resin (b1) is 1 g/10 min or higher. The MFR in this case refers to the value measured at a load of 5 kg and at the temperature of the melting point of the aromatic polyester resin (A)+5° C. on the basis of ASTM-D1238 (1999). More preferred is 20 g/10 min or higher, and further more preferred is 100 g/min or higher. It is not preferred that MFR is lower than 1 g/10 min for such reasons that the polyolefin resin (b1) cannot be sufficiently finely dispersed in the aromatic polyester resin (A) and that the film cannot be made to have excellent gas barrier properties, heat resistance, moldability, releasability, flame retardancy, weather resistance (UV resistance), insulation or light diffusibility.

Meanwhile, the melting point of the aromatic polyester resin (A) refers to the melting point Tm in a heating process (heating rate: 20° C./min), obtained by DSC based on JIS K-7121 (1999). Particularly the peak top temperature at the crystal melt peak of the $2^{nd}$ run obtained by the abovementioned method (C1) to (C4) is the melting point of the aromatic polyester resin (A).

Further, it is necessary that the volume occupancy of the voids in the polyester layer (W layer) is less than 3 vol % based on the volume of the polyester layer (W layer).

In this case, the volume occupancy of the voids can be obtained according to the following procedure:
- (D1) The area of the polyester layer (W layer) in the image obtained in the aforementioned (A2) is measured as A.
- (D2) The area of all the voids existing in the polyester layer (W layer) in the image is measured and the total area is employed as B. In this case, the voids to be measured include not only the voids entirely contained in the image but also the voids partially contained in the image.
- (D3) B is divided by A (B/A), and the quotient is multiplied by 100, to calculate the volume occupancy (%) of the voids in the polyester layer (W layer).
- (D4) The same measurement and calculation is made for total 100 images obtained by the aforementioned (A6), and the arithmetic mean value of the volume occupancy values (%) of voids obtained in the respective images is obtained as the volume occupancy of the voids in the polyester layer (W layer).

It is preferred that the volume occupancy of the voids is 2 vol % or less. More preferred is 1 vol % or less, and especially preferred is 0.5 vol % or less.

The voids existing inside the polyester layer (W layer) are likely to form creases in the film and lower the light transmittance, impairing the excellent properties peculiar to the polyolefin such as gas barrier properties, moldability, releasability, flame retardancy, UV resistance, hydrolysis resistance and electric insulation provided by the incompatible component (B) contained.

Therefore, it is preferred that the volume occupancy of voids is as small as possible, and the lower limit is 0 vol %.

Further, if the void content is larger than 3 vol %, the above-mentioned excellent properties are little exhibited.

The volume occupancy of voids can be made smaller as follows: in the case where the incompatible component (B) consists of the non-acid-denaturated polyolefin resin (b1) and the acid-denaturated polyolefin resin (b2), if the content of the acid-denaturated polyolefin resin (b2) is kept in the suitable range described before, for example, in a range from 2 parts by weight to 45 parts by weight per 100 parts by weight of the non-acid-denaturated polyolefin resin (b1), then a smaller volume occupancy of voids can be achieved.

On the other hand, in the case where the incompatible component (B) consists of the acid-denaturated polyolefin resin (b2) only, if the acid value of the acid-denaturated polyolefin resin (b2) is kept in a range from 0.001 KOH mg/g to 20 KOH mg/g, a smaller volume occupancy of voids can be achieved.

Further, as required, adequate additives such as a heat resistant stabilizer, oxidation resistant stabilizer, ultraviolet light absorber, ultraviolet stabilizer, organic lubricant, organic crosslinked fine particles, inorganic particles, filler, nucleating agent, dye, dispersing agent and coupling agent can be mixed with the polyester layer (W layer) by amounts not impairing the effect.

Among these additives, especially it is preferred to add organic or inorganic particles to the polyester layer (W layer). If organic crosslinked particles or inorganic particles are added, the polyester layer (W layer) can be made to have a function in response to the material used as the particles.

Examples of the inorganic particles include calcium carbonate, magnesium carbonate, zinc carbonate, titanium oxide, zinc oxide (zinc flower), antimony oxide, cerium oxide, zirconium oxide, tin oxide, lanthanum oxide, magnesium oxide, barium carbonate, zinc carbonate, basic lead carbonate (white lead), barium sulfate, calcium sulfate, lead sulfate, zinc sulfide, calcium phosphate, silica, alumina, mica, mica titanium, talc, clay, kaolin, lithium fluoride, calcium fluoride and the like.

Further, examples of the organic crosslinked particles include crosslinked fine particles of silicone-based compounds, crosslinked styrene, crosslinked acryl, crosslinked melamine and the like, and thermoplastic resins other than the polyolefin resins incompatible with the aromatic polyester resin (A) but capable of being finely dispersed in the aromatic polyester resin (A) can also be used as particles.

In the abovementioned case, it is especially preferred to use inorganic particles or organic crosslinked particles, and it is more preferred to use inorganic particles, since the polyester layer (W layer) can be made to have a function without impairing the excellent properties peculiar to the polyolefin such as gas barrier properties, heat resistance, moldability, releasability, flame retardancy, UV resistance, hydrolysis resistance and electric insulation.

Particular examples of the function include: (1) if ultraviolet light-absorbable particles are used, the UV resistance can be further enhanced, and (2) if particles different in refractive index from that of the polyester layer are used, light diffusibility can be further enhanced. These are described below in detail.

At first, with regard to (1), inorganic ultraviolet light-absorbable particles of titanium oxide, zinc oxide or the like or organic crosslinked particles containing or copolymerized with an ultraviolet light absorber are added to the polyester layer (W layer), to ensure that such properties as UV resistance and electric insulation already enhanced by containing a polyolefin can be maintained also in the case where the polyester layer (W layer) is used in an environment exposed to ultraviolet light for a long period of time.

Further, with regard to (2), silica, alumina, calcium carbonate, barium sulfate or organic crosslinked particles of crosslinked acryl, crosslinked polystyrene or the like are used, to ensure that in the case where the polyester layer (W layer) is used, for example, as a light diffusion film, the light diffusibility can be further enhanced.

For example, in the case of (1), it is preferred that the content of the fine particles is 1 wt % or larger based on the weight of the polyester layer (W layer). More preferred is 5 wt % or larger, and further more preferred is 10 wt % or more. The upper limit of the content is not especially limited, but if the content is too large, the film is frequently broken. Therefore, preferred is 50 wt % or smaller, and further more preferred is 40 wt % or smaller. Especially preferred is 30 wt % or smaller.

Further, with regard to (2), it is preferred that the content is 0.1 wt % or larger based on the weight of the polyester layer (W layer). More preferred is 0.5 wt % or larger, and especially preferred is 1 wt % or larger. The upper limit of the content is not especially limited, but if the content is too large, the film is frequently broken, and the obtained film declines in clarity. Therefore, preferred is 20 wt % or smaller, and more preferred is 15 wt % or smaller. Especially preferred is 10 wt % or smaller.

Furthermore, the film can be a single-layer film consisting of the above-mentioned polyester layer (W layer) only or a laminate film having another layer laminated thereon. That is, one layer may be laminated on one side only of the polyester layer (W layer) or one each layer may also be laminated on both sides of the polyester layer (W layer). Meanwhile, in the case where the effect of letting a polyester film have the properties of a polyolefin resin is desired to be exhibited to the maximum extent, a preferred mode is a single-layer film consisting of the polyester layer (W layer) only or a laminate film consisting of multiple layers, each corresponding to the polyester layer (W layer). Further, in the case where the obtained film is used as a film to be coated or processed in any other way on the surface, a preferred mode is a laminate film laminated at least on one surface with a polyester layer not containing the incompatible component (B) (P layer), more preferably with a biaxially oriented polyester layer.

In the case where the film is a laminate film, the ratio of the thickness of the polyester layer (W layer) (in the case where there are multiple polyester layers (W layers), the sum of the thicknesses of the respective layers is called the thickness of the polyester layer (W layer)) to the sum of the thicknesses of the other layers ((the thickness of the polyester layer (W layer)/the sum of the thicknesses of the layers other than the W layer)=(lamination ratio)) can be arbitrarily decided for each application. However, in the case where the effect of letting a polyester film have the properties of a polyolefin resin is desired to be exhibited to the maximum extent, it is preferred that the ratio is 3/1 or higher. More preferred is 5/1 or higher, and further more preferred is 6/1 or higher. Further, in the case where the obtained film is used as a film to be coated or processed in any other way on the surface, the lamination ratio is arbitrary, and the ratio can also be lower than 3/1. More preferred ranges for respective applications are described later.

Moreover, it is preferred that the surface free energy of the film is 42 mN/m or lower. More preferred is 37 mN/m or lower, and especially preferred is 34 mN/m or lower. If the surface free energy is kept in this range, the film can be suitably used as a releasing film, packaging film or the like. Meanwhile, the lower limit is not especially specified, but preferred is 20 mN/m or higher. If the surface free energy is lower than 20 mN/m, the film may be too slippery in the film forming step, and continuous film formation may be difficult.

Further, it is preferred that the water vapor permeability of the film is 32 g/m²·day or less. More preferred is 27 g/m²·day or less, and especially preferred is 22 g/m²·day or less. If the water vapor permeability is kept in this range, the film can be suitably used as a packaging film or the like. Meanwhile, the lower limit is not especially specified, but 0 g/m²·day is a substantial lower limit.

Further, it is preferred that the initial elastic modulus of the film in an environment of 80° C. is 2.1 GPa or less. More preferred is 1.9 GPa or less, and especially preferred is 1.7 GPa or less. If the initial elastic modulus in an environment of 80° C. is kept in this range, the film can be suitably used as a film to be molded. Meanwhile, the lower limit is not especially specified, but preferred is 1.0 GPa or more. If the initial elastic modulus is less than 1.0 GPa, the film is not firm in an environment of 80° C. and may be poor in handling properties.

Furthermore, it is preferred that the stress of the film at 100% elongation in an elongation test performed in an environment of 80° C. is 115 MP or less. More preferred is 100 MPa or less, and especially preferred is 80 MPa or less. If the stress at 100% elongation in an environment of 80° C. is kept in this range, the film can be suitably used as a film to be molded. Meanwhile, the lower limit is not especially specified, but preferred is 40 MPa or more. If the stress is less than 40 MPa, it may be difficult to precisely control the elongation molding in an environment of 80° C.

Further, it is preferred that the yellowing factor of the film after an ultraviolet light irradiation test for 24 hours (JIS K-7105-1981) is 25 or lower. More preferred is 20 or lower, and especially preferred is 15 or lower. If the yellowing factor is kept in this range, the film can be suitably used for such an application as exposed to light such as an outdoor film, illumination signboard film and surface light source film. Meanwhile, the lower limit is not especially specified, but preferred is −5 or higher. If the yellowing factor is lower than −5, the film may be colored blue unpreferably in view of appearance.

Further, it is preferred that the partial discharge voltage of the film is 510 V or higher. More preferred is 590 V or higher, and especially preferred is 670 V or higher. If the partial discharge voltage is kept in this range, the film can be suitably used for an application requiring insulation such as a solar battery backsheet. Meanwhile, the upper limit is not especially specified, but preferred is 10000 V or lower. More preferred is 1000 V or lower. If the partial discharge voltage is higher than 10000 V, slight friction is likely to cause static electricity, and the film contamination by dust is likely to be caused. A solar battery backsheet refers, for example, to the back surface sealing film shown in FIG. 1 of JP 2002-26354 A, and a preferred configuration is described later.

Further, it is preferred that the light transmittance of the film is 30% or higher. More preferred is 50% or higher, and further more preferred is 65% or higher. Especially preferred is 75% or higher, and most preferred is 80% or higher. Furthermore, it is preferred that the haze of the film is 50% or higher. More preferred is 70% or higher, and especially preferred is 90% or higher. If the light transmittance and the haze are kept in these ranges, the film can be suitably used as a light diffusion film or the like. Meanwhile, the upper limits are not especially specified, and the upper limits of the light transmittance and the haze are substantially 100%. Meanwhile, in the case where the film is not used as a light diffusion film, the haze is not especially limited.

Further, it is preferred that the initial elastic modulus of the film in an environment of 23° C. is 4.0 GPa or less. More preferred is 3.5 GPa or less, and especially preferred is 3.0 GPa or less. If the initial elastic modulus in an environment of 23° C. is kept in this range, a flexible film excellent in handling properties can be obtained. Meanwhile, the lower limit for the application to molding is not especially specified, but it is preferred that the lower limit for other than the application to molding is 2.3 GPa or more. If the initial elastic modulus is less than 2.3 GPa, the film is not firm and may be poor in handling properties.

Further, it is preferred that the stress of the film at 100% elongation in an elongation test performed in an environment of 23° C. is 185 MPa or less. More preferred is 160 MPa or less, and especially preferred is 140 MPa or less. If the stress at 100% elongation in an environment of 23° C. is kept in this range, the film can be easily molded in an environment of 23° C. Meanwhile, the lower limit is not especially specified, but preferred is 100 MPa or more. If the stress is less than 100 MPa, precise molding may not be able to be performed.

Further, the specific gravity of the film is not especially limited, but it is preferred that the ratio is 1.0 to 1.4. It is not preferred that the specific gravity is lower than 1.0, since the film often contains voids therein. Further, if the specific gravity is higher than 1.4, the film may become less light.

In the case where the incompatible component (B) consists of the non-acid-denatured polyolefin resin (b1) and the acid-denatured polyolefin resin (b2) in the polyester layer (W layer), the abovementioned various properties of the film can be kept in the respective suitable ranges, by keeping the total content of the non-acid-denatured polyolefin resin (b1) and the acid-denatured polyolefin resin (b2) in the suitable range described before or by keeping the content of the acid-denatured polyolefin resin (b2) in the suitable range described before, for example, in a range from 2 parts by weight to 45 parts by weight per 100 parts by weight of the non-acid-denatured polyolefin resin (b1), as also described in the examples described later.

Further, in the case where the incompatible component (B) consists of the acid-denatured polyolefin resin (b2) only, the abovementioned various properties can be kept in the respective suitable ranges, by keeping the content of the acid-denatured polyolefin resin (b2) in the suitable range described before or by keeping the acid value of the acid-denatured polyolefin resin (b2) in the suitable range described before.

Further, for keeping the haze in the abovementioned range, it is preferred to use poly-4-methylpentene-1 or a derivative thereof or a cyclic polyolefin resin or a derivative thereof as the polyolefin resin of the non-acid-denatured polyolefin resin (b1) and/or the acid-denatured polyolefin resin (b2). It is more preferred to use poly-4-methylpentene-1 or a derivative thereof, since higher heat resistance can be achieved.

Furthermore, for keeping the surface free energy and the partial discharge voltage in the abovementioned ranges, a film constitution in which the polyester layer (W layer) is formed at least on one surface of a polyester film is preferred.

For keeping the surface free energy in the abovementioned range, it is preferred to use poly-4-methylpentene-1 or a derivative thereof as the polyolefin resin of the non-acid-denatured polyolefin resin (b1) and/or the acid-denatured polyolefin resin (b2).

Further, the partial discharge voltage can be enhanced by using a crystalline resin as the polyolefin resin of the non-acid-denatured polyolefin resin (b1) and/or the acid-denatured polyolefin resin (b2). In this case, the crystalline resin refers to a resin with a crystal melt peak area of 1 J/g or more in the $2^{nd}$ run when differential scanning calorimetry (DSC) is performed by the abovementioned method of (C1) through (C4) based on JIS K-7121 (1999). More preferred is polyethylene or a derivative thereof, or polypropylene or a derivative thereof. Moreover, homo-polyethylene or homo-polypropylene is desirable, since the partial discharge voltage can be further enhanced.

Further, the thickness of the film is not especially specified, and an adequate film thickness can be selected for each application. It is generally preferred that the thickness is 3 μm to 500 μm. If the film thickness is smaller than 3 μm, the film may be likely to be broken when it is produced. Moreover, if the film thickness is larger than 500 μm, it may be difficult to wind the film as a roll.

Further, the film can also have a layer with another function (C layer) laminated thereon using a well-known technique as required to such an extent the effect is not lost. Examples of the layer include a light diffusion layer containing spherical particles, light condensing layer, polarization split layer, reflection preventing layer, light reflection layer, flame retardant layer, cushion layer, antistatic layer, ultraviolet light absorbing layer, hard coat layer, adhesive layer, gas barrier layer and the like. If a desired layer is formed for each application, the properties of the polyester film can be further enhanced.

An example of the C layer is a light diffusion layer containing spherical particles (D layer). The D layer formed can be used to further enhance the light diffusibility of the polyester film and to control the outgoing light distribution. The detail is described later.

Next, an example of the process for producing a film is described below, but this disclosure is not limited thereto or thereby.

A film forming apparatus with an extruder (main extruder) is used for forming the polyester layer (W layer). A mixture consisting of chips of the aromatic polyester resin (A) sufficiently dried in vacuum as required, chips of the non-acid-denatured polyolefin resin (b1) and chips of the acid-denatured polyolefin resin (b2) is supplied into a heated extruder. When the non-acid-denatured polyolefin resin (b1) and the acid-denatured polyolefin resin (b2) are added, the master chips prepared by homogeneously melt-kneading them beforehand can be used, or they can be directly supplied into a kneading extruder.

Further, in the case where the film is a laminate film, a composite film forming apparatus with a subsidiary extruder in addition to the abovementioned main extruder is used. A mixture obtained by mixing chips of a thermoplastic resin (for example, an aromatic polyester resin such as PET) sufficiently dried in vacuum as required and various additives is supplied into a heated subsidiary extruder, and co-extruded for lamination.

Furthermore, in the melt extrusion, it is preferred to filter using a filter with a mesh of 40 μm or less, and to subsequently introduce into a T die for extrusion molding, to obtain a molten sheet (a molten laminate sheet in the case of a laminate film).

The molten sheet is brought into contact with a drum cooled to a surface temperature of 10° C. to 60° C. electrostatically, for being cooled and solidified, to prepare a non-oriented (unstretched) film.

The non-oriented film is introduced into rolls heated to a temperature of 70° C. to 120° C., and stretched to a range from 2 times to 4 times by inter-roll stretching in the machine direction (i.e., in the film progress direction; hereinafter may also be called "longitudinal direction"), being cooled by rolls with a temperature of 20° C. to 50° C., to obtain a monoaxially oriented (monoaxially stretched) film (meanwhile, this stretching step may also be called the longitudinal stretching step).

In succession, while both the edges of the monoaxially oriented film are held by clips, the film is introduced into a tenter and stretched to a range from 2 times to 4 times by pulling stretching in the direction perpendicular to the machine direction (i.e., in the transverse direction of the film; hereinafter may also be called "lateral direction") in an atmosphere heated to a temperature in a range from 90° C. to 150° C., to obtain a biaxially oriented (biaxially stretched) film (meanwhile, this stretching step may also be called the lateral stretching step).

It is preferred that the stretching ratios in the machine direction and in the transverse direction are respectively 2.5 times or higher. More preferred ratios are 2.8 times or higher, and further more preferred ratios are 3.0 times or higher. Especially preferred ratios are 3.5 times or higher.

If the stretching ratios are kept in these ranges, the dispersion pieces of the incompatible component (B) can have a shorter average minor axis length, longer average major axis length and higher flatness.

Meanwhile, it is preferred that the stretching ratios in the machine direction and in the transverse direction are not higher than 4 times respectively. If the stretching ratios are higher than 4 times, the film is likely to be broken in the stretching step.

Further, as required, to complete the crystal orientation of the obtained biaxially oriented film, and to let the film have flatness and dimensional stability, the film is heat-treated successively in the tenter in a range from 150° C. to the melting point of the aromatic polyester resin (A)−10° C. (240° C. or lower in the case where the aromatic polyester resin (A) is polyethylene terephthalate) for 1 second to 30 seconds, then slowly cooled, and further cooled to room temperature, and subsequently as required, corona discharge treatment or the like may also be performed for further enhancing the adhesion to another material. In the above-mentioned heat treatment step, as required, the film may also be relaxed by 0.1 to 12% in the transverse direction or in the machine direction.

Meanwhile, in general, a higher heat treatment temperature assures higher thermal dimensional stability, and further the flatness of the dispersion pieces of the incompatible component (B) also tend to be enhanced. Therefore, it is preferred that the film is heat-treated at a high temperature (180° C. or higher) in the film forming step.

The biaxially oriented film can be wound to obtain the film.

Further, when biaxial stretching is performed, either sequential stretching or simultaneous biaxial pulling stretching can be performed. In the case where simultaneous biaxial pulling stretching is used, the breaking of the film in the production process can be prevented, and the transfer defects caused by sticking to heated rolls are unlikely to occur.

Further, subsequently to the biaxial stretching, second stretching can also be performed in the machine direction and/or the transverse direction.

Furthermore, various additives can also be added to the film to such an effect that the effect is not impaired.

The film can be suitably used as a releasing film, packaging film, flexible film, moldable film, UV resistant film, electric insulation film, light diffusion film, solar battery backsheet film and the like. Among them, (i) light diffusion film, (ii) releasing film and (iii) solar battery backsheet film are described below in detail.

Light Diffusion Film

Figure 7:
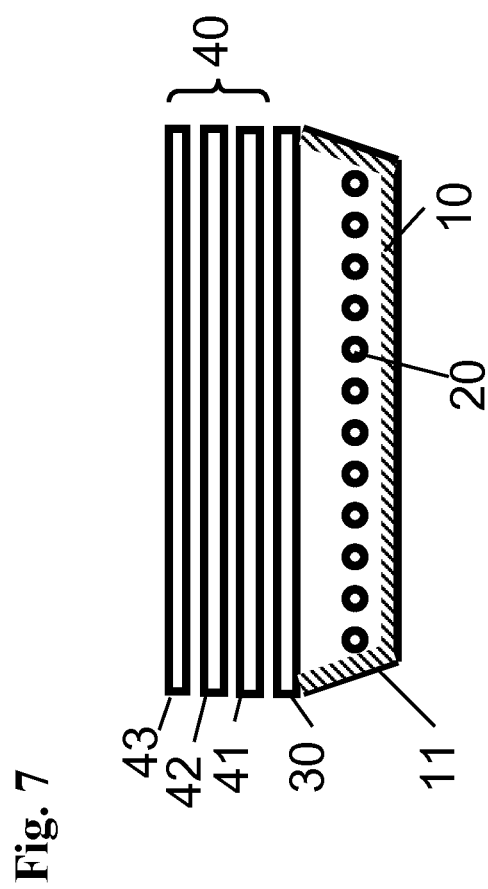
FIG. 7 is a drawing showing an example of a direct type surface light source.

The film can be suitably used as a light diffusion film for a liquid crystal display backlight. Especially it is useful as a film excellent in the capability to eliminate the luminance irregularity of a direct type backlight. One example of the constitution of the backlight is explained in reference to FIG. 7. FIG. 7 is a sectional view showing a direct type backlight device, cut in the longitudinal direction. The housing of the backlight is covered with a reflection plate 10, and one face is open. Inside the housing, fluorescent tubes 20 are disposed. In the open portion, multiple optical films 40 are arranged on a diffusing plate 30, to form a backlight.

As the reflection plate 10, for example, a white polyester sheet containing fine voids therein or the like can be preferably used. Further, as the light sources 20, cold cathode fluorescent lamps (CCFLs) or external electrode fluorescent lamps (EEFLs) are used as linear light sources, or light emitting diodes (LEDs) or the like are used as point light sources. These linear or point light sources are uniformed by the diffusing plate 30 and the optical films 40 installed on the diffusing plate 30, to form a surface light source.

In this case, in a constitution wherein conventional optical films are used as the optical films 40, since the light uniforming effect per film is low, the luminance at the locations right above the light sources is different from the luminance at the locations right above the spaces between the light sources, and if the number of films is small, the images of the light sources are visible. Therefore, to achieve uniform luminance by eliminating the luminance irregularity (irregularity elimination) it is necessary to install many optical films, and it raises the problem that the thickness of the backlight becomes large. To address this problem, in the case of a film containing spherical dispersion pieces therein as described in JP 2001-272508 A and the like, a small number of films can achieve uniform luminance, but it is difficult to achieve a high luminance value.

Since the film has flat dispersion pieces inside contained therein, which are different in refractive index from the matrix resin (aromatic polyester resin (A)), the probability of light collision increases even though the volume occupancy of the dispersion pieces remain the same, compared with the conventional film containing spherical dispersion pieces. As a result, transmitted light is likely to be uniformly diffused.

Figure 9:
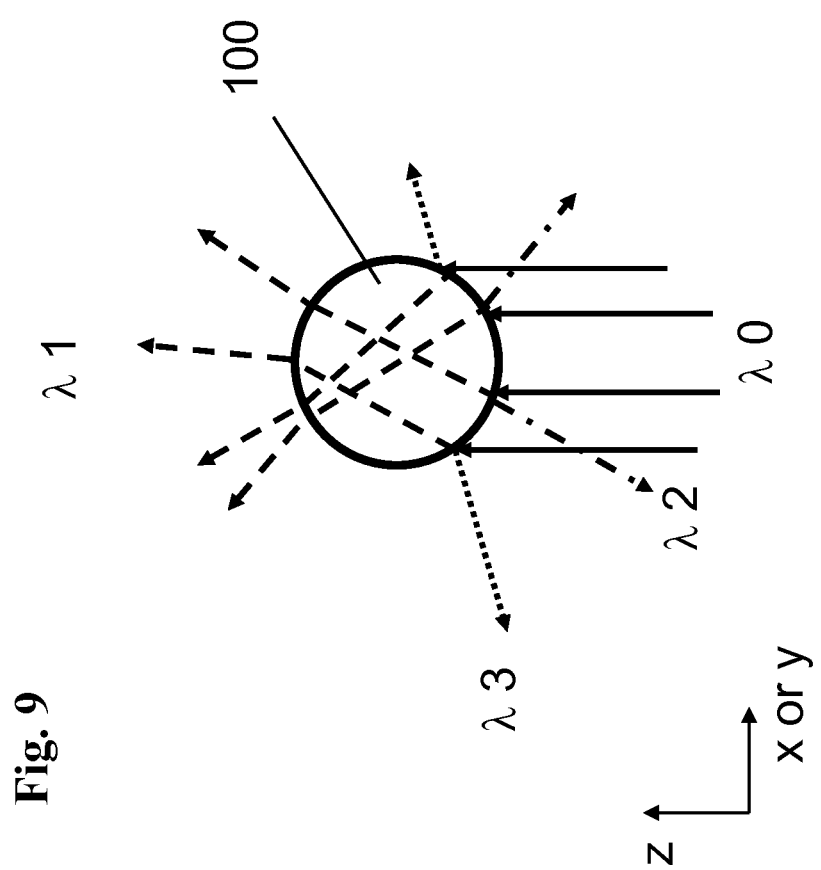
FIG. 9 is a drawing for explaining the behavior of light when the light collides with a spherical piece of an incompatible component (B).
Figure 10:
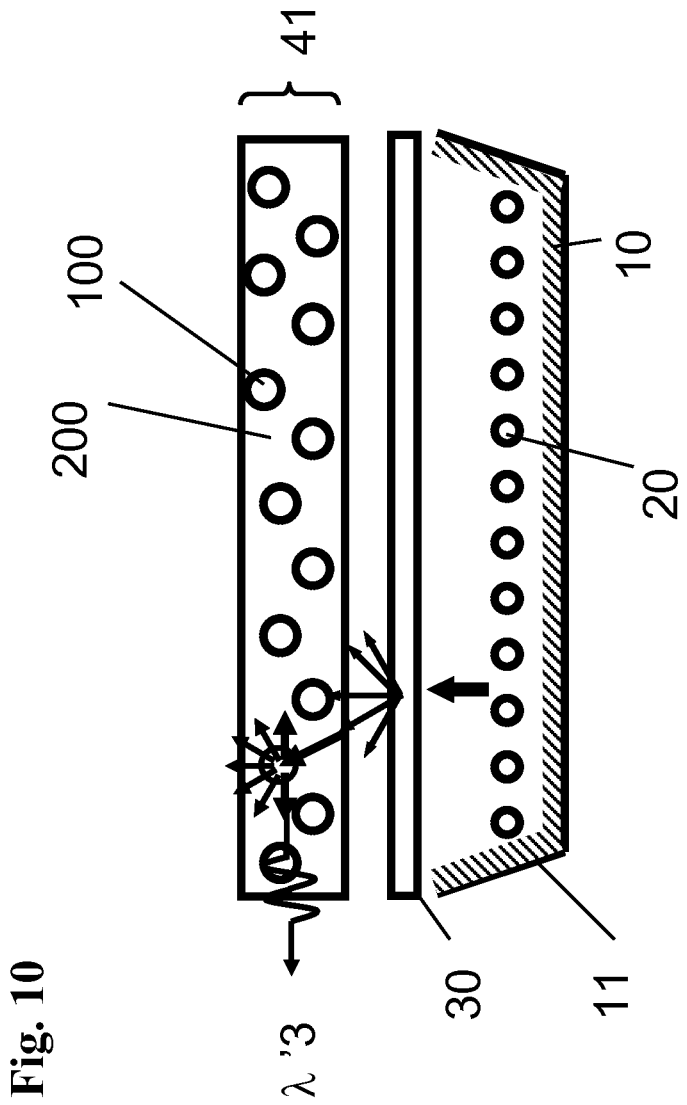
FIG. 10 is a drawing for explaining the behavior of light in a direct-under-type surface light source mounted with the film of FIG. 8.

The light colliding with the dispersion pieces is reflected and refracted at the interfaces between the matrix resin and the dispersion pieces. The behavior in this case is explained in reference to FIGS. 8 to 13. FIG. 8 shows a conventional film containing spherical dispersion pieces 100 in a matrix 200, and FIG. 9 is a drawing showing the behavior in the case where light falls on a spherical dispersion piece in the film of FIG. 8. The light λ0 (indicated by solid lines in the drawing) falling on the dispersion piece 100 is reflected and refracted repetitively at the interfaces, to be isotropically scattered as transmitted light λ1 (indicated by broken lines in the drawing), as light λ2 reflected at the interface and scattered back in the incident direction (indicated by a dot-dash line in the drawing), as light λ3 scattered in the direction almost perpendicular to the incident direction (indicated by a dotted line in the drawing) or the like. In this case, the light λ3 scattered in the direction almost perpendicular to the incident direction propagates in the in-plane direction of the film and outgoes from the end face of the film. FIG. 10 is a drawing showing the behavior of light in the case where the film of FIG. 8 is used as a film 41 for a surface light source. The light outgoing from an end face of the film becomes lost light (λ'3) and is not used for display. Therefore, in the conventional film, if the diffusibility is enhanced, the light quantity of the light (λ3) scattered in the direction almost perpendicular to the incident direction increases and, as a result, when the film is used as a film for a surface light source, there arises a problem that the light quantity of the lost light (λ'3) increases to lower the luminance.

Figure 11:
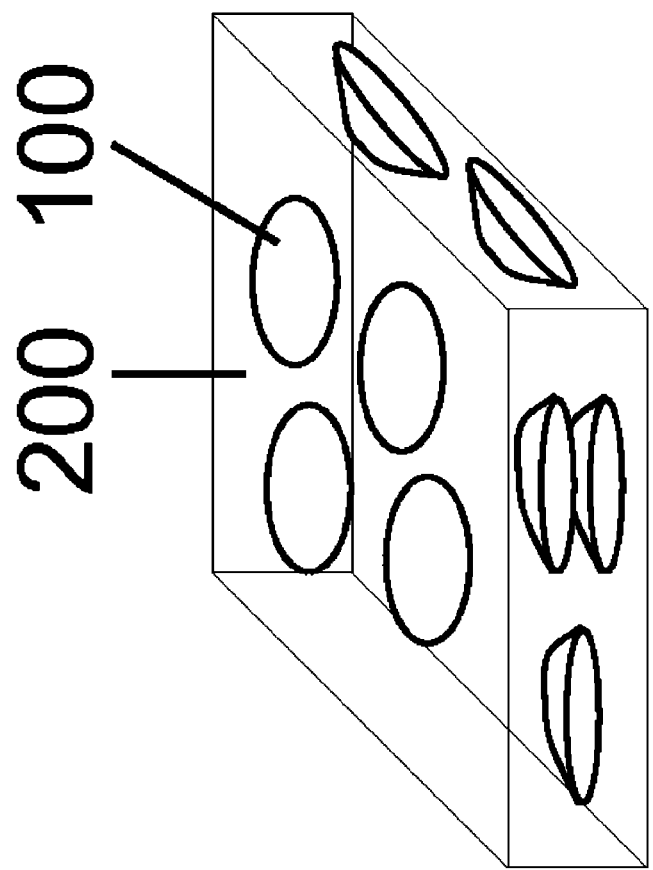
FIG. 11 is a perspective view showing the film containing flat pieces of an incompatible component (B).
Figure 12:
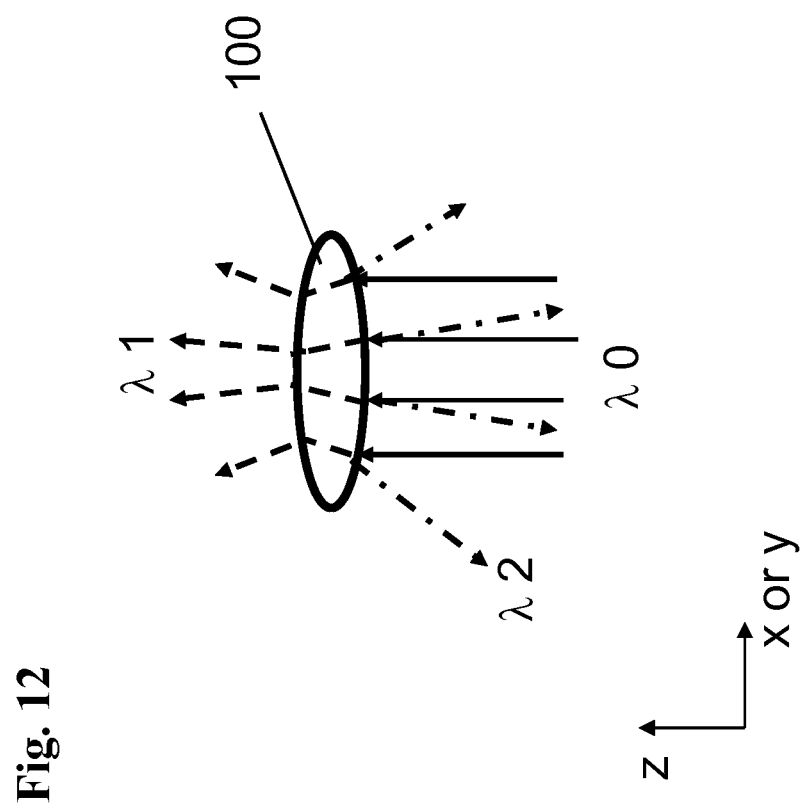
FIG. 12 is a drawing for explaining the behavior of light when the light collides with a flat piece of an incompatible component (B).
Figure 13:
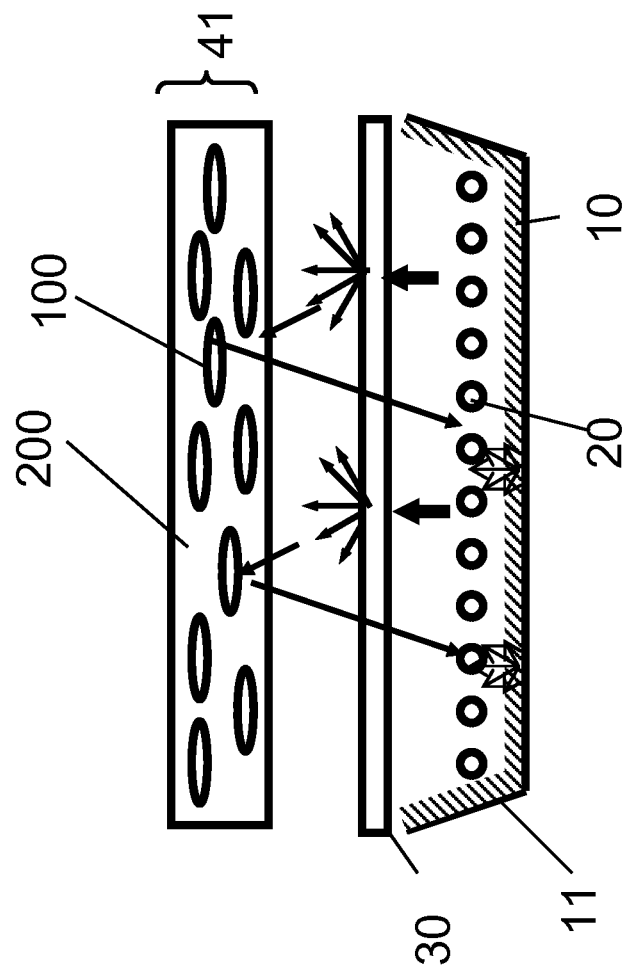
FIG. 13 is a drawing for explaining the behavior of light in a direct type surface light source mounted with the film of FIG. 11.

On the other hand, FIG. 11 shows a film which contains flat dispersion pieces 100 in a matrix 200, and FIG. 12 is a drawing showing the behavior in the case where light falls on a flat dispersion piece 100. Even if the light λ0 falling on the flat dispersion piece 100 is repetitively reflected and refracted at the interfaces, the light is mostly converted into transmitted light (λ1) and the light (λ2) reflected at the interface and scattered back in the incident direction owing to the shape of the dispersion piece, and there is little light (λ3) scattered in the direction almost perpendicular to the incident direction. Therefore, little light propagates in the in-plane direction of the film and outgoes from the end face of the film. FIG. 13 shows a case where the film is used as a film 41 for a surface light source, and as shown in the drawing, the light quantity (λ'3) outgoing to be lost from the end face of the film can be decreased as shown in the drawing. Meanwhile, as shown in FIG. 13, the light (λ2) reflected at the interface and scattered back in the incident direction is returned into the backlight. Further, it is reflected by the reflection plate 10 and falls on the film again (this phenomenon may also be called "the reuse of light"). Further, in the case where the reuse of light occurs, light is diffused and reflected by the reflection film 10, to repeat the cycle, and the quantity of the light outgoing from the surface light source can be uniformed in the plane. As a result, the luminance irregularity can be eliminated to achieve uniformity (irregularity elimination). Owing to the mechanism described above, the film can achieve both a high luminance and a high capability of eliminating luminance irregularity.

Even if the film is used as any one of the multiple optical films 40, a high capability of eliminating luminance irregularity can be exhibited. However, it is preferred to use the film as the optical film 41 right above the diffusion plate in view of high effect, since the back scattered light can be effectively used to achieve a high luminance.

The film alone can achieve a high luminance and a high capability of eliminating luminance irregularity owing to the feature that the film contains flat dispersion pieces, but forming a light diffusion layer (D layer) with an uneven surface on the film is also a preferred mode. Examples of the light diffusion layer include a coating layer containing fine particles, a transfer layer formed using a mold or the like, and the uneven surface can provide both the diffusibility based on light-refracting action and light condensability due to a lens effect, allowing light diffusibility to be further enhanced and allowing a higher luminance to be achieved.

In the case where a light diffusion layer (D layer) is formed on the film, when the film is mounted on a backlight, it is preferred to install the film in such a manner that the surface of the film on the side not covered with the light diffusion layer (D layer) may face the diffusing plate 30. In this constitution, the direction in which the light diffused by the film outgoes can be controlled by the light diffusion layer (D layer). As a result, a backlight higher in luminance and excellent in uniformity can be obtained. Meanwhile, in the case where one each light diffusion layer (D layer) is formed on both the surfaces of the film, the film can be installed in such a manner that either of the surfaces may face the diffusion plate 30.

In the case where the light diffusion layer (D layer) is formed, a constitution more preferred in view of easy formability and the uniformity of the obtained layer is a lamination structure having a polyester layer not containing the incompatible component (B) (P layer) at least on one surface, and it is more preferred that one each P layer is formed on both the surfaces of the lamination structure. Further, in view of ensuring the dimensional stability during processing and flatness, it is more preferred that the P layer is a biaxially oriented polyester film. Furthermore, in view of obtaining high light diffusibility, it is preferred that the thickness ratio of the W layer and the P layer (thickness of W layer/thickness of P layer; in the case where there are multiple W layers, the sum of the thicknesses of the W layers is called the thickness of the W layer, and in the case where there are multiple P layers, the sum of the thicknesses of the P layers is called the thickness of the P layer) is 5/1 or higher. More preferred is 8/1 or higher. This constitution assures high light diffusibility and allows the surface to have processability.

The fine particles used in the light diffusion layer (D layer) are not especially specified, and fine particles with a desired shape can be used. The size of the fine particles is not especially specified either, but in view of obtaining high light diffusibility, it is preferred that the number average particle size of the fine particles is 1 μm to 20 μm. Further, in terms of material, the fine particles can be organic particles such as polymethyl methacrylate-based particles, polystyrene-based particles and particles of copolymer thereof, inorganic particles of polysilicon, silica or titanium oxide, particles of an organic-inorganic composite material or the like.

Further, it is preferred that the surface of the light diffusion layer (D layer) is uneven. As the measure of the unevenness, a glossiness value of 50 or less is preferred. More preferred is 40 or less, and especially preferred is 30 or less. The glossiness in this case refers to the 60° glossiness measured on the basis of JIS Z 8741 (1999 edition). If the glossiness is kept in the abovementioned range, light diffusibility can be further enhanced, and the capability of eliminating luminance irregularity can be further enhanced, luminance being able to be enhanced.

The thickness of the light diffusion layer (D layer) is not especially limited, but a preferred range is 1 μm to 20 μm. A more preferred range is 1 μm to 10 μm.

It is preferred that the surface light source using the film has an optical film with another function mounted on the abovementioned film to such an extent that the effect of the film is not impaired. If another optical film is used, the luminance and luminance uniformity of the surface light source using the film can be further enhanced. The place where the other optical film is installed can be between the diffusion plate 30 and the film (in FIG. 7, the film is indicated by 42, and the other film is indicated by 41), or other films can also be overlaid on the film (in FIG. 7, other films can be overlaid as 42, 43, . . . on the film 41). As a result, the quality as a surface light source can be enhanced. Examples of the other optical film include a prism sheet, isotropically diffusible sheet, anisotropically diffusing sheet, polarization split film and the like. The surface light source is more excellent than the conventional direct type surface light source in view of excellent light use efficiency, high luminance and wide visibility angle, and can be suitably used for applications of irradiating liquid crystal display elements from behind such as TVs, monitors, various display media and the like.

Releasing Film

In the case where the film is used as a releasing film, it is preferred that the surface layer at least on one side of the film is a polyester film (W layer). In this mode, if highly hydrophobic olefin dispersion pieces are exposed on the surface of the polyester layer (W layer) and the surface is formed to be uneven, then excellent hydrophobicity can be exhibited owing to the synergism of both the hydrophobic effect and the surface effect. Therefore, the film has high releasability without containing a fluorine-based compound or silicone-based compound unlike the conventional releasing films.

A preferred constitution is a lamination structure having a polyester layer (W layer) and a polyester layer not containing the incompatible component (B) (P layer), and it is more preferred that the P layer is a biaxially oriented polyester film. Moreover, a two-layer constitution consisting of the polyester layer (W layer) and the polyester layer not containing the incompatible component (B) (P layer) is more preferred. It is preferred that the thickness ratio of the W layer and the P layer (thickness of W layer/thickness of P layer; in the case where there are multiple W layers, the sum of the thicknesses of the multiple W layers is called the thickness of the W layer, and in the case where there are multiple P layers, the sum of the thicknesses of the multiple P layers is called the thickness of the P layer) is 1/20 to 1/2, or 2/1 to 20/1. A more preferred range is 1/15 to 1/3, or 3/1 to 15/1. A further more preferred range is 1/15 to 1/5, or 5/1 to 15/1, especially preferred is 1/15 to 1/8, or 8/1 to 15/1. If the thickness ratio is lower than 1/20, releasability may decline. Further if the ratio is higher than 1/2 or lower than 2/1, the film may be curled. Furthermore, if the ratio is higher than 20/1, the effect of laminating the P layer may be lost. If the ratio is kept in the abovementioned range, the film can have handling properties equivalent to those of the conventional releasing film without being curled.

The film can be used for various releasing applications of labels, paper coated or laminated with a releasing resin, green sheets, protective films and the like to which conventional fluorine-based compounds and silicon-based compounds have been used, and also for applications in the medical field directly in contact with organisms and foods (such as cell culture substrata and metallic can lamination) and the like to which the conventional compounds could not be used.

Solar Battery Backsheet Film

The film can be suitably used as a solar battery backsheet film. As the backsheet constitution, any desired backsheet constitution can be employed in response to required properties, and an example of it is explained below. For example, an EVA adhesive layer for enhancing the adhesion of the solar battery backsheet to the EVA used for encapsulating power generation elements, an anchor layer for enhancing the adhesion to the EVA adhesive layer, a water vapor barrier layer, an ultraviolet light absorbing layer for preventing ultraviolet deterioration, a light reflection layer for enhancing the power generation efficiency, a light absorbing layer for exhibiting a design effect, adhesive layers for bonding respective layers and the like can be formed to obtain the backsheet constitution.

The EVA adhesive layer is a layer for enhancing the adhesion of the EVA-based resin used for encapsulating power generation elements to the backsheet, being installed on the side nearest to the power generation elements, and contributes to the adhesion between the backsheet and the system. The material of the EVA adhesive layer is a material capable of exhibiting the adhesion to the EVA-based resin, and examples of it include EVA and a mixture consisting of EVA and any one of ethylene-methyl acrylate copolymer (EMA), ethylene-ethyl acrylate copolymer (EEA), ethylene-butyl acrylate copolymer (EBA), ethylene-methacrylic acid copolymer (EMAA), ionomer resin, polyester resin, urethane resin, acrylic resin, polyethylene resin, polypropylene resin, polyamide resin and the like.

Further, as required, for enhancing the adhesion of the EVA adhesive layer to the backsheet, it is preferred to form the anchor layer. The material of the anchor layer is not especially limited if the adhesion to the EVA adhesive layer can be exhibited. For example, it is preferred to use a mixture with a resin such as an acrylic resin or polyester resin as the main component.

The water vapor barrier layer is a layer for preventing the invasion of water vapor from the backsheet side to prevent the deterioration of the power generation elements by water vapor when the solar battery is constituted. The water vapor barrier layer can be formed by forming an oxide layer of silicon oxide or aluminum oxide or a metal layer of aluminum or the like on the film surface by a well-known method such as vacuum deposition, sputtering or the like. It is preferred that the thickness of the water vapor barrier layer is in a range from 100 angstroms to 200 angstroms.

The ultraviolet light absorbing layer is a layer for shielding ultraviolet light to prevent the ultraviolet deterioration of the resin inside, and any arbitrary material can be used if it has a function to shield ultraviolet light of 380 nm or shorter.

The light reflection layer is a layer for reflecting light, to ensure that the ultraviolet deterioration of the resin inside can be prevented and that the light reaching the backsheet without being absorbed by the solar battery system can be reflected to be returned toward the system for enhancing the power generation efficiency. The layer contains a white pigment such as titanium oxide or barium sulfate, voids or the like.

The light absorbing layer is a layer for absorbing light, to ensure that the ultraviolet deterioration of the resin inside can be prevented and that the design effect of the solar battery system can be improved.

The abovementioned respective layers and the film are combined to form the solar battery backsheet. Meanwhile, in the backsheet using the film, the abovementioned layers are not required to be formed independently of each other, and a functionally integrated layer having multiple functions can also be formed in a preferred mode. Further, in the case where the film already has a function, the layer functionally corresponding to the film can also be omitted. For example, in the case where the film contains an inorganic oxide such as titanium oxide or barium sulfate and is white, the light reflection layer may be omitted as the case may be. Further, if the film contains a carbon-based compound such as carbon black, carbon fibers, carbon nanotubes or fullerenes or contains a light absorbent and can absorb light, the light absorbing layer can be omitted as the case may be. If the film contains inorganic particles capable of absorbing ultraviolet light or contains a light absorbent or the like, the ultraviolet light absorbing layer may be omitted as the case may be.

Further, with regard to the gas barrier layer, it is preferred that the gas barrier layer is formed directly on the film or that a layer with gas barrier properties is formed on another film that is laminated on the surface of the polyester film. Furthermore, a metal foil (for example, aluminum foil) can also be laminated on the surface of the film. In this case, it is preferred in view of processability and gas barrier properties that the thickness of the metal foil is in a range from 10 μm to 50 μm.

Meanwhile, the film is higher than the conventional film in partial discharge voltage, and if the film is used to form the backsheet, the partial discharge voltage can be enhanced compared with the conventional backsheet. When the film is used, both the surface layers of the solar battery backsheet can be layers other than the film, or at least either of the surface layers of the backsheet can be formed of the film. In either case, since the film is higher in partial discharge voltage than the conventional film, the safety of the solar battery backsheet can be enhanced, and the thickness of the backsheet can be reduced. It is more preferred that the polyester layer (W layer) is formed on one surface of the solar battery backsheet, since the partial discharge voltage can be further enhanced. Furthermore, forming the polyester layer (W layer) at least as one surface layer of the backsheet is preferred, since the partial discharge voltage can be further enhanced. The mechanism in which the partial discharge voltage is enhanced is as described below.

At first, the polyester layer (W layer) containing a polyolefin resin with a low dielectric constant as flat pieces can lower the dielectric constant of the entire film. In this case, the film can have high resistance against the electric load from outside. Further, in the case where the polyester layer (W layer) is formed as at least the surface layer of the backsheet, the olefin is dispersed as pieces with a high flatness, to ensure that the olefin can exist in the surface of the film at a high covering rate, and that the surface can be unlikely to be polarized. This assures further higher resistance against the electric load from outside.

As a result of the above, the safety of the solar battery backsheet can be enhanced, and the thickness of the backsheet can be reduced.

In the case where the film is used as a solar battery backsheet, it is preferred to use a film having the polyester layer not containing the incompatible component (B) (P layer) as the outermost surface layer on one side and the polyester layer (W layer) as the outermost surface layer on the other side. Further, in view of easy sticking to another film and the adhesive strength after sticking, it is more preferred to use the polyester layer (P layer) on the surface to be stuck to another material and to use the polyester layer (W layer) as the outermost surface layer of the backsheet. Furthermore, it is preferred that the thickness ratio of the W layer and the P layer (thickness of W layer/thickness of P layer; if there are multiple W layers, the sum of the thicknesses of the W layers is called the thickness of the W layer, and if there are multiple P layers, the sum of the thicknesses of the P layers is called the thickness of the P layer) is 1/20 to 1/2, or 2/1 to 20/1. A more preferred range is 1/15 to 1/3, or 3/1 to 15/1, and a further more preferred range is 1/15 to 1/5, or 5/1 to 15/1. An especially further preferred range is 1/15 to 1/8, or 8/1 to 15/1. If the ratio is lower than 1/20, the partial discharge voltage tends to decline. Further, if the ratio is higher than 1/2 or lower than 2/1, the film may be curled. Further, if the ratio is higher than 20/1, the effect of laminating the P layer may be lost to lower adhesion. If the thickness ratio is in the abovementioned range, the partial discharge voltage can be enhanced without curling the film, and in addition, the film can have the capability of sticking to another material and adhesion.

It is preferred that the thickness of the solar battery backsheet using the film is 20 μm to 500 μm. A more preferred range is 25 μm to 300 μm, and a further more preferred range is 30 μm to 250 μm. If the thickness is smaller than 10 μm, it is difficult to keep the film flat. On the other hand, if the film is thicker than 500 μm, the thickness of the solar battery may become too large in the case where the backsheet is installed in the solar battery.

It is necessary that the solar battery contains the abovementioned solar battery backsheet.

As an example of the constitution of the solar battery, a resin layer in which power generation elements with lead wires for leading electricity are encapsulated by a resin such as an EVA-based resin is bonded onto the abovementioned solar battery backsheet, and further, a substrate (glass, film or the like) with a high light transmittance is bonded onto the resin layer. However, the constitution is not limited to it and any desired constitution can be used.

The power generation elements are multiple elements for converting the light energy of sunlight into electric energy, and they are selected, for example, from crystalline silicon-based elements, polycrystalline silicon-based elements, crystallite silicon-based elements, amorphous silicon-based elements, copper indium selenide-based elements, compound semiconductor-based elements and dye sensitizer-based elements suitably for each purpose, and are connected in series or parallel to each other in response to the desired voltage or current.

The light transmitting substrate is positioned as the outermost surface layer of the solar battery. Therefore, the material of the substrate is a clear material with not only high transmittance but also high weather resistance, high contamination resistance and high mechanical strength properties. The material of the light transmitting substrate can be any material if it satisfies the abovementioned properties. Preferred examples of the material include glass, fluorine-based resins such as ethylene tetrafluoride-ethylene copolymer (ETFE), polyvinyl fluoride resin (PVF), polyvinylidene fluoride resin (PVDF), polytetrafluoroethylene (TFE), tetrafluoroethylene-hexafluoropropylene copolymer (FEP), polychlorotrifluoroethylene resin (CTFE) and polyfluorovinylidene resin, olefin-based resins, acrylic resins, mixtures thereof or the like. In the case of glass, it is more preferred to use tempered glass. In the case of a fluorine-based resin, in view of high weather resistance, it is more preferred to use a fluorine-based resin with polyvinylidene fluoride resin or ethylene tetrafluoride-ethylene copolymer as a main component. In view of mechanical strength, it is further more preferred to use a fluorine-based resin with ethylene tetrafluoride-ethylene copolymer as a main component. Further, in the case where a light-transmitting substrate made of a resin is used, in view of mechanical strength, any of the abovementioned resins monoaxially or biaxially stretched can also be preferably used.

Further, it is preferred to treat any of these substrates on the surface by corona treatment, plasma treatment, ozone treatment or adhesion treatment for making the substrate adhesive to an EVA-based resin used to encapsulate the power generation elements.

The resin used for encapsulating the power generation elements is a material with high clarity, high weather resistance, high adhesion and high heat resistance, for covering the surface unevenness of the power generation elements with the resin for fixing them, protecting the power generation elements from the outside environment, achieving electric insulation and bonding the power generation elements to a clear substrate or a backsheet. Preferred examples of the resin include ethylene-vinyl acetate copolymer (EVA), ethylene-methyl acrylate copolymer (EMA), ethylene-ethyl acrylate copolymer (EEA) resin, ethylene-methacrylic acid copolymer (EMAA), ionomer resin, polyvinyl butyral resin, mixtures thereof or the like. Among these resins, in view of excellent balance among weather resistance, adhesion, packing property, heat resistance, cold resistance and impact resistance, ethylene-vinyl acetate can be more preferably used.

In the solar battery, the abovementioned solar battery backsheet is installed on the back surface of the resin layer used for encapsulating the power generation elements, but in the abovementioned solar battery backsheet, the polyester film may also be disposed on the side of the power generation elements or disposed on the opposite side of the power generation elements. In any of the constitutions, since the polyester film is higher in partial discharge voltage than the conventional film, the safety of the solar battery system can be enhanced, and the thickness of the solar battery system can be reduced. It is more preferred that the polyester layer (W layer) of the film formed on the surface of the abovementioned solar battery backsheet on one side is on the side opposite to the resin layer, that is, on the outermost back surface of the solar battery. In this constitution, compared with the constitution in which the polyester layer (W layer) is on the side of the resin layer, a solar battery with higher durability can be obtained, and the thickness of the solar battery can be reduced.

As described above, the solar battery using the solar battery backsheet that uses the abovementioned polyester film can provide a solar battery system with higher safety or with a thinner thickness, compared with the conventional solar battery. Further, this solar battery can be suitably used for a photovoltaic power generation system, power source for small electronic parts, and other various outdoor and indoor applications.

Measuring Methods

A. Surface Free Energy (1) To distinguish both the surfaces of a film, one of the film surfaces is called surface A, and the other surface is called surface B. At first, using water as a test liquid, the contact angle of the test liquid on surface A was measured at 23° C. and at 65% RH using a contact angle meter, CA-D (produced by Kyowa Interface Science Co., Ltd.). On one test surface, measurement was performed 5 times, and the arithmetic mean value of the measured values was employed as the contact angle (θ).

(2) Then, the contact angle (θ) of ethylene glycol on surface A was measured according to the same method under the same conditions as those of (1), except that ethylene glycol was used as the test liquid.

(3) Then, the contact angle (θ) of methylene iodide on surface A was measured according to the same method under the same conditions as those of (1), except that methylene iodide was used as the test liquid.

(4) The following formula was established for each test liquid:

$$(\gamma Sd \cdot \gamma Ld)^{1/2} + (\gamma Sp \cdot \gamma Lp)^{1/2} + (\gamma Sh \cdot \gamma Lh)^{1/2} = (1 + \cos \theta)/2$$

where γLd is the dispersion force of the test liquid; γLp is the polar force of the test liquid; and γLh is the hydrogen bonding force of the test liquid. If the test liquid is water, we have γLd=10.8 mN/m, γLp=22.74 mN/m and γLh=38.46 mN/m, and if the test liquid is ethylene glycol, we have γLd=17.5 mN/m, γLp=4.69 mN/m and γLh=25.96 mN/m. If the test liquid is methylene iodide, we have γLd=43.7 mN/m, γLp=1.31 mN/m and γLh=2.65 mN/m. Further, θ denotes the contact angle of the test liquid on the test surface.

(5) The abovementioned formula was substituted by γLd, γLp, γLh and θ, and the obtained simultaneous equations with three unknown variables were solved for γSd, γSp and γSh.

(6) The sum of γSd (mN/m), γSp (mN/m) and γSh (mN/m) was calculated as the surface free energy (mN/m) of the test surface.

(7) Also on the surface B of the film, measurement was performed as in (1) to (6), to calculate the surface free energy.

(8) The surface free energy on surface A of the film or the surface free energy on surface B of the film, whichever might be lower, was employed as the surface free energy of the film.

B. Water Vapor Permeability

A water vapor permeability measuring instrument (Model "Permatran" (registered trademark) W3/31) produced by Mocon, USA was used to measure under conditions of 40° C. temperature and 90% RH on the basis of method B (infrared sensor method) described in JIS K 7129 (2000 edition). For the measurement, two specimens were cut out of a film and measured once each, and the arithmetic mean value of the two measured values was calculated as the water vapor permeability value of the film.

C. Stress at 100% Elongation and Initial Elastic Modulus in an Environment of 80° C.

Five rectangular samples with a size of 150 mm in the machine direction and 10 mm in the transverse direction were cut out of a film. The five samples were tensile-tested in the longitudinal direction of each sample using a tensile testing machine ("Tensilon UCT-100" produced by Orientec Co., Ltd.) at an initial tension inter-chuck distance of 50 mm at a stress rate of 300 mm/min. For the measurement, each sample was set in a thermostatic oven set at 80° C. beforehand and preheated for 30 seconds, then being tensile-tested. The load acting on the film when the sample was elongated to 100% (when the inter-chuck distance became 100 mm) was read, and the load was divided by the sectional area of the sample obtained before the test. The quotient was employed as the stress at 100% elongation (F100 value). Further, the initial elastic modulus was obtained according to the method specified in ASTM-D882 (1997 edition). Meanwhile, the sectional area of the sample before the test can be obtained by multiplying the thickness of the sample by the short side length 10 mm of the sample.

In succession, five rectangular samples with a size of 150 mm in the transverse direction and 10 mm in the machine direction were cut out of the film and similarly tensile-tested, for obtaining the stress at 100% elongation and the initial elastic modulus.

The arithmetic mean values of the respectively ten measured values obtained for the stress at 100% elongation and the initial elastic modulus were calculated as the stress at 100% elongation and the initial elastic modulus of the film in an environment of 80° C.

D. Stress at 100% Elongation and Initial Elastic Modulus in an Environment of 23° C.

Five rectangular samples with a size of 150 mm in the machine direction and 10 mm in the transverse direction were cut out of a film. The five samples were tensile-tested in the machine direction of each sample using an Instron type tensile testing machine (automatic film strength elongation measuring instrument "Tensilon AMF/RTA-100" produced by Orientec Co., Ltd.) at an initial tension inter-chuck distance of 100 mm and a stress rate of 300 mm/min. The measurement was performed in an environment of 23° C. temperature and 65% RH. The load acting on the film when the sample was elongated to 100% (when the inter-chuck distance became 200 mm) was read, and the load was divided by the sectional area of the sample obtained before the test. The quotient was employed as the stress at 100% elongation (F100 value). Further, the initial elastic modulus was obtained according to the method specified in ASTM-D882 (1997 edition). Meanwhile, the sectional area of the sample before the test can be obtained by multiplying the thickness of the sample by the short side length 10 mm of the sample.

In succession, five rectangular samples with a size of 150 mm in the transverse direction and 10 mm in the machine direction were cut out of the film and similarly tensile-tested for obtaining the stress at 100% elongation and the initial elastic modulus.

The arithmetic mean values of the respectively ten measured values obtained for the stress at 100% elongation and the initial elastic modulus were calculated as the stress at 100% elongation and the initial elastic modulus of the film in an environment of 23° C.

E. Yellowing Factor after an Ultraviolet Light Irradiation Test for 24 Hours (JIS K-7105-1981)

At first, before the ultraviolet light irradiation test, a spectral color difference meter (SE-2000 produced by Nippon Denshoku Industries Co., Ltd.) was used to measure the tristimulus values of the color of the film in the transmission mode according to JIS Z-8722 cited in JIS K-7105-1981, and the yellowing factor YI was obtained according to JIS K-7105-1981 as the initial yellowness $YI_0$.

Then, an ultraviolet deterioration acceleration tester, Eye-Super UV tester SUV-W131 (produced by Iwasaki Electric Co., Ltd.) was used to perform an ultraviolet light irradiation test for 24 hours under a condition of light 24 hours (illuminance 100 mW/cm$^2$, temperature and humidity 60° C. and 50% RH).

Subsequently, the tristimulus values of the color of the film irradiated with ultraviolet light for 24 hours was measured using a spectral color difference meter (SE-2000 produced by Nippon Denshoku Industries Co., Ltd.) in the transmission mode according to JIS Z-8722 cited in JIS K-7105-1981, and the post-test yellowness YI was obtained.

Then, according to JIS K-7105-1981, the yellowing factor $\Delta YI$ was obtained from the initial yellowness $YI_0$ and the post-test yellowness YI.

Meanwhile, for a sample with a transmittance of 25% or less, the measurement was performed in the reflection mode, and the yellowing factor $\Delta YI$ was obtained from the initial yellowness $YI_0$ and the post-test yellowness YI.

F. Partial Discharge Voltage

A partial discharge tester, KPD2050 (produced by Kikusui Electronics Corporation) was used to obtain the partial discharge voltage of a film. The test conditions were as follows.

To distinguish both the surfaces of a film, one of the film surfaces is called surface A, and the other surface is called surface B.

As the output voltage application patterns on the output sheet, selected were three patterns: a pattern of first stage in which the voltage was simply raised from 0 V to a predetermined test voltage, a pattern of second stage in which the predetermined test voltage was maintained, and a pattern of third stage in which the voltage was simply lowered from the predetermined test voltage to 0 V.

The frequency was set at 50 Hz, and the test voltage was set at 1 kV.

The time T1 for the first stage was set at 10 sec, the time T2 for the second stage, at 2 sec, and the time T3 for the third stage, at 10 sec.

The counting method on the pulse count sheet was set at "+" (plus), and the detection level, at 50%.

The charge quantity on the range sheet was set at range 1000 pc.

The check box of the voltage on the protection sheet was checked, and 2 kV was inputted. The pulse count was set at 100000.

The initiation voltage on the measurement mode sheet was set at 1.0 pc, and the extinction voltage, at 1.0 pc.

Meanwhile, for the measurement, a test sample that had been allowed to stand overnight indoors at 23° C. and at 65% RH was used, and measurement was performed at arbitrary 10 places within the film surface. Further, this measurement was performed with the surface A side on the top electrode side and with the surface B side on the top electrode side respectively. Either of the mean values of the respective cases, whichever might be higher, was employed as the partial discharge voltage V0.

Further, the partial discharge voltage V1 after wet heat treatment was measured after it was treated by a pressure cooker produced by Tabai Especk K.K. at 125° C., at 100% humidity and at 2.5 atm for 24 hours. Meanwhile, after completion of the treatment, the test sample was taken out of the pressure cooker and allowed to stand overnight indoors at 23° C. and at 65% RH, and the measurement was performed at arbitrary 10 places within the film surface. The abovementioned measurement was performed with the surface A side on the top electrode side and with the surface B side on the top electrode side respectively, and either of the mean values of the respective cases, whichever might be higher, was employed as the partial discharge voltage V1.

Furthermore, the partial discharge voltage V2 after an ultraviolet light resistance test was measured after performing an ultraviolet light irradiation test using an ultraviolet deterioration acceleration tester, Eye-Super UV tester SUV-W131 (produced by Iwasaki Electric Co., Ltd.) for 4 hours under a condition of light 24 hours (illuminance 100 mW/cm$^2$, temperature and humidity 60° C. and 50% RH). Meanwhile, after completion of the treatment, the test sample was taken out of the ultraviolet deterioration acceleration tester and allowed to stand overnight indoors at 23° C. and at 65% RH, and the measurement was performed at arbitrary 10 places within the film surface. The abovementioned measurement was performed with the surface A side on the top electrode side and with the surface B side on the top electrode side, respectively, and either of the mean values of the respective cases, whichever might be higher, was employed as the partial discharge voltage V2.

G. Light Transmittance and Haze

A haze meter, NDH-5000 (produced by Nippon Denshoku Industries Co., Ltd.) was used to measure the total light transmittance and the haze in the thickness direction of a film respectively as the light transmittance and the haze of the film. Meanwhile, the measurement was performed at arbitrary 10 places in the film, and the abovementioned measurement was performed with the surface A side on the light source side and with the surface B side on the light source side, respectively. Either of the mean values of the respective cases for transmittance, whichever might be higher, was employed as the transmittance, and the mean value of haze values corresponding to the employed case was employed as the haze.

H. Specific Gravity

Five square samples with a side length of 5 cm were cut out of a film, and the specific gravity values of the respective samples were measured using an electronic specific gravity meter, SD-120L (produced by Mirage Boeki K.K.) on the basis of JIS K 7112-1980. The arithmetic mean value of five measured values was calculated as the specific gravity of the film.

I. Coating Appearance

The light reflected from a film having a light diffusion layer formed thereon was visually observed under a fluorescent lamp, to confirm cissing portions, and the portions were painted over with a marker. Then, the area of the painted portions was obtained, and the rate of the area of the painted portions to the total area of the film (%) was obtained.

Rate of painted area is 1% or less . . . . S
Rate of painted area is more than 1% to less than 1.5% . . . . A
Rate of painted area is more than 1.5% to less than 2.0% . . . . B
Rate of painted area is 2% or more . . . . C
S, A or B is good, and S is the best.

J. Luminance

A film obtained in an example or a comparative example was placed on the diffusion plate of a direct type backlight with a size of 20 inches (the backlight consisted of a housing, CCFLs, diffusion plate and reflection plate; 16 CCFLs with a diameter of 3 mm were installed at 2.5 cm intervals; the distance between the diffusion plate (RM401 produced by Sumitomo Chemical Co., Ltd.) and the CCFLs was 1 cm; the reflection plate was E6ZV (produced by Toray Industries, Inc.) with a thickness of 300 μm), and two light diffusion films, TDF187 (produced by Toray Saehan Inc.) were overlaid on the film (constitution A). Then, a voltage of 12 V was applied to light on the CCFLs, for establishing a surface light source. Fifty minutes later, EYESCALE-3 (produced by I System Corporation) was used to measure the luminance values ($cd/m^2$), with the accessory CCD camera installed at a place of 90 cm from the surface of the backlight, to face the backlight surface.

Meanwhile, as the luminance, the luminance values at the positions of 8 CCFLs (8 positions in total) and the luminance values at the central positions between the respective 8 CCFLs (seven positions in total) were measured on the line passing through the central portion of the backlight in the direction perpendicular to the longitudinal direction of the CCFLs. The mean value of the luminance values at the positions of CCFLs is expressed as $L_{max}$, and the mean value of the luminance values at the central positions between the CCFLs is expressed as $L_{min}$. The obtained $L_{max}$ and $L_{min}$ were used to obtain the average luminance $L_{ave}$ from the following formula (1) and the luminance irregularity ΔL from the following formula (2):

$$\text{Average luminance } L_{ave}=(L_{max}+L_{min})/2 \quad (1)$$

$$\text{Luminance irregularity } \Delta L=L_{max}-L_{min} \quad (2).$$

Then, the film and one diffusion film were replaced in position (constitution B), and the average luminance $L_{ave}$ and the luminance irregularity ΔL were obtained similarly.

$L_{ave}$ is 8600 $cd/m^2$ or more .... S
$L_{ave}$ is 8400 $cd/m^2$ to less than 8600 $cd/m^2$ ... A
$L_{ave}$ is 8200 $cd/m^2$ to less than 8400 $cd/m^2$ ... B
$L_{ave}$ is 8000 $cd/m^2$ to less than 8200 $cd/m^2$ ... C
$L_{ave}$ is 8000 $cd/m^2$ or less ... D
S, A, B or C is good, and S is the best.
ΔL is 100 $cd/m^2$ or less ... S
ΔL is more than 100 $cd/m^2$ to 125 $cd/m^2$ ... A
ΔL is more than 125 $cd/m^2$ to 150 $cd/m^2$ ... B
ΔL is more than 150 $cd/m^2$ ... C
S, A or B is good, and S is the best.

K. Adhesive Strength (Peel Strength)

The adhesive strength between the first layer and the second layer of a sample was measured using a tensile tester produced by Daiei Kagaku Seiki Mfg. Co., Ltd. at a speed of 200 mm/min with the peel angle held at 90° according to JIS K 6854-1994. From the measured data of the peel length (mm) and the peel load (N), the optimum load straight line was derived by the optimum straight line method, for obtaining 90° peel strength.

Meanwhile, the abovementioned measurement was performed for both the cases of peeling from the first layer side and peeling from the second layer side, and a higher value of the two cases was employed as the adhesive strength.

Adhesive strength is 4 N/15 mm or more ... S
Adhesive strength is 2.5 N/15 mm to less than 4 N/15 mm ... A
Adhesive strength is 1 N/15 mm to less than 2.5 N/15 mm ... B
Adhesive strength is less than 1 N/15 mm ... C
S, A or B is good, and S is the best.

EXAMPLES

This disclosure is explained below in reference to examples, but is not limited thereto or thereby.

Raw Materials
Aromatic Polyester Resin (A)
A-1 (PET):

Terephthalic acid was used as an aromatic dicarboxylic acid component, and ethylene glycol, as a diol component. Antimony trioxide (polymerization catalyst) was added to ensure that the amount of antimony atoms could be 300 ppm based on the amount of the obtained polyester pellets, and polycondensation reaction was performed, to obtain pellets of polyethylene terephthalate (PET) with a glass transition temperature of 80° C. and a melting point of 255° C.

Non-Acid-Denaturated Polyolefin Resin (b1)
b1-1 (Homo-Polypropylene):

Primeporypro "F-704NP" (produced by Prime Polymer Co., Ltd., MFR 7 g/10 min, 80° C. dynamic elastic modulus 200 MPa) was used.

b1-2 (PMP):

TPX "DX820" (produced by Mitsui Chemicals, Inc., MFR 180 g/10 min, 80° C. dynamic elastic modulus 140 MPa) was used.

b1-3 (Soft PMP):

TPX "T3725" (produced by Mitsui Chemicals, Inc., MFR 25 g/10 min, 80° C. dynamic elastic modulus 20 MPa) was used.

Acid-Denaturated Polyolefin Resin (b2)
b2-1 (Maleic Anhydride-Denaturated Polypropylene):

Yumex "1001" (produced by Sanyo Chemical Industries, Ltd., acid value 26) was used.

b2-2 (Maleic Anhydride-Denaturated Polypropylene):

Yumex "1010" (produced by Sanyo Chemical Industries, Ltd., acid value 52) was used.

b2-3 (Maleic Anhydride-Denaturated Polypropylene):

Polybond "3002" (produced by Shiraishi Calcium Kaisha, Ltd., acid value 1) was used.

b2-4 (Acrylic acid-denaturated polypropylene):

Polybond "1002" (produced by Shiraishi Calcium Kaisha, Ltd., acid value 21) was used.

b2-5 (Maleic anhydride-denaturated PMP):

TPX "MM-101B" (produced by Mitsui Chemicals, Inc., acid value 6) was used.

Examples 1 to 68

In each example, a mixture consisting of the raw materials shown in Table 1 was dried at a temperature of 140° C. in vacuum for 8 hours, supplied into an extruder, melt-extruded at a temperature of 280° C., filtered by a 30 μm-cut filter, and introduced into a T die.

Then, the mixture was extruded from the T die as a molten single-layer sheet, and the molten single-layer sheet was brought into contact with a drum with the surface temperature kept at 20° C. by electrostatic application, to be cooled and solidified, for obtaining a non-oriented (unstretched) single-layer film. In succession, the unstretched single-layer film was preheated by rolls heated to a temperature of 90° C., subsequently stretched in the machine direction (longitudinal direction) using heated rolls with a temperature of 95° C. by inter-roll stretching at the ratio shown in Table 2, and cooled by rolls with a temperature of 25° C., to obtain a monoaxially oriented (monoaxially stretched) film.

The obtained monoaxially oriented (monoaxially stretched) film was held at both the edges by clips, while it was introduced into a preheating zone with a temperature of 95° C. in a tenter, and in succession continuously stretched in a heating zone with a temperature of 105° C. in the direction (transverse direction) perpendicular to the machine direction by pulling-stretching at the ratio shown in Table 2. Further, in succession, the film was heat-treated in a heat treatment zone in the tenter at 230° C. for 20 seconds, and relaxed in the transverse direction by 4% at a temperature of 200° C., subsequently further relaxed in the transverse direction by 1% at a temperature of 140° C. Then, it was uniformly and slowly cooled, and then wound, to produce one each biaxially oriented (biaxially stretched) polyester film with a thickness of 30 µm or 50 µm. As shown in Table 2, inside the film (that is, inside the polyester layer (W layer)), the incompatible component (B) existed as numerous dispersion pieces with a flatness of 10 or higher. The respective properties of the polyester film are shown in Table 3. The films show excellent properties as shown in Table 3.

Meanwhile, only when the water vapor permeability was measured, a sample with a film thickness of 30 µm was used, and the other properties were measured using a sample with a film thickness of 50 µm (this applies also to the other examples and Comparative Examples 1 to 9).

Further, the measured luminance values of the films of Examples 9, 14, 24, 30, 43, 49, 55, 63 and 66 are shown in Table 4. It can be seen that the films are excellent in luminance and that especially in the case where any of our films are installed directly on the diffusion plate, a surface light source with the highest luminance and excellent balance can be obtained.

Examples 9-2, 14-2, 24-2, 30-2, 43-2, 49-2, 55-2, 63-2 and 66-2

Any of the mixtures consisting of the same raw materials as those of Examples 9, 14, 24, 30, 43, 49, 55, 63 and 66 was dried at a temperature of 140° C. in vacuum for 8 hours and subsequently supplied into a main extruder. A subsidiary extruder was used separately from the main extruder, and pellets of PET (melting point TA: 255° C.) were supplied into the subsidiary extruder. Then, the components supplied into the main extruder and the components supplied into the subsidiary extruder were combined in such a manner that the inner component layer coming from the main extruder could be kept between both surface component layers coming from the subsidiary extruder at a thickness ratio of one surface component layer of the subsidiary extruder:the inner component layer of the main extruder:the other surface component layer of the subsidiary extruder=1:8:1, that is, at a ratio of the thickness of the W layer/the sum of the thicknesses of the other layers than the W layer=4/1, when a molten three-layer laminate was co-extruded from the T die, to form a laminate sheet. The laminate sheet was then brought into contact with a drum with the surface temperature kept at 20° C. by electrostatic application, to be cooled and solidified, for obtaining a non-oriented (unstretched) laminate sheet.

The obtained unstretched sheet was used to prepare two biaxially oriented polyester films different in thickness by the same method as described in Example 1. One of them was a biaxially oriented polyester film with an inner layer (polyester layer (W layer)) thickness of 30 µm and an entire film thickness of 37.5 µm, and the other was a biaxially oriented polyester film with an inner layer (polyester layer (W layer)) thickness of 50 µm and an entire film thickness of 62.5 µm.

The inside mode of the polyester layers (W layers) of the obtained films was the same as the mode of Examples 9, 14, 24, 30, 43, 49, 55, 63 and 66, and the incompatible component (B) existed as many dispersion pieces with a flatness of 10 or higher. The respective properties of the polyester films are shown in Table 3. The films of these examples were equivalent to the comparative examples in surface free energy but were excellent in the other properties as shown in Table 3.

Examples 9-3, 14-3, 24-3, 30-3, 43-3, 49-3, 55-3, 63-3 and 66-3

Two biaxially oriented polyester films different in thickness were produced in each example according to the same method as described in Examples 9-2, 14-2, 24-2, 30-2, 43-2, 49-2, 55-2, 63-2 and 66-2, except that the components supplied to the main extruder and the components supplied to the subsidiary extruder were combined to ensure that the component layer of the subsidiary extruder could be formed on one surface of the component layer of the main extruder at a thickness ratio of the component layer of the subsidiary extruder:the component layer of the main extruder=1:9, that is, at a ratio of the thickness of the W layer/the thicknesses of the other layer than the W layer=1/9, and that a molten two-layer laminate was co-extruded from the T die. One of the films was a biaxially oriented (biaxially stretched) polyester film with a polyester layer (W layer) thickness of 30 µm and an entire film thickness of 33.3 µm, and the other was a biaxially oriented (biaxially stretched) polyester film with a polyester layer (W layer) thickness of 50 µm and an entire film thickness of 55.6 µm. The inside mode of the polyester layers (W layers) of the obtained films was the same as the mode of Examples 9, 14, 24, 30, 43, 49, 55, 63 and 66, and the incompatible component (B) existed as many dispersion pieces with a flatness of 10 or higher. The respective properties of the polyester films are shown in Table 3. The films of these examples were excellent in properties.

Examples 9-4, 14-4, 24-4, 30-4, 43-4, 49-4, 55-4, 63-4 and 66-4

Two biaxially oriented polyester films different in thickness were produced in each example according to the same method as in Examples 9-3, 14-3, 24-3, 30-3, 43-3, 49-3, 55-3, 63-3 and 66-3, except that rutile titanium oxide with an average particle size of 0.23 µm was added as inorganic particles as a raw material for the polyester layer (W layer) by 14 wt % based on the weight of the polyester layer (W layer). One of the films was a biaxially oriented (biaxially stretched) polyester film with a polyester layer (W layer) thickness of 30 µm and an entire film thickness of 33.3 µm, and the other is a biaxially oriented (biaxially stretched) polyester film with a polyester layer (W layer) thickness of 50 µm and an entire film thickness of 55.6 µm. The inside mode of the polyester layers (W layers) of the obtained films was the same as the mode of Examples 9, 14, 24, 30, 43, 49, 55, 63 and 66, and the incompatible component (B) existed as many dispersion pieces with a flatness of 10 or higher. The respective properties of the polyester films are shown in Table 3. The films of these examples were low in transmittance but were excellent in the other properties. Especially it can be seen that the polyester films had high partial discharge voltages even after UV irradiation compared with Examples 9-13, 14-3, 24-3, 30-3, 43-3, 49-3, 55-3, 63-3 and 66-3.

Examples 9-5, 14-5, 24-5, 30-5, 43-5, 49-5, 55-5, 63-5 and 66-5

The biaxially oriented polyester films obtained in Examples 9-2, 14-2, 24-2, 30-2, 43-2, 49-2, 55-2, 63-2 and 66-2 were used as base films, and the respective base films were corona-treated on one side. Then, the corona-treated surfaces were coated with a coating material prepared by the following method, using a meter bar (#20).

After completion of coating, the films were dried at 100° C. for 30 minutes, and heat-treated at 150° C. for 10 seconds, to form a light diffusion layer with a dry thickness of 15 μm on the polyester films. No visual irregularity could be confirmed on the obtained light diffusion layers, and they were found good.

The luminance values of the obtained films were measured, and the results are shown in Table 4. Compared with Examples 9, 14, 24, 30, 43, 49, 55, 63 and 66 in which no light diffusion layer was formed, the films were excellent in luminance and luminance irregularity. Especially when any of the films of these examples was installed directly on the diffusion plate in such a manner that the side not having the light diffusion layer was made to face the diffusion plate, it was found a surface light source with the highest luminance and excellent balance could be obtained.

Preparation of the Coating Material

Sixty five parts by weight of "Aronix" (registered trademark) M6050 (produced by Toagosei Co., Ltd.) and 5 parts by weight of "Aronix" (registered trademark) M5700 (produced by Toagosei Co., Ltd.) as binder resins, 30 parts by weight of "Chemisnow" (registered trademark) MX-1500 (produced by Soken Chemical & Engineering Co., Ltd.) as fine particles, 0.5 part by weight of "Malialim" (registered trademark) AKM-0531 (produced by NOF Corporation) as a dispersing agent, 0.5 part by weight of "Kayaester" (registered trademark) AN (produced by Kayaku Akzo Corporation) as a thermal polymerization initiator, and 200 parts by weight of cyclohexanone/methyl ethyl ketone=1/1 (ratio by weight) solution as a solvent were mixed and stirred to prepare a coating material with fine particles dispersed therein.

Examples 9-6, 14-6, 24-6, 30-6, 43-6, 49-6, 55-6, 63-6 and 66-6

Light diffusion layers were formed as described in Examples 9-5, 14-5, 24-5, 30-5, 43-5, 49-5, 55-5, 63-5 and 66-5, except that the polyester films obtained in Examples 9, 14, 24, 30, 43, 49, 55, 63 and 66 were used as base materials. It was confirmed that the obtained light diffusion layers partially repelled the coating.

The luminance values of the obtained films were measured, and the results are shown in Table 4. The films were excellent in luminance and luminance irregularity compared with Examples 9, 14, 24, 30, 43, 49, 55, 63 and 66 in which no light diffusion layer was formed. Especially when any of the films of these examples was installed directly on the diffusion plate in such a manner that the side not having the light diffusion layer was made to face the diffusion plate, it was found that a surface light source with the highest luminance and excellent balance could be obtained.

Examples 9-7, 14-7, 24-7, 30-7, 43-7, 49-7, 55-7, 63-7 and 66-7

Light diffusion layers were formed as described in Examples 9-5, 14-5, 24-5, 30-5, 43-5, 49-5, 55-5, 63-5 and 66-5, except that the polyester films obtained in Examples 9-3, 14-3, 24-3, 30-3, 43-3, 49-3, 55-3, 63-3 and 66-3 were used as base materials. It was confirmed that the obtained light diffusion layers partially repelled the coating in the case where each of the light diffusion layers was formed on the side of the polyester layer (W layer). However, in the case where each of the light diffusion layers was formed on the side of the PET layer not containing any olefin (P layer), no visual irregularity could be confirmed on the obtained light diffusion layers, and they were found good.

The luminance values of the films respectively having a light diffusion layer formed on the P layer side were measured, and the results are shown in Table 4. The films were excellent in luminance and luminance irregularity compared with Examples 9, 14, 24, 30, 43, 49, 55, 63 and 66 in which no light diffusion layer was formed. Especially when any of our films were installed directly on the diffusion plate in such a manner that the side not having the light diffusion layer was made to face the diffusion plate, it was found that a surface light source with the highest luminance and excellent balance could be obtained.

Examples 9-8, 14-8, 24-8 and 30-8

In each example, the film of Example 9, 14, 24 or 30 was used as the first layer, and as an adhesive layer, a coating material obtained by mixing 90 parts by weight of "Takelac" (registered trademark) A310 (produced by Mitsui Takeda Chemical K.K.) and 10 parts by weight of "Takenate" (registered trademark) A3 (produced by Mitsui Takeda Chemical K.K.) was applied to one side of the base film, to have a dry thickness of 5 μm. Onto the coated film, a biaxially oriented polyester film with a thickness of 125 μm, "Lumirror" (registered trademark) S10 (produced by Toray Industries, Inc.) was stuck as a second layer.

Then, on the second layer, the abovementioned adhesive layer was formed, and Barrier-Locks "HGTS" with a thickness of 12 μm (produced by Toray Advanced Film Co., Ltd.) as a third layer was stuck in such a manner that the vapor deposition layer could be installed on the side opposite to the surface side of the second layer, for forming a backsheet with a thickness of 188 μm (constitution 1). Further, according to the same method except that the first layer and the second layer were replaced by each other, a backsheet (constitution 2) was formed.

The adhesive strengths and the partial discharge voltages of the backsheets obtained were measured, and the results are shown in Table 5. All the backsheets had high partial discharge voltages, and it was found that the constitution in which the film was used as the first layer (constitution 1) was higher in partial discharge voltage.

Examples 9-9, 14-9, 24-9 and 30-9

Backsheets were formed by the same method as in Examples 9-8, 14-8, 24-8 and 30-8 except that any of the films of Examples 9-2, 14-2, 24-2 and 30-2 was used as the first layer or the second layer.

The adhesive strengths and the partial discharge voltages of the obtained backsheets were measured and the results are shown in Table 5. The respective backsheets had high partial discharge voltages though lower than those of Examples 9-8, 14-8, 24-8 and 30-8, and were excellent in adhesion.

Examples 9-10, 14-10, 24-10 and 30-10

Backsheets were formed by the same method as in Examples 9-8, 14-8, 24-8 and 30-8 except that any of the films of Examples 9-3, 14-3, 24-3 and 30-3 was used as the first layer or the second layer.

Meanwhile, in the case where the film was used as the first layer, both the constitution in which the film was stuck in such a manner that the polyester layer (W layer) side could be outside (on the other side of the second layer) (constitution 1) and the constitution in which the film was stuck in such a manner that the polyester layer (W layer) side could be inside (to face the second layer) (constitution 1-2) were tested.

Further, in the case where the film was used as the second layer, both the constitution in which the film was stuck in such a manner that the polyester layer (W layer) side could face the first layer (constitution 2) and the constitution in which the polyester layer (W layer) side could face the third layer (constitution 2-2) were tested.

The adhesive strengths and the partial discharge voltages of the obtained backsheets were measured, and the results are shown in Table 5. All the backsheets had higher partial discharge voltages than those of Examples 9-8, 14-8, 24-8 and 30-8 and were excellent in adhesion.

Examples 9-11, 14-11, 24-11 and 30-11

Backsheets were formed by the same method as in Examples 9-10, 14-10, 24-10 and 30-10 except that any of the films of Examples 9-4, 14-4, 24-4 and 30-4 was used as the first layer or the second layer.

The adhesive strengths and the partial discharge voltages of the obtained backsheets were measured, and the results are shown in Table 5. Especially the constitution 1 was high in partial discharge voltage and was found to be more excellent in the partial discharge voltage after UV irradiation than Examples 9-10, 14-10, 24-10 and 30-10.

Comparative Example 1

A mixture consisting of the raw materials shown in Table 1 was dried at a temperature of 140° C. in vacuum for 8 hours, subsequently supplied into an extruder, melt-extruded at a temperature of 280° C., filtered using a 30 μm-cut filter, and introduced into a T die.

Then, from the T die, it was extruded as a molten single-layer sheet, and the molten single-layer sheet was brought into contact with a drum with the surface temperature kept at 20° C. by electrostatic application, to be cooled and solidified, for obtaining one each non-oriented (unstretched) single-layer film with a thickness of 30 μm or 50 μm.

As shown in Table 2, the incompatible component (B) did not exist as dispersion pieces with a flatness of 10 or higher inside the film. The respective properties of the polyester films are shown in Table 3. Generally the polyester films were inferior to the polyester films of our examples.

Comparative Examples, 2, 3, 3-2, 3-3 and 10

In each comparative example, a mixture consisting of the raw materials shown in Table 1 was used to produce two biaxially oriented polyester films different in thickness by the same method as described in Example 1. In each of Comparative Examples 2, 3 and 10, a film with a film thickness of 30 μm and a stretched film with a film thickness of 50 μm were produced. Further, in Comparative Example 3-2, a film with an inner layer (polyester layer (W layer)) thickness of 30 μm and an entire film thickness of 37.5 μm and a film with an inner layer (polyester layer (W layer)) thickness of 50 μm and an entire film thickness of 62.5 μm were produced. Furthermore in Comparative Example 3-3, a film with a polyester layer (W layer) thickness of 30 μm and an entire film thickness of 33.3 μm and a film with a polyester layer (W layer) thickness of 50 μm and an entire film thickness of 55.6 μm were produced.

As shown in Table 2, the incompatible component (B) did not exist as dispersion pieces with a flatness of 10 or higher inside the film. (In Comparative Example 3, the dispersion pieces per se did not exist.) The respective properties of the polyester films are shown in Table 3, and the polyester films were generally inferior to those of our examples. Moreover, luminance values were measured, and the results are shown in Table 4. The films of the comparative examples were inferior to those of the examples of our films in luminance and luminance irregularity.

Comparative Example 4

A mixture consisting of the raw materials shown in Table 1 was used to produce one each polyester film with a thickness of 30 μm or 50 μm by the same method as described in Example 1.

As shown in Table 2, the incompatible component (B) existed as dispersion pieces with a flatness of 10 or higher inside the film, but the volume occupancy of the dispersion pieces of the incompatible component (B) in the polyester layer (W layer) was as low as 2.3 vol %, and the respective properties were generally inferior to those of our examples as shown in Table 3.

Comparative Example 5

A mixture consisting of the raw materials shown in Table 1 was used to produce one each polyester film with a thickness of 30 μm or 50 μm by the same method as described in Example 1. As shown in Table 2, the incompatible component (B) existed as dispersion pieces with a flatness of 10 or higher inside the film, but since the content of the acid-denaturated polyolefin (b2) was small as 1.01 parts by weight per 100 parts by weight of the non-acid-denaturated polyolefin resin (b1), the film contained a large amount of voids therein. Further, the respective properties were generally inferior to those of our examples as shown in Table 3.

Comparative Example 6

A mixture consisting of the raw materials shown in Table 1 was used with an intention to produce a polyester film by the same method as described in Example 1, but the film was frequently broken in the stretching step, not be able to be obtained as an intended product.

Therefore, the unstretched single-layer film obtained before stretching was used to measure the volume occupancy of the dispersion pieces of the incompatible component (B) and the volume occupancy of voids, and it was found that the volume occupancy of the dispersion pieces of the incompatible component (B) was more than 50 vol % as shown in Table 2.

Comparative Example 7

A mixture consisting of the raw materials shown in Table 1 was used with an intention to produce a polyester film by the same method as described in Example 1, but since the content of the acid-denaturated polyolefin (b2) was as large as 47.06 parts by weight per 100 parts by weight of the non-acid-denaturated polyolefin resin (b1), the film could not be uniformly stretched in the machine direction in the longitudinal stretching step, and the film became remarkably irregular in thickness (the ratio of the maximum thickness of the film to the minimum thickness is 2 or more). It was attempted to stretch the monoaxially oriented (monoaxially stretched) film in the transverse direction (lateral direction) by the same method as described in Example 1, but the film was frequently broken and could not be obtained as an intended product.

Comparative Example 8

A mixture consisting of the raw materials shown in Table 1 was used with an intention to produce a polyester film by the same method as described in Example 1, but since it contained the acid-denaturated polyolefin resin (b2) only and did not contain the non-acid-denaturated polyolefin resin (b1), the pressure immediately before the filter (filtration pressure) varied intermittently (the ratio of the maximum filtration pressure to the minimum filtration pressure was 2 or more) in the extrusion step, not allowing uniform extrusion, and the unstretched sheet became very irregular in thickness (the ratio of the maximum thickness of the film to the minimum thickness was 2 or more). It was attempted to stretch the unstretched sheet by the same method as described in Example 1, but the film was broken frequently in the stretching step and could not be obtained as an intended product.

Comparative Example 9

A mixture consisting of the raw materials shown in Table 1 was used to produce one each polyester film with a thickness of 30 μm or 50 μm by the same method as described in Example 1.

Since the film did not contain the acid-denaturated polyolefin resin (b2), the dispersion pieces of the incompatible component (B) did not exist as dispersion pieces with a flatness of 10 or higher as shown in Table 2. Further, the film contained a large amount of voids therein. The respective properties of the polyester film shown in Table 3 were generally inferior to those of our examples.

Comparative Examples 1-2, 2-2 and 10-2

In each comparative example, a mixture consisting of the same raw materials as those of Comparative Example 1, 2 or 10 was dried at a temperature of 140° C. in vacuum for 8 hours and subsequently supplied into a main extruder. Further, a subsidiary extruder was used separately from the main extruder, and pellets of PET (melting point TA: 265° C.) were supplied into the subsidiary extruder. Then, the components supplied into the main extruder and the components supplied into the subsidiary extruder were combined in such a manner that the inner component layer coming from the main extruder could be kept between both the surface component layers coming from the subsidiary extruder at a thickness ratio of one surface component layer of the subsidiary extruder:the inner component layer of the main extruder:the other surface component layer of the subsidiary extruder=1:8:1, when a molten three-layer laminate was co-extruded from the T die, to form a laminate sheet. The laminate sheet was brought into contact with a drum with the surface temperature kept at 20° C. by electrostatic application, to be cooled and solidified for obtaining a non-oriented (unstretched) laminate film with a polyester layer (W layer) thickness of 30 μm or 50 μm (respectively with an entire film thickness of 37.5 μm or 62.5 μm). The mode inside the polyester layer (W layer) of the obtained film was respectively the same as the mode of Comparative Example 1, 2 or 10, and the incompatible component (B) did not exist as dispersion pieces with a flatness of 10 or higher inside the film. The respective properties of the polyester films of these comparative examples shown in Table 3 were generally inferior to those of our examples.

Further, luminance values were measured and the results are shown in Table 4. The films of the comparative examples were inferior in luminance and luminance irregularity to those of our examples.

Comparative Examples 1-3, 2-3 and 10-3

In each comparative example, a non-oriented (unstretched) laminate film with a polyester layer (W layer) thickness of 30 μm or 50 μm (respectively with an entire film thickness of 33.3 μm or 55.6 μm) was obtained by the same method as described in Comparative Example 1-2, 2-2 or 10-2, except that the components supplied into a main extruder and the components supplied into a subsidiary extruder were combined in such a manner that the component layer of the subsidiary extruder could be formed on one surface of the component layer of the main extruder at a thickness ratio of the component layer of the subsidiary extruder:the component layer of the main extruder=1:9, when a molten two-layer laminate was co-extruded from the T die. The mode inside the polyester layer (W layer) of the obtained film was the same as the mode in Comparative Example 1, 2 or 10, and the incompatible component (B) did not exist as dispersion pieces with a flatness of 10 or higher inside the film. The respective properties of the polyester films of these comparative examples shown in Table 3 were generally inferior to those of our examples.

Further, the luminance values were measured and the results are shown in Table 4. The polyester films of these comparative examples were inferior in luminance and luminance irregularity to those of our examples.

Comparative Examples 1-4, 2-4 and 10-4

In each comparative example, one each non-oriented (unstretched) laminate film with a polyester layer (W layer) thickness of 30 μm or 50 μm (respectively with an entire film thickness of 33.3 μm or 55.6 μm) was obtained by the same method as described in Comparative Example 1-4, 2-4 or 10-4, except that 14 wt % of rutile titanium oxide with an average particle size of 0.23 μm was added as inorganic particles as a raw material for the polyester layer (W layer). The mode inside the polyester layer (W layer) of the obtained film was the same as the mode of Comparative Example 1, 2 or 10, and the incompatible component (B) did not exist as dispersion pieces with a flatness of 10 or higher inside the film. The respective properties of the polyester films of these comparative examples shown in Table 3 were generally inferior to those of our examples.

Further, luminance values were measured and the results are shown in Table 4. The polyester films of these comparative examples were inferior in luminance and luminance irregularity than our examples.

Comparative Example 3-4

One each biaxially oriented (biaxially stretched) polyester film with a polyester layer (W layer) thickness of 30 μm or 50 μm (respectively with an entire film thickness of 33.3 μm or 55.6 μm) was produced by the same method as in Example 9-3, except that a mixture consisting of 84 parts by weight of PET and 14 parts by weight of titanium oxide dried at a temperature of 140° C. in vacuum for 8 hours was supplied into the main extruder. The incompatible component did not exist inside the polyester layer (W layer) of the obtained film. The respective properties of the polyester films obtained in this comparative example shown in Table 3 were generally inferior to those of our examples.

Comparative Examples 6-2 and 8-2

In each comparative example, it was attempted to form a film by the same method as described in Example 9-2, except that a mixture consisting of the same raw materials as those of Comparative Example 6 or 8 dried at a temperature of 140° C. in vacuum for 8 hours was supplied into the main extruder, but the film was frequently broken in the stretching step and could not be obtained as an intended product.

Comparative Examples 6-3 and 8-3

In each comparative example, it was attempted to form a film by the same method as in Example 9-3, except that a mixture consisting of the same raw materials as those of Comparative Example 6 or 8 dried at a temperature of 140° C. in vacuum for 8 hours was supplied into the main extruder, but the film was frequently broken in the stretching step and could not be obtained as an intended product.

Comparative Examples 6-4 and 8-4

In each comparative example, it was attempted to form a film by the same method as in Example 6-3 or 8-3, except that 14 wt % of rutile titanium oxide with an average particle size of 0.23 μm was added as inorganic particles as a raw material for the polyester layer (W layer), but the film was broken frequently in the stretching step and could not be obtained as an intended product.

Comparative Examples 1-5, 2-5, 3-5, 10-5, 1-6, 2-6, 3-6, 10-6, 1-7, 2-7, 3-7 and 10-7

Light diffusion layers were formed by the same method as that of Example 9-5, except that the polyesters obtained in Comparative Examples 1-2, 2-2, 3-2, 10-2, 1, 2, 3, 10, 1-3, 2-3 and 3-3 and respectively corona-treated were used. Since no visual irregularity was confirmed on the obtained light diffusion layers, they were good.

The luminance values of the obtained films were measured and the results are shown in Table 4. The films of these comparative examples were generally inferior to those of our examples.

Comparative Examples 1-8, 2-8, 3-8, 1-9, 2-9, 3-9, 1-10, 2-10, 3-10, 1-11, 2-11 and 3-11

Backsheets were produced by the same method as described in Example 9-8, except that the films of Comparative Examples 1, 2, 3, 1-2, 2-2, 3-2, 1-3, 2-3, 3-3, 1-4, 2-4 and 3-4 were used.

The adhesive strengths and the partial discharge voltages of the obtained backsheets were measured and the results are shown in Table 5. All the backsheets had high adhesive strengths but generally had lower partial discharge voltages than those of our examples.

TABLE 1

| | | Aromatic polyester resin (A) | | Incompatible component (B) | | | | Total content of non-acid-denaturated polyolefin resin (b1) and acid-denaturated polyolefin resin (b2) in polyester layer (W layer) (wt %) | Acid value of incompatible component (B) (KOHmg/g) |
|---|---|---|---|---|---|---|---|---|---|
| | | | | Non-acid-denaturated polyolefin resin (b1) | | Acid-denaturated polyolefin resin (b2) | | | |
| | | Resin | Content based on the weight of polyester layer (W layer) (wt %) | Resin | Content based on the weight of polyester layer (W layer) (wt %) | Resin | Content based on the weight of polyester layer (W layer) (wt %) | Content per 100 parts by weight of non-acid-denaturated polyolefin resin (b1) (wt %) | | |
| Example | 1 | A-1 | 98 | b1-1 | 1.96 | b2-1 | 0.04 | 2.04 | 2 | 0.52 |
| | 2 | A-1 | 98 | b1-1 | 1.94 | b2-1 | 0.06 | 3.09 | 2 | 0.78 |
| | 3 | A-1 | 95 | b1-1 | 4.9 | b2-1 | 0.1 | 2.04 | 5 | 0.52 |
| | 4 | A-1 | 95 | b1-1 | 4.85 | b2-1 | 0.15 | 3.09 | 5 | 0.78 |
| | 5 | A-1 | 95 | b1-1 | 4.85 | b2-2 | 0.15 | 3.09 | 5 | 1.56 |
| | 6 | A-1 | 95 | b1-1 | 4.85 | b2-3 | 0.15 | 3.09 | 5 | 0.03 |
| | 7 | A-1 | 95 | b1-1 | 4.85 | b2-4 | 0.15 | 3.09 | 5 | 0.63 |
| | 8 | A-1 | 95 | b1-1 | 4.85 | b2-1 | 0.15 | 3.09 | 5 | 0.78 |
| | 9 | A-1 | 95 | b1-1 | 4.85 | b2-1 | 0.15 | 3.09 | 5 | 0.78 |
| | 10 | A-1 | 95 | b1-1 | 4.5 | b2-1 | 0.5 | 11.11 | 5 | 2.60 |
| | 11 | A-1 | 95 | b1-1 | 4.5 | b2-1 | 0.5 | 11.11 | 5 | 2.60 |
| | 12 | A-1 | 95 | b1-1 | 3.5 | b2-1 | 1.5 | 42.86 | 5 | 7.80 |
| | 13 | A-1 | 95 | b1-1 | 3.5 | b2-1 | 1.5 | 42.86 | 5 | 7.80 |
| | 14 | A-1 | 90 | b1-1 | 9.7 | b2-1 | 0.3 | 3.09 | 10 | 0.78 |
| | 15 | A-1 | 90 | b1-1 | 9.7 | b2-1 | 0.3 | 3.09 | 10 | 0.78 |
| | 16 | A-1 | 90 | b1-1 | 9 | b2-1 | 1 | 11.11 | 10 | 2.60 |
| | 17 | A-1 | 90 | b1-1 | 9 | b2-2 | 1 | 11.11 | 10 | 5.20 |
| | 18 | A-1 | 90 | b1-1 | 9 | b2-3 | 1 | 11.11 | 10 | 0.10 |
| | 19 | A-1 | 90 | b1-1 | 9 | b2-4 | 1 | 11.11 | 10 | 2.10 |
| | 20 | A-1 | 90 | b1-1 | 9 | b2-1 | 1 | 11.11 | 10 | 2.60 |
| | 21 | A-1 | 90 | b1-1 | 7 | b2-1 | 3 | 42.86 | 10 | 7.80 |
| | 22 | A-1 | 90 | b1-1 | 7 | b2-1 | 3 | 42.86 | 10 | 7.80 |
| | 23 | A-1 | 80 | b1-1 | 19.4 | b2-1 | 0.6 | 3.09 | 20 | 0.78 |
| | 24 | A-1 | 80 | b1-1 | 19.4 | b2-1 | 0.6 | 3.09 | 20 | 0.78 |
| | 25 | A-1 | 80 | b1-1 | 18 | b2-1 | 2 | 11.11 | 20 | 2.60 |
| | 26 | A-1 | 80 | b1-1 | 18 | b2-1 | 2 | 11.11 | 20 | 2.60 |
| | 27 | A-1 | 80 | b1-1 | 14 | b2-1 | 6 | 42.86 | 20 | 7.80 |
| | 28 | A-1 | 80 | b1-1 | 14 | b2-1 | 6 | 42.86 | 20 | 7.80 |
| | 29 | A-1 | 65 | b1-1 | 33.95 | b2-1 | 1.05 | 3.09 | 35 | 0.78 |

TABLE 1-continued

| | | Aromatic polyester resin (A) | | Incompatible component (B) | | | | | |
|---|---|---|---|---|---|---|---|---|---|
| | | | | Non-acid-denaturated polyolefin resin (b1) | | Acid-denaturated polyolefin resin (b2) | | Total content of non-acid-denaturated polyolefin resin (b1) and acid-denaturated polyolefin resin (b2) in polyester layer (W layer) (wt %) | Acid value of incompatible component (B) (KOHmg/g) |
| | | Resin | Content based on the weight of polyester layer (W layer) (wt %) | Resin | Content based on the weight of polyester layer (W layer) (wt %) | Resin | Content based on the weight of polyester layer (W layer) (wt %) | Content per 100 parts by weight of non-acid-denaturated polyolefin resin (b1) (wt %) | | |
| | 30 | A-1 | 65 | b1-1 | 33.95 | b2-1 | 1.05 | 3.09 | 35 | 0.78 |
| | 31 | A-1 | 65 | b1-1 | 31.5 | b2-1 | 3.5 | 11.11 | 35 | 2.60 |
| | 32 | A-1 | 65 | b1-1 | 31.5 | b2-1 | 3.5 | 11.11 | 35 | 2.60 |
| | 33 | A-1 | 65 | b1-1 | 24.5 | b2-1 | 10.5 | 42.86 | 35 | 7.80 |
| | 34 | A-1 | 65 | b1-1 | 24.5 | b2-1 | 10.5 | 42.86 | 35 | 7.80 |
| | 35 | A-1 | 65 | b1-1 | 24.5 | b2-2 | 10.5 | 42.86 | 35 | 15.60 |
| | 36 | A-1 | 65 | b1-1 | 24.5 | b2-3 | 10.5 | 42.86 | 35 | 0.30 |
| | 37 | A-1 | 65 | b1-1 | 24.5 | b2-4 | 10.5 | 42.86 | 35 | 6.30 |
| | 38 | A-1 | 95 | b1-2 | 4.85 | b2-5 | 0.15 | 3.09 | 5 | 0.18 |
| | 39 | A-1 | 95 | b1-2 | 4.85 | b2-5 | 0.15 | 3.09 | 5 | 0.18 |
| | 40 | A-1 | 95 | b1-2 | 4.85 | b2-5 | 0.15 | 3.09 | 5 | 0.18 |
| | 41 | A-1 | 95 | b1-2 | 4.5 | b2-5 | 0.5 | 11.11 | 5 | 0.60 |
| | 42 | A-1 | 95 | b1-2 | 4.5 | b2-5 | 0.5 | 11.11 | 5 | 0.60 |
| | 43 | A-1 | 95 | b1-2 | 3.5 | b2-5 | 1.5 | 42.86 | 5 | 1.80 |
| | 44 | A-1 | 95 | b1-2 | 3.5 | b2-5 | 1.5 | 42.86 | 5 | 1.80 |
| | 45 | A-1 | 90 | b1-2 | 9.7 | b2-5 | 0.3 | 3.09 | 10 | 0.18 |
| | 46 | A-1 | 90 | b1-2 | 9.7 | b2-5 | 0.3 | 3.09 | 10 | 0.18 |
| | 47 | A-1 | 90 | b1-2 | 9 | b2-5 | 1 | 11.11 | 10 | 0.60 |
| | 48 | A-1 | 90 | b1-2 | 9 | b2-5 | 1 | 11.11 | 10 | 0.60 |
| | 49 | A-1 | 90 | b1-2 | 7 | b2-5 | 3 | 42.86 | 10 | 1.80 |
| | 50 | A-1 | 90 | b1-2 | 7 | b2-5 | 3 | 42.86 | 10 | 1.80 |
| | 51 | A-1 | 65 | b1-2 | 33.95 | b2-5 | 1.05 | 3.09 | 35 | 0.2 |
| | 52 | A-1 | 65 | b1-2 | 33.95 | b2-5 | 1.05 | 3.09 | 35 | 0.2 |
| | 53 | A-1 | 65 | b1-2 | 31.5 | b2-5 | 3.5 | 11.11 | 35 | 0.6 |
| | 54 | A-1 | 65 | b1-2 | 31.5 | b2-5 | 3.5 | 11.11 | 35 | 0.6 |
| | 55 | A-1 | 65 | b1-2 | 24.5 | b2-5 | 10.5 | 42.86 | 35 | 1.8 |
| | 56 | A-1 | 65 | b1-2 | 24.5 | b2-5 | 10.5 | 42.86 | 35 | 1.8 |
| | 57 | A-1 | 95 | — | 0 | b2-3 | 5 | — | 5 | 1.0 |
| | 58 | A-1 | 95 | — | 0 | b2-5 | 5 | — | 5 | 6.0 |
| | 59 | A-1 | 80 | b1-2 | 19.4 | b2-5 | 0.6 | 3.09 | 20 | 0.18 |
| | 60 | A-1 | 80 | b1-2 | 19.4 | b2-5 | 0.6 | 3.09 | 20 | 0.18 |
| | 61 | A-1 | 80 | b1-2 | 18 | b2-5 | 2 | 11.11 | 20 | 0.60 |
| | 62 | A-1 | 80 | b1-2 | 18 | b2-5 | 2 | 11.11 | 20 | 0.60 |
| | 63 | A-1 | 80 | b1-2 | 14 | b2-5 | 6 | 42.86 | 20 | 1.80 |
| | 64 | A-1 | 80 | b1-2 | 14 | b2-5 | 6 | 42.86 | 20 | 1.80 |
| | 65 | A-1 | 80 | b1-3 | 4.5 | b2-5 | 0.5 | 42.86 | 5 | 1.80 |
| | 66 | A-1 | 80 | b1-3 | 9 | b2-5 | 1 | 42.86 | 10 | 1.80 |
| | 67 | A-1 | 80 | b1-3 | 18 | b2-5 | 2 | 42.86 | 20 | 1.80 |
| | 68 | A-1 | 80 | b1-3 | 24.5 | b2-5 | 10.5 | 42.86 | 35 | 1.80 |
| Comparative Example | 1 | A-1 | 95 | b1-1 | 4.85 | b2-1 | 0.15 | 3.09 | 5 | 0.8 |
| | 2 | A-1 | 95 | b1-1 | 4.85 | b2-1 | 0.15 | 3.09 | 5 | 0.8 |
| | 3 | A-1 | 100 | — | 0 | — | 0 | — | 0 | 0.0 |
| | 4 | A-1 | 98.5 | b1-1 | 1.45 | b2-1 | 0.05 | 3.45 | 1.5 | 0.9 |
| | 5 | A-1 | 95 | b1-1 | 4.95 | b2-1 | 0.05 | 1.01 | 5 | 0.3 |
| | 6 | A-1 | 60 | b1-1 | 38.8 | b2-1 | 1.2 | 3.09 | 40 | 0.8 |
| | 7 | A-1 | 95 | b1-1 | 3.4 | b2-1 | 1.6 | 47.06 | 5 | 8.3 |
| | 8 | A-1 | 95 | — | 0 | b2-1 | 5 | — | 5 | 26.0 |
| | 9 | A-1 | 95 | b1-1 | 5 | — | 0 | 0.00 | 5 | 0.0 |
| | 10 | A-1 | 90 | b1-2 | 7 | — | 3 | 42.86 | 10 | 1.8 |

TABLE 2

| | | Stretching ratio | | Dispersion pieces of incompatible component (B) | | | | | voids |
|---|---|---|---|---|---|---|---|---|---|
| | | Machine direction (—) | Transverse direction (—) | Average minor axis length (nm) | Average major axis length (μm) | Flatness (—) | Volume occupancy based on the volume of polyester layer (W layer) (vol %) | Ratio of in-plane major axis length to in-plane minor axis length (—) | Volume occupancy based on the volume of polyester layer (W layer) (vol %) |
| Example | 1 | 2.5 | 2.5 | 83 | 0.94 | 11.33 | 3.1 | 1.18 | 0.0 |
| | 2 | 2.5 | 2.5 | 78 | 1.12 | 14.36 | 3.1 | 1.17 | 0.0 |

TABLE 2-continued

|  |  | Stretching ratio | | Dispersion pieces of incompatible component (B) | | | | | voids |
|---|---|---|---|---|---|---|---|---|---|
|  |  | Machine direction (—) | Transverse direction (—) | Average minor axis length (nm) | Average major axis length (μm) | Flatness (—) | Volume occupancy based on the volume of polyester layer (W layer) (vol %) | Ratio of in-plane major axis length to in-plane minor axis length (—) | Volume occupancy based on the volume of polyester layer (W layer) (vol %) |
|  | 3 | 2.5 | 2.5 | 84 | 1.00 | 11.90 | 7.6 | 1.18 | 0.0 |
|  | 4 | 2.5 | 2.5 | 82 | 1.02 | 12.44 | 7.6 | 1.17 | 0.0 |
|  | 5 | 2.5 | 2.5 | 80 | 1.03 | 12.88 | 7.6 | 1.14 | 0.0 |
|  | 6 | 2.5 | 2.5 | 80 | 1.00 | 12.50 | 7.6 | 1.23 | 0.0 |
|  | 7 | 2.5 | 2.5 | 82 | 1.04 | 12.68 | 7.6 | 1.18 | 0.0 |
|  | 8 | 3.0 | 3.0 | 62 | 1.24 | 20.00 | 7.6 | 1.17 | 0.0 |
|  | 9 | 3.5 | 3.5 | 49 | 1.81 | 36.94 | 7.5 | 1.17 | 0.1 |
|  | 10 | 3.0 | 3.0 | 50 | 1.53 | 30.60 | 7.6 | 1.11 | 0.0 |
|  | 11 | 3.5 | 3.5 | 42 | 2.27 | 54.05 | 7.6 | 1.11 | 0.0 |
|  | 12 | 3.0 | 3.0 | 49 | 1.49 | 30.41 | 7.6 | 1.08 | 0.0 |
|  | 13 | 3.5 | 3.5 | 43 | 2.27 | 52.79 | 7.6 | 1.08 | 0.0 |
|  | 14 | 3.0 | 3.0 | 93 | 1.60 | 17.20 | 14.6 | 1.17 | 0.2 |
|  | 15 | 3.5 | 3.5 | 75 | 2.42 | 32.27 | 14.6 | 1.17 | 0.3 |
|  | 16 | 3.0 | 3.0 | 74 | 2.06 | 27.84 | 14.7 | 1.11 | 0.1 |
|  | 17 | 3.0 | 3.0 | 74 | 1.96 | 26.49 | 14.7 | 1.08 | 0.0 |
|  | 18 | 3.0 | 3.0 | 78 | 2.13 | 27.31 | 14.7 | 1.22 | 0.0 |
|  | 19 | 3.0 | 3.0 | 78 | 2.10 | 26.92 | 14.7 | 1.12 | 0.0 |
|  | 20 | 3.5 | 3.5 | 60 | 3.11 | 51.83 | 14.7 | 1.11 | 0.0 |
|  | 21 | 3.0 | 3.0 | 75 | 1.96 | 26.13 | 14.7 | 1.08 | 0.0 |
|  | 22 | 3.5 | 3.5 | 63 | 3.22 | 51.11 | 14.7 | 1.08 | 0.0 |
|  | 23 | 3.0 | 3.0 | 174 | 2.43 | 13.97 | 27.7 | 1.17 | 0.5 |
|  | 24 | 3.5 | 3.5 | 138 | 3.61 | 26.16 | 27.6 | 1.17 | 0.9 |
|  | 25 | 3.0 | 3.0 | 140 | 3.07 | 21.93 | 28.0 | 1.11 | 0.1 |
|  | 26 | 3.5 | 3.5 | 116 | 4.52 | 38.97 | 27.9 | 1.11 | 0.2 |
|  | 27 | 3.0 | 3.0 | 140 | 2.99 | 21.36 | 28.0 | 1.08 | 0.0 |
|  | 28 | 3.5 | 3.5 | 115 | 4.47 | 38.87 | 27.9 | 1.08 | 0.4 |
|  | 29 | 3.0 | 3.0 | 264 | 3.19 | 12.08 | 44.7 | 1.17 | 1.7 |
|  | 30 | 3.5 | 3.5 | 213 | 4.79 | 22.49 | 44.5 | 1.17 | 2.4 |
|  | 31 | 3.0 | 3.0 | 222 | 4.05 | 18.24 | 45.3 | 1.11 | 0.5 |
|  | 32 | 3.5 | 3.5 | 176 | 6.05 | 34.38 | 45.2 | 1.11 | 0.9 |
|  | 33 | 3.0 | 3.0 | 220 | 4.12 | 18.73 | 45.4 | 1.08 | 0.5 |
|  | 34 | 3.5 | 3.5 | 174 | 5.93 | 34.08 | 45.2 | 1.08 | 0.9 |
|  | 35 | 3.5 | 3.5 | 178 | 6.24 | 35.06 | 45.2 | 1.03 | 1.1 |
|  | 36 | 3.5 | 3.5 | 178 | 6.13 | 34.44 | 45.2 | 1.18 | 1.1 |
|  | 37 | 3.5 | 3.5 | 174 | 6.10 | 35.06 | 44.9 | 1.08 | 1.5 |
|  | 38 | 2.5 | 2.5 | 86 | 0.98 | 11.40 | 8.2 | 1.24 | 0.1 |
|  | 39 | 3.0 | 3.0 | 68 | 1.09 | 16.03 | 8.1 | 1.24 | 0.1 |
|  | 40 | 3.5 | 3.5 | 57 | 1.62 | 28.42 | 8.1 | 1.24 | 0.1 |
|  | 41 | 3.0 | 3.0 | 55 | 1.37 | 24.91 | 8.2 | 1.20 | 0.0 |
|  | 42 | 3.5 | 3.5 | 44 | 2.04 | 46.36 | 8.2 | 1.20 | 0.1 |
|  | 43 | 3.0 | 3.0 | 57 | 1.38 | 24.21 | 8.2 | 1.14 | 0.0 |
|  | 44 | 3.5 | 3.5 | 44 | 2.07 | 47.05 | 8.2 | 1.14 | 0.1 |
|  | 45 | 3.0 | 3.0 | 100 | 1.46 | 14.60 | 15.5 | 1.24 | 0.5 |
|  | 46 | 3.5 | 3.5 | 86 | 2.17 | 25.23 | 15.4 | 1.24 | 0.6 |
|  | 47 | 3.0 | 3.0 | 84 | 1.79 | 21.31 | 15.6 | 1.20 | 0.3 |
|  | 48 | 3.5 | 3.5 | 69 | 2.83 | 41.01 | 15.6 | 1.20 | 0.4 |
|  | 49 | 3.0 | 3.0 | 86 | 1.81 | 21.05 | 15.6 | 1.14 | 0.3 |
|  | 50 | 3.5 | 3.5 | 67 | 2.76 | 41.19 | 15.6 | 1.14 | 0.4 |
|  | 51 | 3.0 | 3.0 | 288 | 3.04 | 10.56 | 46.0 | 1.24 | 2.4 |
|  | 52 | 3.5 | 3.5 | 232 | 4.31 | 18.58 | 45.8 | 1.24 | 2.7 |
|  | 53 | 3.0 | 3.0 | 241 | 3.66 | 15.19 | 46.4 | 1.20 | 1.9 |
|  | 54 | 3.5 | 3.5 | 193 | 5.45 | 28.24 | 46.2 | 1.20 | 2.3 |
|  | 55 | 3.0 | 3.0 | 244 | 3.62 | 14.84 | 46.4 | 1.14 | 1.4 |
|  | 56 | 3.5 | 3.5 | 196 | 5.44 | 27.76 | 46.2 | 1.14 | 1.7 |
|  | 57 | 2.5 | 2.5 | 73.57 | 1.63 | 22.10 | 7.6 | 1.16 | 0.0 |
|  | 58 | 2.5 | 2.5 | 57.14 | 2.46 | 43.13 | 8.2 | 1.10 | 0.0 |
|  | 59 | 3.0 | 3.0 | 207.43 | 2.36 | 11.39 | 32.9 | 1.24 | 1.6 |
|  | 60 | 3.5 | 3.5 | 169.43 | 3.39 | 20.03 | 32.8 | 1.24 | 1.8 |
|  | 61 | 3.0 | 3.0 | 173.71 | 2.86 | 16.46 | 12.4 | 1.20 | 0.2 |
|  | 62 | 3.5 | 3.5 | 139.86 | 4.33 | 30.94 | 12.4 | 1.20 | 0.3 |
|  | 63 | 3.0 | 3.0 | 176.29 | 2.84 | 16.13 | 32.9 | 1.14 | 1.6 |
|  | 64 | 3.5 | 3.5 | 140.71 | 4.29 | 30.50 | 32.8 | 1.14 | 1.8 |
|  | 65 | 3.0 | 3.0 | 700 | 21.30 | 30.43 | 8.2 | 1.14 | 0.0 |
|  | 66 | 3.0 | 3.0 | 734 | 19.80 | 26.98 | 15.6 | 1.14 | 0.0 |
|  | 67 | 3.0 | 3.0 | 795 | 16.78 | 21.11 | 32.9 | 1.14 | 0.0 |
|  | 68 | 3.0 | 3.0 | 810 | 15.72 | 19.41 | 46.4 | 1.14 | 0.0 |
| Comparative Example | 1 | Not stretched | Not stretched | 420 | 0.48 | 1.14 | 7.6 | 1.00 | 0.0 |
|  | 2 | 2.0 | 2.0 | 140 | 1.30 | 9.29 | 7.6 | 1.17 | 0.0 |
|  | 3 | 3.0 | 3.0 | — | — | — | — | — | 0.0 |
|  | 4 | 3.0 | 3.0 | 53 | 1.10 | 20.75 | 2.3 | 1.16 | 0.0 |

TABLE 2-continued

| | Stretching ratio | | Dispersion pieces of incompatible component (B) | | | | | voids |
|---|---|---|---|---|---|---|---|---|
| | Machine direction (—) | Transverse direction (—) | Average minor axis length (nm) | Average major axis length (μm) | Flatness (—) | Volume occupancy based on the volume of polyester layer (W layer) (vol %) | Ratio of in-plane major axis length to in-plane minor axis length (—) | Volume occupancy based on the volume of polyester layer (W layer) (vol %) |
| 5 | 3.0 | 3.0 | 98 | 1.02 | 10.41 | 7.6 | 1.20 | 3.7 |
| 6 | 2.5 | 2.5 | — | — | — | (51.0) | — | (0.0) |
| 7 | 2.5 | 2.5 | — | — | — | — | — | 0.0 |
| 8 | 2.5 | 2.5 | — | — | — | — | — | 0.0 |
| 9 | 3.5 | 3.5 | 2460 | 6.30 | 2.56 | 6.8 | 1.03 | 7.7 |
| 10 | Not stretched | Not stretched | 1.5 | 1600 | 1.07 | 15.6 | 1.0 | 0.0 |

TABLE 3

| | | Properties of film | | | | | | | | | | | |
|---|---|---|---|---|---|---|---|---|---|---|---|---|---|
| | | 23° C. environment | | | | 80° C. environment | | Yellowing | Partial discharge voltage | | | | | |
| | | Initial elastic modulus (GPa) | Stress at 100% elongation (MPa) | Surface free energy (mN/m) | Water vapor permeability (gm$^2$·day) | Initial elastic modulus (GPa) | Stress at 100% elongation (MPa) | factor after UV test (—) | Initial (V) | After wet heat treatment (V) | After UV test (V) | Transmittance (%) | Haze (%) | Specific gravity (g/cm$^3$) |
| Example | 1 | 3.9 | 183 | 41 | 31 | 2.1 | 113 | 25 | 513 | 513 | 504 | 82 | 53 | 1.38 |
| | 2 | 3.9 | 180 | 41 | 31 | 2.1 | 113 | 25 | 513 | 513 | 504 | 82 | 53 | 1.38 |
| | 3 | 3.8 | 178 | 39 | 30 | 2.1 | 110 | 24 | 528 | 528 | 517 | 81 | 70 | 1.36 |
| | 4 | 3.6 | 168 | 36 | 28 | 2.0 | 105 | 22 | 530 | 530 | 519 | 81 | 78 | 1.36 |
| | 5 | 3.6 | 171 | 36 | 28 | 2.0 | 107 | 22 | 531 | 531 | 520 | 81 | 79 | 1.36 |
| | 6 | 3.6 | 171 | 36 | 28 | 2.0 | 107 | 22 | 533 | 533 | 521 | 80 | 79 | 1.36 |
| | 7 | 3.6 | 173 | 36 | 28 | 2.0 | 105 | 22 | 529 | 529 | 518 | 80 | 80 | 1.36 |
| | 8 | 3.7 | 165 | 35 | 28 | 2.0 | 101 | 21 | 562 | 562 | 546 | 79 | 81 | 1.36 |
| | 9 | 3.7 | 164 | 35 | 27 | 2.0 | 100 | 20 | 572 | 572 | 555 | 78 | 82 | 1.35 |
| | 10 | 3.7 | 167 | 35 | 27 | 2.0 | 105 | 20 | 559 | 559 | 544 | 77 | 83 | 1.36 |
| | 11 | 3.6 | 163 | 35 | 26 | 1.9 | 99 | 19 | 571 | 571 | 554 | 76 | 84 | 1.36 |
| | 12 | 3.7 | 164 | 35 | 27 | 2.0 | 106 | 20 | 556 | 556 | 541 | 77 | 83 | 1.36 |
| | 13 | 3.6 | 160 | 35 | 26 | 1.9 | 99 | 19 | 566 | 566 | 550 | 76 | 84 | 1.36 |
| | 14 | 3.6 | 159 | 34 | 26 | 1.9 | 96 | 18 | 592 | 592 | 572 | 74 | 85 | 1.36 |
| | 15 | 3.5 | 155 | 34 | 25 | 1.9 | 90 | 17 | 602 | 602 | 581 | 72 | 86 | 1.32 |
| | 16 | 3.5 | 156 | 34 | 25 | 1.8 | 98 | 18 | 591 | 591 | 571 | 73 | 87 | 1.33 |
| | 17 | 3.4 | 154 | 34 | 25 | 1.9 | 98 | 18 | 589 | 589 | 570 | 74 | 87 | 1.33 |
| | 18 | 3.4 | 154 | 34 | 25 | 1.9 | 98 | 18 | 593 | 593 | 573 | 74 | 87 | 1.33 |
| | 19 | 3.4 | 154 | 34 | 25 | 1.9 | 94 | 18 | 591 | 591 | 571 | 74 | 87 | 1.33 |
| | 20 | 3.4 | 151 | 33 | 24 | 1.8 | 90 | 16 | 599 | 599 | 578 | 69 | 88 | 1.33 |
| | 21 | 3.5 | 158 | 33 | 25 | 1.8 | 96 | 18 | 585 | 585 | 566 | 72 | 87 | 1.33 |
| | 22 | 3.4 | 152 | 33 | 24 | 1.8 | 91 | 16 | 598 | 598 | 577 | 69 | 88 | 1.33 |
| | 23 | 3.3 | 153 | 33 | 24 | 1.8 | 86 | 15 | 633 | 633 | 608 | 65 | 90 | 1.26 |
| | 24 | 3.2 | 145 | 33 | 23 | 1.8 | 83 | 14 | 634 | 634 | 609 | 61 | 91 | 1.25 |
| | 25 | 3.2 | 145 | 33 | 23 | 1.8 | 85 | 15 | 629 | 629 | 604 | 63 | 92 | 1.26 |
| | 26 | 3.1 | 140 | 33 | 22 | 1.7 | 83 | 13 | 635 | 635 | 609 | 58 | 93 | 1.25 |
| | 27 | 3.2 | 146 | 33 | 23 | 1.7 | 85 | 15 | 624 | 624 | 600 | 63 | 92 | 1.26 |
| | 28 | 3.1 | 147 | 33 | 22 | 1.7 | 80 | 13 | 629 | 629 | 604 | 58 | 93 | 1.26 |
| | 29 | 2.9 | 139 | 32 | 21 | 1.6 | 75 | 12 | 662 | 662 | 633 | 55 | 94 | 1.25 |
| | 30 | 2.8 | 138 | 32 | 20 | 1.6 | 73 | 11 | 667 | 667 | 637 | 53 | 94 | 1.16 |
| | 31 | 2.8 | 138 | 32 | 20 | 1.6 | 77 | 11 | 663 | 663 | 634 | 54 | 95 | 1.17 |
| | 32 | 2.7 | 133 | 32 | 19 | 1.6 | 72 | 10 | 664 | 664 | 634 | 52 | 95 | 1.17 |
| | 33 | 2.8 | 137 | 32 | 20 | 1.6 | 77 | 11 | 654 | 654 | 626 | 54 | 95 | 1.17 |
| | 34 | 2.7 | 130 | 32 | 19 | 1.6 | 69 | 10 | 662 | 662 | 633 | 52 | 95 | 1.17 |
| | 35 | 2.7 | 138 | 33 | 20 | 1.6 | 69 | 10 | 663 | 663 | 634 | 52 | 94 | 1.17 |
| | 36 | 2.7 | 137 | 33 | 20 | 1.6 | 70 | 10 | 660 | 660 | 631 | 52 | 94 | 1.17 |
| | 37 | 2.7 | 136 | 33 | 20 | 1.6 | 69 | 10 | 659 | 659 | 630 | 52 | 94 | 1.16 |
| | 38 | 3.7 | 167 | 35 | 28 | 2.0 | 106 | 22 | 514 | 514 | 505 | 78 | 82 | 1.34 |
| | 39 | 3.6 | 159 | 34 | 28 | 2.0 | 99 | 21 | 514 | 514 | 505 | 77 | 83 | 1.35 |
| | 40 | 3.7 | 162 | 34 | 27 | 2.0 | 102 | 20 | 515 | 515 | 506 | 76 | 84 | 1.35 |
| | 41 | 3.6 | 161 | 34 | 27 | 2.0 | 107 | 20 | 515 | 515 | 506 | 75 | 85 | 1.35 |
| | 42 | 3.6 | 155 | 34 | 26 | 1.9 | 100 | 19 | 515 | 515 | 506 | 74 | 86 | 1.35 |
| | 43 | 3.6 | 163 | 34 | 27 | 2.0 | 106 | 20 | 514 | 514 | 505 | 75 | 85 | 1.35 |
| | 44 | 3.5 | 154 | 34 | 26 | 1.9 | 100 | 19 | 515 | 515 | 506 | 74 | 86 | 1.35 |
| | 45 | 3.4 | 157 | 33 | 26 | 1.9 | 97 | 18 | 517 | 517 | 507 | 62 | 90 | 1.30 |
| | 46 | 3.4 | 152 | 33 | 25 | 1.9 | 91 | 17 | 517 | 517 | 508 | 60 | 91 | 1.30 |
| | 47 | 3.4 | 151 | 33 | 25 | 1.8 | 97 | 18 | 517 | 517 | 507 | 61 | 92 | 1.31 |

TABLE 3-continued

|  |  | 23° C. environment | | | | 80° C. environment | | Yellowing | Partial discharge voltage | | | | | |
|---|---|---|---|---|---|---|---|---|---|---|---|---|---|---|
|  |  | Initial elastic modulus (GPa) | Stress at 100% elongation (MPa) | Surface free energy (mN/m) | Water vapor permeability (gm$^2$·day) | Initial elastic modulus (GPa) | Stress at 100% elongation (MPa) | factor after UV test (—) | Initial (V) | After wet heat treatment (V) | After UV test (V) | Transmittance (%) | Haze (%) | Specific gravity (g/cm$^3$) |
|  | 48 | 3.4 | 148 | 32 | 24 | 1.8 | 92 | 16 | 517 | 517 | 508 | 57 | 92 | 1.31 |
|  | 49 | 3.4 | 153 | 32 | 25 | 1.8 | 97 | 18 | 516 | 516 | 507 | 60 | 92 | 1.31 |
|  | 50 | 3.4 | 145 | 32 | 24 | 1.8 | 93 | 16 | 517 | 517 | 508 | 57 | 92 | 1.30 |
|  | 51 | 2.8 | 136 | 31 | 22 | 1.6 | 76 | 12 | 522 | 522 | 512 | 43 | 95 | 1.12 |
|  | 52 | 2.8 | 132 | 31 | 21 | 1.6 | 70 | 11 | 520 | 520 | 510 | 41 | 96 | 1.12 |
|  | 53 | 2.8 | 131 | 31 | 21 | 1.6 | 77 | 11 | 522 | 522 | 512 | 42 | 96 | 1.13 |
|  | 54 | 2.8 | 124 | 31 | 20 | 1.6 | 71 | 10 | 522 | 522 | 512 | 40 | 96 | 1.12 |
|  | 55 | 2.8 | 131 | 31 | 21 | 1.6 | 74 | 11 | 521 | 521 | 511 | 42 | 96 | 1.13 |
|  | 56 | 2.8 | 128 | 31 | 20 | 1.6 | 72 | 10 | 522 | 522 | 512 | 50 | 96 | 1.12 |
|  | 57 | 3.6 | 171 | 38 | 29 | 2.0 | 107 | 22 | 520 | 520 | 510 | 80 | 70 | 1.36 |
|  | 58 | 3.7 | 167 | 37 | 29 | 2.0 | 106 | 22 | 512 | 512 | 504 | 78 | 73 | 1.34 |
|  | 59 | 3 | 145 | 32 | 24 | 1.7 | 85 | 15 | 520 | 520 | 510 | 51 | 93 | 1.20 |
|  | 60 | 3.1 | 141 | 32 | 23 | 1.7 | 79 | 14 | 520 | 520 | 510 | 49 | 94 | 1.20 |
|  | 61 | 3.1 | 140 | 32 | 23 | 1.7 | 86 | 14 | 519 | 519 | 510 | 50 | 94 | 1.21 |
|  | 62 | 3.1 | 134 | 31 | 22 | 1.7 | 80 | 13 | 520 | 520 | 510 | 47 | 94 | 1.20 |
|  | 63 | 3.1 | 140 | 31 | 23 | 1.7 | 84 | 14 | 519 | 519 | 509 | 50 | 94 | 1.21 |
|  | 64 | 3.1 | 135 | 31 | 22 | 1.7 | 81 | 13 | 520 | 520 | 510 | 53 | 94 | 1.20 |
|  | 65 | 2.8 | 113 | 34 | 26 | 1.5 | 66 | 20 | 514 | 514 | 505 | 75 | 82 | 1.36 |
|  | 66 | 2.5 | 101 | 32 | 24 | 1.1 | 55 | 18 | 516 | 516 | 507 | 60 | 89 | 1.32 |
|  | 67 | 2.0 | 80 | 31 | 22 | 0.9 | 40 | 14 | 519 | 519 | 509 | 50 | 91 | 1.22 |
|  | 68 | 1.6 | 75 | 31 | 20 | 0.6 | 28 | 11 | 521 | 521 | 511 | 42 | 92 | 1.15 |
| Comparative Example | 1 | 1.5 | Broken before 100% elongation | 46 | 41 | 0.1 | 3.2 | 32 | 458 | 458 | 457 | 88 | 5 | 1.38 |
|  | 2 | 2.3 | Broken before 100% elongation | 46 | 36 | 1.0 | 63 | 30 | 475 | 475 | 471 | 88 | 5 | 1.39 |
|  | 3 | 4.2 | 192 | 47 | 34 | 2.3 | 120 | 29 | 478 | 478 | 474 | 88 | 4 | 1.42 |
|  | 4 | 4.2 | 193 | 47 | 34 | 2.3 | 122 | 28 | 479 | 479 | 475 | 83 | 33 | 1.39 |
|  | 5 | 4 | 215 | 44 | 40 | 2.2 | 132 | 27 | 471 | 471 | 468 | 68 | 63 | 1.34 |
|  | 6 | — | — | — | — | — | — | — | — | — | — | — | — | — |
|  | 7 | — | — | — | — | — | — | — | — | — | — | — | — | — |
|  | 8 | — | — | — | — | — | — | — | — | — | — | — | — | — |
|  | 9 | 1.7 | Broken before 100% elongation | 45 | 44 | 1.3 | Broken before 100% elongation | 31 | 468 | 468 | 465 | 25 | 97 | 1.25 |
|  | 10 | 1.5 | Broken before 100% elongation | 45 | 40 | 0.1 | 3.1 | 32 | 457 | 457 | 456 | 87 | 90 | 1.37 |
| Example | 9-2 | 3.8 | 164 | 47 | 27 | 2.0 | 100 | 25 | 518 | 518 | 492 | 77 | 81 | 1.36 |
|  | 14-2 | 3.7 | 159 | 47 | 26 | 1.9 | 96 | 23 | 520 | 520 | 494 | 73 | 84 | 1.37 |
|  | 24-2 | 3.2 | 145 | 47 | 23 | 1.8 | 83 | 19 | 526 | 526 | 498 | 60 | 90 | 1.26 |
|  | 30-2 | 2.9 | 138 | 47 | 20 | 1.6 | 73 | 16 | 530 | 530 | 500 | 52 | 93 | 1.17 |
|  | 43-2 | 3.8 | 162 | 47 | 27 | 2.0 | 102 | 25 | 510 | 510 | 487 | 75 | 83 | 1.36 |
|  | 49-2 | 3.5 | 153 | 47 | 25 | 1.8 | 97 | 28 | 510 | 510 | 487 | 59 | 91 | 1.32 |
|  | 55-2 | 2.7 | 131 | 47 | 21 | 1.6 | 74 | 16 | 511 | 511 | 488 | 41 | 95 | 1.14 |
|  | 63-2 | 3.1 | 140 | 47 | 23 | 1.7 | 84 | 19 | 511 | 511 | 488 | 49 | 93 | 1.22 |
| Comparative Example | 1-2 | 1.6 | Broken before 100% elongation | 47 | 41 | 0.1 | 3.2 | 33 | 457 | 457 | 453 | 88 | 5 | 1.39 |
|  | 2-2 | 2.4 | Broken before 100% elongation | 47 | 36 | 1.0 | 63 | 31 | 475 | 475 | 464 | 88 | 5 | 1.40 |
|  | 3-2 | 4.3 | 192 | 47 | 34 | 2.4 | 120 | 30 | 478 | 478 | 466 | 87 | 4 | 1.43 |
|  | 6-2 | — | — | — | — | — | — | — | — | — | — | — | — | — |
|  | 8-2 | — | — | — | — | — | — | — | — | — | — | — | — | — |
|  | 10-2 | 1.6 | Broken before 100% elongation | 47 | 40 | 0.1 | 3.1 | 33 | 456 | 456 | 452 | 87 | 90 | 1.37 |
| Example | 9-3 | 3.8 | 164 | 35 | 27 | 2.0 | 100 | 50 | 572 | 572 | 528 | 78 | 82 | 1.36 |
|  | 14-3 | 3.7 | 159 | 34 | 26 | 1.9 | 96 | 18 | 592 | 592 | 541 | 74 | 85 | 1.37 |

TABLE 3-continued

|  |  | 23° C. environment | | | | 80° C. environment | | Yellowing | Partial discharge voltage | | | | | |
|---|---|---|---|---|---|---|---|---|---|---|---|---|---|---|
|  |  | Initial elastic modulus (GPa) | Stress at 100% elongation (MPa) | Surface free energy (mN/m) | Water vapor permeability (gm²·day) | Initial elastic modulus (GPa) | Stress at 100% elongation (MPa) | factor after UV test (—) | Initial (V) | After wet heat treatment (V) | After UV test (V) | Transmittance (%) | Haze (%) | Specific gravity (g/cm³) |
|  | 24-3 | 3.2 | 145 | 33 | 23 | 1.8 | 83 | 14 | 634 | 634 | 569 | 61 | 91 | 1.26 |
|  | 30-3 | 2.9 | 138 | 32 | 20 | 1.6 | 73 | 11 | 667 | 667 | 590 | 53 | 94 | 1.17 |
|  | 43-3 | 3.8 | 162 | 34 | 27 | 2.0 | 102 | 50 | 514 | 514 | 491 | 76 | 84 | 1.36 |
|  | 49-3 | 3.5 | 153 | 32 | 25 | 1.8 | 97 | 13 | 516 | 516 | 492 | 60 | 92 | 1.32 |
|  | 55-3 | 2.7 | 131 | 31 | 21 | 1.6 | 74 | 11 | 521 | 521 | 495 | 42 | 96 | 1.14 |
|  | 63-3 | 3.1 | 140 | 31 | 23 | 1.7 | 84 | 14 | 519 | 519 | 494 | 50 | 94 | 1.22 |
| Comparative Example | 1-3 | 1.6 | Broken before 100% elongation | 47 | 41 | 0.1 | 3.2 | 32 | 457 | 457 | 454 | 88 | 5 | 1.39 |
|  | 2-3 | 2.4 | Broken before 100% elongation | 47 | 36 | 1.0 | 63 | 30 | 475 | 475 | 465 | 88 | 5 | 1.40 |
|  | 3-3 | 4.3 | 192 | 47 | 34 | 2.4 | 120 | 29 | 478 | 478 | 467 | 88 | 4 | 1.43 |
|  | 6-3 | — | — | — | — | — | — | — | — | — | — | — | — | — |
|  | 8-3 | — | — | — | — | — | — | — | — | — | — | — | — | — |
|  | 10-3 | 1.6 | Broken before 100% elongation | 47 | 40 | 0.1 | 3.1 | 32 | 456 | 456 | 453 | 88 | 91 | 1.37 |
| Example | 9-4 | 3.8 | 164 | 36 | 27 | 2.0 | 100 | 5 | 572 | 572 | 555 | 15 | 98 | 1.38 |
|  | 14-4 | 3.7 | 159 | 35 | 26 | 1.9 | 96 | 3 | 592 | 592 | 572 | 16 | 98 | 1.39 |
|  | 24-4 | 3.2 | 145 | 34 | 23 | 1.8 | 83 | 2 | 634 | 634 | 609 | 13 | 98 | 1.28 |
|  | 30-4 | 2.9 | 138 | 33 | 20 | 1.6 | 73 | 2 | 667 | 667 | 637 | 11 | 98 | 1.19 |
|  | 43-4 | 3.8 | 162 | 35 | 27 | 2.0 | 102 | 5 | 514 | 514 | 505 | 17 | 98 | 1.38 |
|  | 49-4 | 3.5 | 153 | 33 | 25 | 1.8 | 97 | 3 | 516 | 516 | 507 | 13 | 98 | 1.34 |
|  | 55-4 | 2.7 | 131 | 32 | 21 | 1.6 | 74 | 2 | 521 | 521 | 511 | 8 | 98 | 1.16 |
|  | 63-4 | 3.1 | 140 | 32 | 23 | 1.7 | 84 | 3 | 519 | 519 | 509 | 8 | 98 | 1.24 |
| Comparative Example | 1-4 | 1.6 | Broken before 100% elongation | 47 | 41 | 0.1 | 3.2 | 10 | 457 | 457 | 456 | 20 | 98 | 1.41 |
|  | 2-4 | 2.4 | Broken before 100% elongation | 47 | 36 | 1.0 | 63 | 10 | 475 | 475 | 471 | 20 | 98 | 1.42 |
|  | 3-4 | 4.3 | 192 | 47 | 34 | 2.4 | 120 | 9 | 478 | 478 | 474 | 20 | 98 | 1.45 |
|  | 6-4 | — | — | — | — | — | — | — | — | — | — | — | — | — |
|  | 8-4 | — | — | — | — | — | — | — | — | — | — | — | — | — |
|  | 10-4 | 1.6 | Broken before 100% elongation | 47 | 40 | 0.1 | 3.1 | 9 | 456 | 456 | 455 | 20 | 98 | 1.39 |

TABLE 4

| | | Appearance of light diffusion layer | | Constitution A | | | | | | Constitution B | | | | | |
|---|---|---|---|---|---|---|---|---|---|---|---|---|---|---|---|
| | | Coated on polyester layer (W layer) side | Coated on PET layer (P layer) side | Surface to face diffusion plate | Luminance | Luminance irregularity | Surface to face diffusion plate | Luminance | Luminance irregularity | Surface to face diffusion plate | Luminance | Luminance irregularity | Surface to face diffusion plate | Luminance | Luminance irregularity |
| Example | 9-5 | — | S | P layer side | A | B | D layer side | B | B | P layer side | C | A | D layer side | C | A |
| | 14-5 | — | S | P layer side | A | A | D layer side | B | A | P layer side | C | A | D layer side | C | A |
| | 24-5 | — | S | P layer side | B | A | D layer side | B | A | P layer side | C | A | D layer side | D | A |
| | 30-5 | — | S | P layer side | C | A | D layer side | C | A | P layer side | D | A | D layer side | D | A |
| | 43-5 | — | S | P layer side | S | S | D layer side | A | S | P layer side | B | S | D layer side | C | S |
| | 49-5 | — | S | P layer side | S | S | D layer side | A | S | P layer side | B | S | D layer side | C | S |
| | 55-5 | — | S | P layer side | A | S | D layer side | B | S | P layer side | C | S | D layer side | D | S |
| | 63-5 | — | S | P layer side | B | S | D layer side | C | S | P layer side | D | S | D layer side | D | S |
| Comparative Example | 1-5 | — | S | P layer side | C | C | D layer side | D | C | P layer side | D | C | D layer side | D | C |
| | 2-5 | — | S | P layer side | C | C | D layer side | D | C | P layer side | D | C | D layer side | D | C |
| | 3-5 | — | S | P layer side | S | C | D layer side | A | C | P layer side | S | C | D layer side | A | S |
| | 10-5 | — | S | P layer side | D | S | D layer side | D | S | P layer side | D | S | D layer side | D | S |
| Example | 9-6 | B | — | P layer side | A | B | D layer side | B | B | P layer side | C | B | D layer side | C | B |
| | 14-6 | C | — | P layer side | A | B | D layer side | B | B | P layer side | C | B | D layer side | C | B |

TABLE 4-continued

| | | Appearance of light diffusion layer | | Constitution A | | | | | | Constitution B | | | | | |
|---|---|---|---|---|---|---|---|---|---|---|---|---|---|---|---|
| | | Coated on polyester layer (W layer) side | Coated on PET layer (P layer) side | Surface to face diffusion plate | Luminance | Luminance irregularity | Surface to face diffusion plate | Luminance | Luminance irregularity | Surface to face diffusion plate | Luminance | Luminance irregularity | Surface to face diffusion plate | Luminance | Luminance irregularity |
| | 24-6 | C | — | layer side P | B | B | layer side D | C | B | layer side P | C | B | layer side D | D | B |
| | 30-6 | C | — | layer side P | C | B | layer side D | D | B | layer side P | D | B | layer side D | D | B |
| | 43-6 | C | — | layer side P | S | B | layer side D | B | A | layer side P | B | A | layer side D | C | A |
| | 49-6 | C | — | layer side P | S | A | layer side D | A | A | layer side P | B | A | layer side D | C | A |
| | 55-6 | C | — | layer side P | A | A | layer side D | B | A | layer side P | C | A | layer side D | C | A |
| | 63-6 | C | — | layer side P | B | S | layer side D | C | S | layer side P | D | S | layer side D | D | S |
| Comparative Example | 1-6 | A | — | layer side P | C | C | layer side D | D | C | layer side P | D | C | layer side D | D | C |
| | 2-6 | A | — | layer side P | C | C | layer side D | D | C | layer side P | D | C | layer side D | D | C |
| | 3-6 | — | S | layer side P | S | C | layer side D | A | C | layer side P | S | C | layer side D | A | C |
| | 10-6 | C | — | layer side P | D | S | layer side D | D | S | layer side P | D | S | layer side D | D | S |
| Example | 9-7 | B | S | layer side P | A | B | layer side D | B | B | layer side P | C | A | layer side D | C | A |
| | 14-7 | C | S | layer side P | A | A | layer side D | B | A | layer side P | C | A | layer side D | C | A |
| | 24-7 | C | S | layer side P | B | A | layer side D | B | A | layer side P | C | A | layer side D | D | A |
| | 30-7 | C | S | layer side P | C | A | layer side D | C | A | layer side P | D | A | layer side D | D | A |

TABLE 4-continued

| | Appearance of light diffusion layer | | Constitution A | | | | | | Constitution B | | | | | |
|---|---|---|---|---|---|---|---|---|---|---|---|---|---|---|
| | Coated on polyester layer (W layer) side | Coated on PET layer (P layer) side | Surface to face diffusion plate | Luminance | Luminance irregularity | Surface to face diffusion plate | Luminance | Luminance irregularity | Surface to face diffusion plate | Luminance | Luminance irregularity | Surface to face diffusion plate | Luminance | Luminance irregularity |
| 43-7 | C | S | layer side P | S | A | layer side D | A | A | layer side P | B | S | layer side D | C | S |
| 49-7 | C | S | layer side P | S | S | layer side D | A | S | layer side P | B | S | layer side D | C | S |
| 55-7 | C | S | layer side P | A | S | layer side D | B | S | layer side P | C | S | layer side D | C | S |
| 63-7 | C | S | layer side P | B | S | layer side D | C | S | layer side P | D | S | layer side D | D | S |
| Comparative Example 1-7 | A | S | layer side P | C | C | layer side D | D | C | layer side P | D | C | layer side D | D | C |
| 2-7 | A | S | layer side P | C | C | layer side D | D | C | layer side P | S | C | layer side D | D | C |
| 3-7 | — | S | layer side P | S | C | layer side D | A | C | layer side P | D | S | layer side D | A | C |
| 10-7 | C | S | layer side P | D | S | layer side D | D | S | layer side P | D | S | layer side D | D | S |

TABLE 5

|  |  | Constitution 1 | | | | Constitution 1-2 | | | |
|---|---|---|---|---|---|---|---|---|---|
|  |  |  | Partial discharge voltage | | |  | Partial discharge voltage | | |
|  |  | Adhesive strength | Initial (V) | After wet heat treatment (V) | After UV test (V) | Adhesive strength | Initial (V) | After wet heat treatment (V) | After UV test (V) |
| Example | 9-8 | B | 900 | 900 | 870 | — | — | — | — |
|  | 14-8 | C | 1000 | 1000 | 950 | — | — | — | — |
|  | 24-8 | C | 1100 | 1100 | 1030 | — | — | — | — |
|  | 30-8 | C | 1250 | 1250 | 1150 | — | — | — | — |
|  | 9-9 | S | 850 | 850 | 830 | — | — | — | — |
|  | 14-9 | S | 900 | 900 | 870 | — | — | — | — |
|  | 24-9 | S | 930 | 930 | 910 | — | — | — | — |
|  | 30-9 | S | 980 | 980 | 950 | — | — | — | — |
|  | 9-10 | S | 900 | 900 | 870 | B | 850 | 850 | 830 |
|  | 14-10 | S | 1000 | 1000 | 950 | C | 900 | 900 | 870 |
|  | 24-10 | S | 1100 | 1100 | 1030 | C | 930 | 930 | 910 |
|  | 30-10 | S | 1250 | 1250 | 1150 | C | 980 | 980 | 950 |
|  | 9-11 | S | 900 | 900 | 885 | B | 850 | 850 | 840 |
|  | 14-11 | S | 1000 | 1000 | 975 | C | 900 | 900 | 885 |
|  | 24-11 | S | 1100 | 1100 | 1070 | C | 930 | 930 | 915 |
|  | 30-11 | S | 1250 | 1250 | 1210 | C | 980 | 980 | 960 |
| Comparative Example | 1-8 | B | 800 | 800 | 800 | — | — | — | — |
|  | 2-8 | B | 800 | 800 | 800 | — | — | — | — |
|  | 3-8 | S | 800 | 800 | 800 | — | — | — | — |
|  | 1-9 | S | 800 | 800 | 800 | — | — | — | — |
|  | 2-9 | S | 800 | 800 | 800 | — | — | — | — |
|  | 3-9 | S | 800 | 800 | 800 | — | — | — | — |
|  | 1-10 | S | 800 | 800 | 800 | B | 800 | 800 | 800 |
|  | 2-10 | S | 800 | 800 | 800 | B | 800 | 800 | 800 |
|  | 3-10 | S | 800 | 800 | 800 | S | 800 | 800 | 800 |
|  | 1-11 | S | 800 | 800 | 800 | B | 800 | 800 | 800 |
|  | 2-11 | S | 800 | 800 | 800 | B | 800 | 800 | 800 |
|  | 3-11 | S | 800 | 800 | 800 | S | 800 | 800 | 800 |

|  |  | Constitution 2 | | | | Constitution 2-2 | | | |
|---|---|---|---|---|---|---|---|---|---|
|  |  |  | Partial discharge voltage | | |  | Partial discharge voltage | | |
|  |  | Adhesive strength | Initial (V) | After wet heat treatment (V) | After UV test (V) | Adhesive strength | Initial (V) | After wet heat treatment (V) | After UV test (V) |
| Example | 9-8 | B | 850 | 850 | 830 | — | — | — | — |
|  | 14-8 | C | 900 | 900 | 870 | — | — | — | — |
|  | 24-8 | C | 1000 | 1000 | 950 | — | — | — | — |
|  | 30-8 | C | 1100 | 1100 | 1030 | — | — | — | — |
|  | 9-9 | B | 850 | 850 | 830 | — | — | — | — |
|  | 14-9 | C | 900 | 900 | 870 | — | — | — | — |
|  | 24-9 | C | 930 | 930 | 910 | — | — | — | — |
|  | 30-9 | C | 980 | 980 | 950 | — | — | — | — |
|  | 9-10 | B | 850 | 850 | 830 | S | 850 | 850 | 830 |
|  | 14-10 | C | 900 | 900 | 870 | S | 900 | 900 | 870 |
|  | 24-10 | C | 1000 | 1000 | 950 | S | 930 | 930 | 910 |
|  | 30-10 | C | 1100 | 1100 | 1030 | S | 980 | 980 | 950 |
|  | 9-11 | B | 850 | 850 | 840 | S | 850 | 850 | 840 |
|  | 14-11 | C | 900 | 900 | 885 | S | 900 | 900 | 885 |
|  | 24-11 | C | 1000 | 1000 | 915 | S | 930 | 930 | 915 |
|  | 30-11 | C | 1100 | 1100 | 960 | S | 980 | 980 | 960 |
| Comparative Example | 1-8 | B | 800 | 800 | 800 | — | — | — | — |
|  | 2-8 | B | 800 | 800 | 800 | — | — | — | — |
|  | 3-8 | S | 800 | 800 | 800 | — | — | — | — |
|  | 1-9 | S | 800 | 800 | 800 | — | — | — | — |
|  | 2-9 | S | 800 | 800 | 800 | — | — | — | — |
|  | 3-9 | S | 800 | 800 | 800 | — | — | — | — |
|  | 1-10 | B | 800 | 800 | 800 | S | 800 | 800 | 800 |
|  | 2-10 | B | 800 | 800 | 800 | S | 800 | 800 | 800 |
|  | 3-10 | S | 800 | 800 | 800 | S | 800 | 800 | 800 |
|  | 1-11 | S | 800 | 800 | 800 | B | 800 | 800 | 800 |
|  | 2-11 | S | 800 | 800 | 800 | B | 800 | 800 | 800 |
|  | 3-11 | S | 800 | 800 | 800 | S | 800 | 800 | 800 |

INDUSTRIAL APPLICABILITY

The film is excellent in mechanical strength, light transmittance, gas barrier properties, moldability, releasability, ultraviolet light resistance (UV resistance) and electric insulation, and can be valuably used as a releasing film, packaging film, flexible film, moldable film, UV resistant film, insulation film, light diffusion film, solar battery backsheet film, surface light source film and the like.

The invention claimed is:

1. A polyester film comprising a biaxially stretched polyester layer (W layer) containing an aromatic polyester resin (A) and a component (B) incompatible with said polyester resin (A), wherein 1) said incompatible component (B) contains an acid-denaturated polyolefin resin (b2) and is dispersed as dispersion pieces with a flatness of 10 or higher in the polyester layer (W layer), 2) volume occupancy of said dispersion pieces in the polyester layer (W layer) is 3 vol% to less than 50 vol %, and volume occupancy of voids in the polyester layer (W layer) is less than 3 vol %, 3) the incompatible component (B) consists of a non-acid-denaturated polyolefin resin (b1) and the acid-denaturated polyolefin resin (b2), and 4) unit molecules (monomer component) constituting the non acid-denaturated polyolefin resin (b1) are identical with unit molecules (monomer component) constituting the acid-denaturated polyolefin resin (b2) and wherein an initial elastic modulus of the film at 80° C. is 2.1 GPa or less and the stress of the film at 100% elongation at 80° C. is 100 MPa or less.

2. The polyester film according to claim 1, wherein the content of the incompatible component (B) is 2 wt % to 35 wt % based on the weight of the polyester layer (W layer).

3. The polyester film according to claim 1, wherein the incompatible component (B) contains the non-acid-denaturated polyolefin resin (b1) and the acid-denaturated polyolefin resin (b2) in the polyester layer (W layer); and the acid-denaturated polyolefin resin (b2) is present in an amount of 2 parts by weight to 45 parts by weight per 100 parts by weight of the non-acid-denaturated polyolefin resin (b1).

4. The polyester film according to claim 1, wherein the incompatible component (B) has an acid value of 0.001 KOH mg/g to 20 KOH mg/g.

5. The polyester film according to claim 1, wherein the polyester layer (W layer) is biaxially oriented.

6. The polyester film according to claim 1, wherein in a section parallel to the film surface, the ratio (in-plane major axis length/in-plane minor axis length) of the in-plain major axis length of each of the aforementioned dispersion pieces to the in-plane length in the direction perpendicular to the major axis direction (in-plane minor axis length) is 2 or less.

7. The polyester film according to claim 1, wherein a biaxially oriented polyester layer is laminated at least on one side of the polyester layer (W layer).

8. The polyester film according to claim 1, wherein the polyester layer (W layer) contains inorganic particles; and the content of the inorganic particles is 5 wt % or more based on the weight of the polyester layer (W layer).

9. An optical film for a surface light source comprising the polyester film according to claim 1.

10. A surface light source comprising the polyester film as set forth in claim 1.

11. A solar battery backsheet comprising the polyester film as set forth in claim 1.

12. The solar battery backsheet according to claim 11, wherein the polyester layer (W layer) is positioned at the rearmost face of a solar battery backsheet.

13. A solar battery comprising the solar battery backsheet as set forth in claim 11.

14. A process for producing the polyester film as set forth in claim 1, comprising mixing an aromatic polyester resin (A) and a component (B) incompatible with said aromatic polyester and containing an acid-denaturated polyolefin resin (b2), forming the mixture into a sheet, and stretching the sheet by pulling-stretching.

15. The process according to claim 14, wherein the incompatible component (B) consists of a non-acid-denaturated polyolefin resin (b1) and an acid-denaturated polyolefin resin (b2).

* * * * *